(12) United States Patent
Wang et al.

(10) Patent No.: US 10,771,666 B2
(45) Date of Patent: Sep. 8, 2020

(54) IMAGE CAPTURING MODULE AND ELECTRICAL SUPPORT THEREOF

(71) Applicant: NINGBO SUNNY OPOTECH CO., LTD., Ningbo, Zhejiang Province (CN)

(72) Inventors: Mingzhu Wang, Ningbo (CN); Baozhong Zhang, Ningbo (CN); Zhen Huang, Ningbo (CN); Feifan Chen, Ningbo (CN); Nan Guo, Ningbo (CN); Zhenyu Chen, Ningbo (CN); Ye Wu, Ningbo (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 0 days.

(21) Appl. No.: 15/780,534

(22) PCT Filed: Dec. 1, 2016

(86) PCT No.: PCT/CN2016/108244
§ 371 (c)(1),
(2) Date: May 31, 2018

(87) PCT Pub. No.: WO2017/092695
PCT Pub. Date: Jun. 8, 2017

(65) Prior Publication Data
US 2019/0020798 A1    Jan. 17, 2019

(30) Foreign Application Priority Data

Dec. 1, 2015 (CN) .......................... 2015 1 0867102
Dec. 1, 2015 (CN) .......................... 2015 1 0868840

(Continued)

(51) Int. Cl.
*H04N 5/225* (2006.01)
*G03B 17/02* (2006.01)
(Continued)

(52) U.S. Cl.
CPC ............. *H04N 5/2257* (2013.01); *G02B 7/04* (2013.01); *G03B 17/02* (2013.01); *H04N 5/225* (2013.01);
(Continued)

(58) Field of Classification Search
CPC ..... H01L 2224/0555; H01L 2224/0556; H01L 2224/05599; H01L 2224/0554;
(Continued)

(56) References Cited

U.S. PATENT DOCUMENTS 6,060,756 A * 5/2000 Machida ................ G01B 7/004
257/414
2004/0189862 A1 9/2004 Gustavsson et al.
(Continued)

FOREIGN PATENT DOCUMENTS

CN    103904094 A    7/2014
CN    203722705 U    7/2014
(Continued)

*Primary Examiner* — Chiawei Chen
(74) *Attorney, Agent, or Firm* — Sughrue Mion, PLLC

(57) ABSTRACT

The present disclosure provides a camera module and an electrical bracket thereof. The electrical bracket is provided with a clear aperture. The electrical bracket not only has the functions of a conventional circuit board (conduction of the electrical signal of an electronic device such as a chip and a motor), but also has the effects of a conventional base to support an optical filter and serve as a motor base bracket.

14 Claims, 26 Drawing Sheets

(30) Foreign Application Priority Data

| Dec. 1, 2015 | (CN) | 2015 1 0868904 |
|---|---|---|
| Dec. 1, 2015 | (CN) | 2015 1 0869193 |
| Dec. 1, 2015 | (CN) | 2015 1 0869216 |

(51) Int. Cl.
  *G02B 7/04* (2006.01)
  *H05K 3/30* (2006.01)
  *H05K 3/34* (2006.01)

(52) U.S. Cl.
  CPC ........... *H04N 5/2254* (2013.01); *H05K 3/303* (2013.01); *H05K 3/341* (2013.01)

(58) Field of Classification Search
  CPC ... H01L 2224/0557; H01L 2224/05571; H01L 2224/05573; H01L 2224/16225; H01L 23/13; H01L 23/49833; H01L 24/16; H01L 27/14618; H01L 27/14621; H01L 27/14625; H01L 2924/19041; H04N 5/2251
  See application file for complete search history.

(56) References Cited

U.S. PATENT DOCUMENTS

| | | | |
|---|---|---|---|
| 2004/0194992 A1* | 10/2004 | Pai | H05K 3/3494 174/520 |
| 2005/0013097 A1 | 1/2005 | Hsin | |
| 2005/0174469 A1 | 8/2005 | Cho et al. | |
| 2007/0002546 A1* | 1/2007 | Nomura | H04N 5/2253 361/748 |
| 2008/0083964 A1 | 4/2008 | Fujimoto et al. | |
| 2010/0328525 A1 | 12/2010 | Lee et al. | |
| 2011/0233702 A1* | 9/2011 | Takahashi | H01L 21/76898 257/432 |
| 2013/0107112 A1* | 5/2013 | Oh | H04N 5/2251 348/374 |
| 2013/0128109 A1 | 5/2013 | Ichiki | |
| 2013/0140664 A1* | 6/2013 | Lo | H01L 27/14618 257/443 |
| 2014/0028905 A1 | 1/2014 | Kim | |
| 2014/0043519 A1* | 2/2014 | Azuma | G03B 3/10 348/345 |
| 2014/0264693 A1 | 9/2014 | Oganesian et al. | |
| 2015/0256725 A1* | 9/2015 | Jiang | H04N 5/2253 348/373 |
| 2015/0323758 A1* | 11/2015 | Lee | G03B 3/10 359/824 |
| 2015/0373854 A1 | 12/2015 | Ikemoto | |
| 2016/0011394 A1* | 1/2016 | Cho | G02B 7/09 359/822 |
| 2016/0172402 A1* | 6/2016 | Katkar | H01L 27/1464 257/292 |
| 2016/0173744 A1* | 6/2016 | Kim | H01L 27/14618 348/208.99 |
| 2017/0077169 A1* | 3/2017 | Masuda | G02B 5/20 |
| 2018/0188474 A1* | 7/2018 | Enta | G02B 7/08 |
| 2018/0262662 A1* | 9/2018 | Iwaguchi | H04N 5/2256 |

FOREIGN PATENT DOCUMENTS

| | | |
|---|---|---|
| CN | 104580856 A | 4/2015 |
| CN | 204697151 U | 10/2015 |
| JP | 2005-6279 A | 1/2005 |
| JP | 2007013209 A | 1/2007 |
| JP | 2007043628 A | 2/2007 |
| JP | 2009-080166 A | 4/2009 |
| JP | 2010-246007 A | 10/2010 |
| JP | 2013-232756 A | 11/2013 |
| JP | 2015159206 A | 9/2015 |
| KR | 10-0964541 B1 | 6/2010 |
| KR | 10-2010-0137839 A | 12/2010 |

* cited by examiner

A

A

B

IMAGE CAPTURING MODULE AND ELECTRICAL SUPPORT THEREOF

This application is a national stage of International Application No. PCT/CN2016/108244, filed on Dec. 1, 2016, which claims priority to Chinese Patent Application No. 201510869216.6, filed on Dec. 1, 2015, Chinese Patent Application No. 201510868904.0, filed on Dec. 1, 2015, Chinese Patent Application No. 201510867102.8, filed on Dec. 1, 2015, Chinese Patent Application No. 201510868840.4, filed on Dec. 1, 2015, and Chinese Patent Application No. 201510869193.9, filed on Dec. 1, 2015. All of the aforementioned applications are hereby incorporated by reference in their entireties.

TECHNICAL FIELD

The present disclosure relates to the field of camera module, and more specifically to a method for conducting a camera module and an electrical bracket and circuit thereof.

BACKGROUND

With the rapid development of electronic products, they are increasingly important in daily life. In order to meet the market demand in space-saving and portability, electronic devices are becoming increasingly lighter and thinner, which requires the sizes of various components of the electronic devices, especially the thickness of each component to become smaller and smaller. For example, as one of the standard equipped components of the electronic devices, camera modules have a development trend of becoming light and thin.

As the number of pixels increases, the internal chip area will increase accordingly, the driving resistors, the capacitors and others will increase accordingly, such that the package size of the module also increases. The existing mobile phone camera module package structure contradicts the demands for thin and miniaturized camera module in the mobile phone. Therefore, there is a need to develop a new and compact package process to meet the product development need.

The structure of a conventional chip on board (COB) manufactured and processed camera module is formed by assembling a rigid-flex board, a photosensitive chip, a microscope base, a motor drive, and a lens assembly. The electronic components are arranged on the surface layer of the circuit board, and the components do not overlap each other. Along with the requirement for high-pixel and ultra-thin modules, the imaging requirement for the camera module is also getting higher and higher. Thus, the assembly is more difficult and device specifications are higher. At the same time, as the pixels are getting higher, the chip area will increase accordingly, and the corresponding passive components such as the driving resistors and the capacitors also increase accordingly, that is, the size of the module also increase.

At present, portable electronic devices represented by smart phones and tablet computers are increasingly lighter and thinner, which requires the size of each component of a portable electronic device (especially the thickness of each component) to become smaller and smaller. For example, as one of the standard components of the portable electronic devices, camera modules have a development trend of becoming light and thin.

The existing mobile phone camera module package structure contradicts the demands on the thin-type and miniaturization of the camera module for the mobile phone. Therefore, it is necessary to invent a compact camera module and a new-type package process thereof to meet the needs of product development.

FIG. 1 in the accompanying drawings of the specification illustrates a camera module based on the existing technology, wherein the camera module includes a lens assembly 1, a motor 2, an optical filter 3, a base 4, at least one gold wire 5, a drive control assembly 6, a circuit board 7, a photosensitive chip 8, and at least one motor welding spot 9. The photosensitive chip 8 is attached to the top surface of the circuit board 7. The photosensitive chip 8 and the circuit board 7 are conducted by the gold wire 5 (e.g., copper wire) through wire bonding. The optical filter 3 is attached to the base 4 or the lens assembly 1. After the assembling of the camera module is completed, pins on the motor are welded to conductively connect the motor 2 to the circuit board 7, so that the circuit board 7 can energize the motor 2 and further control motion of the motor 2.

Although the camera module has been widely used in the current camera module field, it still has many drawbacks.

First, in the process of manufacturing the camera module, the camera module needs to be welded after its assembly is completed. The process is not only complex, there may also be many additional problems caused by this welding process. For example, the product qualification rate is likely to be affected by the quality of the completion of the welding. At the same time, this welded connection is not secure and can be easily damaged during use and maintenance.

Next, the circuit board 7 and the photosensitive chip 8 are conducted through the gold wire 5. The fastening of this connection cannot be easily guaranteed. In addition, the base 4 has to offer a large protection space so that the gold wire 5 can be firmly fastened. In other words, the size of the base 4 is relatively large. Accordingly, the size of the entire camera module is fairly large.

Next, using the conventional process, the external welded electrical connection between the motor and the base is more susceptible to the external environment. For example, dust may affect its connection effect and service life.

In addition, in order to have a good supporting effect, the base has to possess a large size and occupy a large space, thereby increasing the size of the entire camera module. If the size of the base is reduced for reducing the size of the camera module, the supporting effect of the base may be affected.

In addition, the circuit board of the conventional camera module is separately disposed at the bottom of the camera module, which is relatively far from the elements that require energy supply such as the motor and the photosensitive chip, which not only consumes more energy-conducting elements, such as wires, but also fails to provide an adequate and proper location design for the elements constituting the circuit in the entire circuit arrangement of the camera module as required. Thus, spaces occupied by the elements constituting the circuit is not properly reduced. That is, if the relative positions between the circuit board and other elements of the camera module are properly arranged, the spaces occupied by the necessary circuit elements of the camera module may be further reduced, thereby further reducing the size of the camera module. Certainly, the width or thickness of the camera module may also be selectively reduced according to the market demands.

The conventional mobile phone camera module package usually adopts the CSP or the COB process. The electronic components are arranged on the surface layer of the circuit board, and the components do not overlap each other. For protecting the chip area on the surface layer of the circuit board, the autofocus camera module often needs a bracket to protect the internal components and support the motor. As the pixels increase, the internal chip area will increase accordingly, the driving resistance, the capacitance and other devices will accordingly increase, such that the package size of the module will also increase.

As described above, the connection between the circuit board 7 and the photosensitive chip 8 and the connection between the motor 2 and the circuit board 7 both need to occupy certain space and are difficult to be properly protected. At the same time, the base 4 has a relatively large size and is in contact with the circuit board 7, the photosensitive chip 8 and the motor 2. However, because of the non-conductive property of the base 4, a conductible connection between the circuit board 7 and the motor 2 and between the circuit board 7 and the photosensitive chip 8 cannot be realized.

The conventional camera module chip line is conducted by mounting a gold ball or a gold wire on the chip pad to be conductively connected with the circuit board pad, which adds a gold wire connection, a gold ball mounting process station in the manufacturing process, and increases the production cost and the yield rate loss. With the high-pixel development of the camera module, the number of the pads of the photosensitive chip is also increasing, and the pad spacing is also getting smaller and smaller, increasing the production difficulty and the production cost.

In addition, there are two types of approaches for connecting substrates in the camera module to the devices in the existing technology, one is a crimped connection and the other is a plug-in connection. The plug-in connection generally adopts an approach by combining a connector plug and a connector receptacle, and the plug-in connection generally adopts an approach by thimble contacting using a pin and a gold finger on the bottom of the substrate. Regardless of which approach is adopted for the substrate of the camera module, there is a problem that the substrates can only be connected to each other in an up-down orientation. That is, a photosensitive chip is attached to the upper surface of the substrate, a device is connected to the lower surface of the substrate, however, the crimped connection and the plug-in connection cannot be performed at the same time. Therefore, the structure of the camera module in the existing technology cannot meet the requirement of connecting different devices.

Furthermore, with the increase of the pixels of the camera module in the existing technology, the area of the photosensitive chip inside the camera module will also increase accordingly. Since the components such as the driving resistors and the capacitors will also increase accordingly, the package size of the camera module is also increasing. However, in the existing technology, the device for packaging the camera module has higher and higher requirements for the size of the camera module. In the existing technology, it is increasingly required that the size of the camera module after packaging be as thin as possible, and the smaller the better. Therefore, there is a contradiction between the actual situation and the current demand.

In addition, in the conventional camera module assembly process, an integrated circuit (IC) or a chip is conducted with the PCB by wire bonding (W/B) between pads or by solder paste welding between pads, that is, a chip scale package (CSP), and both of the above two technologies have certain limitations. The wire bonding (W/B) process requires a process of binding wire of the mounted ball for each pad (Pad), which takes more man-hour, affects the production efficiency and increases the manufacturing cost. The chip size package (CSP) process requires the IC to perform a land grid array (LGA) package, which is a surface mounting process for an integrated circuit (IC), and characterized in that the pins are located on the socket instead on the IC, but relatively increase the height of the IC, and there will be a solder paste thickness of about 50 um between the pads during welding, causing the height of the overall module higher than the wire bonding (W/B) process module. The CSP process does not meet the development trend of being thin, light and sleek for a modern mobile terminal.

SUMMARY

An objective of the present disclosure is to provide a camera module and an electrical bracket thereof, where the camera module has an excellent performance, strong market competitiveness, and particularly strong market competitiveness in high-end products.

An objective of the present disclosure is to provide a camera module and an electrical bracket thereof, for which a manufacturing process is simple and a process procedure is simplified.

An objective of the present disclosure is to provide a camera module and an electrical bracket thereof, where a method for a conductible connection can meet a requirement of increasing a height of a conductively connecting device.

An objective of the present disclosure is to provide a camera module and an electrical bracket thereof, where a height requirement of a conductible connecting device may be met by ball mounting only for once.

An objective of the present disclosure is to provide a camera module and an electrical bracket thereof, which are suitable for an imposition operation and may be efficiently produced at a low cost.

An objective of the present disclosure is to provide a camera module and an electrical bracket thereof, where the camera module includes a connecting device, which can be disposed between two elements of the camera module that requires a conductible connection, and be firmly connected to the two elements.

An objective of the present disclosure is to provide a camera module and an electrical bracket thereof, where a conductible connecting device of the camera module may be efficiently processed and produced by a chip manufacturer, a circuit board manufacturer or an electrical bracket supplier, saving the production and processing steps of the camera module.

An objective of the present disclosure is to provide a camera module and an electrical bracket thereof, where the camera module includes a connecting device with a suitable height, facilitating a conductible conduction through the connecting device and a firm connection operation upon the connecting device.

An objective of the present disclosure is to provide a camera module and an electrical bracket thereof, where a height of a connecting device is increased while a conductible connection is achieved, such that cost saving, and simplification of production processes are achieved.

An objective of the present disclosure is to provide a camera module and an electrical bracket thereof, to replace the conventional conductor way of a conductible connection using a gold ball and a gold wire, which saves the cost of manufacturing materials, simplifies the processing, and improves the production yield.

An objective of the present disclosure is to provide a camera module and an electrical bracket thereof, where the electrical bracket is directly connected to other electronic devices to cancel the process of gold ball mounting, shorten the production cycle and reduce the production cost.

An objective of the present disclosure is to provide a camera module and an electrical bracket thereof, where a metal layer is directly grown on the electrical bracket, to reduce an accumulated offset and a tilt tolerance.

An objective of the present disclosure is to provide a camera module and an electrical bracket thereof, where a height of a PAD of the electrical bracket can be increased to facilitate the conduction.

An objective of the present disclosure is to provide a camera module and an electrical bracket thereof, where metal growing replaces gold ball mounting and wire bonding in the conduction process of the electrical bracket with the photosensitive chip of the camera module, so that a compact structure is realized, while the requirement for conducting with the photosensitive chip is met.

An objective of the present disclosure is to provide a camera module and an electrical bracket thereof, where metal growing replaces gold ball mounting and wire bonding in a conduction process of the electrical bracket with a motor of the camera module, so that a compact structure is realized, while the requirement for conducting with the motor is met.

An objective of the present disclosure is to provide a camera module and an electrical bracket thereof, where metal growing replaces gold ball mounting and wire bonding in a conductible connecting process of the electrical bracket with other elements of the camera module, so that a compact structure is realized, while the requirement for conducting the electrical bracket with the other elements is met.

An objective of the present disclosure is to provide a camera module and an electrical bracket thereof, where a metal layer is grown on a PAD of the electrical bracket, and the metal layer may be selected from but not limited to gold, silver, copper, tin and aluminum.

An objective of the present disclosure is to provide a camera module and an electrical bracket thereof, where a connection method for conducting the electrical bracket with other devices of the camera module may be selected from but not limited to ACP (anisotropic conductive adhesive), ultrasonic welding, thermocompression welding, reflow soldering.

An objective of the present disclosure is to provide a camera module and an electrical bracket thereof, where an electrical element for growing a metal layer on a PAD of the electrical bracket may be selected from but not limited to a chip and a motor.

An objective of the present disclosure is to provide a camera module and an electrical bracket thereof, where a method of growing a metal layer of a PAD of the electrical bracket is selected from but not limited to plating, sputtering, and the like.

An objective of the present disclosure is to provide a camera module and an electrical bracket thereof, where an Au pillar in the original flip chip process is replaced with a Cu pillar, and an ultrasonic welding process or an ACA/ACF process is used to implement an connection between a copper land on the electrical bracket and an aluminum land on the IC in the camera module.

An objective of the present disclosure is to provide a camera module and an electrical bracket thereof, where with the ultrasonic welding process or the ACA/ACF process, macroscopic air hole defects, brittle intermetallic compounds, and splashes of molten metal that are likely to occur during resistance welding, and other problems do not occur in a joint.

An objective of the present disclosure is to provide a camera module and an electrical bracket thereof, where the cost of raw materials may be reduced by more than 90% by replacing a gold material with a copper material.

An objective of the present disclosure is to provide a camera module and an electrical bracket thereof, where the problem of inaccessible welding area during manual welding may be solved by an ultrasonic welding process, and with a high frequency vibration generated by the ultrasonic wave, it is not necessary to attach an external condition and an intermediate medium to the welding assembly, which can reduce production difficulty and production costs.

An objective of the present disclosure is to provide a camera module and an electrical bracket thereof, where existing processes may be reduced, processes of the underfill may be reduced, and manufacturing costs may be reduced by the ACF/ACA technology. Meanwhile, IC does not need to be customized and ICs under a common design architecture may be satisfied.

An object of the present disclosure is to provide a camera module and an electrical bracket thereof, where the camera module does not require the base of the conventional process, and functions of the base and the circuit board in the conventional camera module can be integrated by the electrical bracket to make the structure more compact.

An objective of the present disclosure is to provide a camera module and an electrical bracket thereof, where the camera module includes an electrical bracket, and the electrical bracket may be made into an arbitrary shape. In addition to the functions possessed by the conventional circuit board (conduction of electrical signals of electronic devices such as a chip and a motor), the electrical bracket also serves as the conventional base for supporting the optical filter and serves as a motor base bracket.

An objective of the present disclosure is to provide a camera module and an electrical bracket thereof, where the electrical bracket integrates the functions of the base and the circuit board in the conventional camera module, making the structure more compact.

An objective of the present disclosure is to provide a camera module and an electrical bracket thereof, where the interior of the electrical bracket may be provided with a boss or a connection point inside the electrical bracket for electrically interconnecting the photosensitive chip. The electrical bracket and the photosensitive chip are electrically connected by mounting a metal ball on the photosensitive chip.

An objective of the present disclosure is to provide a camera module and an electrical bracket thereof, where a preset electrical element and a conductive element are disposed on the electrical bracket to form a preset circuit between electrical elements.

An objective of the present disclosure is to provide a camera module and an electrical bracket thereof, where the electrical bracket has a shape feature of thinness to meet the requirement of a thin camera module, and further enable the electronic device to be designed to be thinner.

An objective of the present disclosure is to provide a camera module and an electrical bracket thereof, where structure and shape of the electrical bracket are compatible with other elements of the camera module to reduce the size of the entire camera module.

An objective of the present disclosure is to provide a camera module and an electrical bracket thereof, where the camera module has a small-size structure and a thin thickness.

An objective of the present disclosure is to provide a camera module and an electrical bracket thereof, where the camera module is not provided with a microscope base structured element, thereby saving material costs.

An objective of the present disclosure is to provide a camera module and an electrical bracket thereof, where a passive electrical component of the camera module is embedded in the electrical bracket, which saves the module manufacturing and processing, reduces process steps, and saves assembly costs.

An objective of the present disclosure is to provide a camera module and an electrical bracket thereof, where the camera module has the advantages of small size and firm structure.

An objective of the present disclosure is to provide a camera module and an electrical bracket thereof, where a resistor and a capacitor of the camera module is embedded, so that black spots and badness of the camera module caused by the solder resist, dust and the like in the area of the resistor and the capacitor may be avoided to improve the product yield.

An objective of the present disclosure is to provide a camera module, an electrical bracket, and an assembling method and application thereof, where the electrical bracket can not only serve as a support element to support all the elements of the camera module, but also as a circuit board to electrically connect the elements in the camera module to simplify the structure of the camera module.

An objective of the present disclosure is to provide a camera module and an electrical bracket thereof, where the electrical bracket can not only be electrically connected to a photosensitive chip in an up-down orientation, but also may implement an electrical connection with the photosensitive chip, an electronic element or a device in inner and outer sides of the electrical bracket.

An objective of the present disclosure is to provide a camera module and an electrical bracket thereof, where the electrical bracket can be connected to devices in multiple directions, which is favorable for peripheral connections when too numerous pins are disposed subsequently.

An objective of the present disclosure is to provide a camera module and an electrical bracket thereof, where the photosensitive chip is disposed in an inner hollow portion of the electrical bracket, thereby reducing the thickness of the electrical bracket, and thus facilitating the reduction of the thickness of the device using the camera module.

An objective of the present disclosure is to provide a camera module and an electrical bracket thereof, where the electrical bracket leads out connection points in multiple directions, such that the electrical bracket can be electrically connected to the photosensitive chip, and connected to more devices.

An objective of the present disclosure is to provide a camera module and an electrical bracket thereof, where a pad or a welding spot may be disposed on a bottom surface of the electrical bracket to electrically interconnect the flexible circuit board. The interconnection between the electrical bracket and the flexible circuit board includes, but not limited to anisotropic conductive adhesive, welding, and the like.

An objective of the present disclosure is to provide a camera module and an electrical bracket thereof, where a connection point may be disposed on the electrical bracket, the connection point may be used for conductively interconnecting other devices, and may also be used for securing other devices.

An objective of the present disclosure is to provide a camera module and an electrical bracket thereof, where the electrical bracket can not only be electrically connected to the photosensitive chip in an up-down orientation, but also may implement an electrical connection with the photosensitive chip, an electronic element or a device in inner and outer sides of the electrical bracket.

An objective of the present disclosure is to provide a camera module and an electrical bracket thereof, where the electrical bracket can be connected to devices in 5 directions, which is favorable for peripheral connections when too numerous pins are disposed subsequently.

An objective of the present disclosure is to provide a camera module and an electrical bracket thereof, where the photosensitive chip is disposed in an inner hollow portion of the electrical bracket, thereby reducing the thickness of the electrical bracket, and further facilitating the reduction of the thickness of the device using the camera module.

An objective of the present disclosure is to provide a camera module and an electrical bracket thereof, where the electrical bracket can leads out connection points in 5 directions, such that the electrical bracket can be electrically connected to the photosensitive chip, and connected to more devices.

An objective of the present disclosure is to provide a camera module and an electrical bracket thereof, where the interior of the electrical bracket may be provided with a step or a connection point on an inner side of the electrical bracket for electrically connecting the photosensitive chip, and the connection of the electrical bracket to the photosensitive chip includes but is not limited to a gold wire, a silver wire, a copper wire or an aluminum wire.

An objective of the present disclosure is to provide a camera module and an electrical bracket thereof, where a pad or a welding spot may be disposed on a bottom surface of the electrical bracket to electrically connect the flexible circuit board. The interconnection between the electrical bracket and the flexible circuit board includes, but is not limited to anisotropic conductive adhesive, welding, and the like.

An objective of the present disclosure is to provide a camera module and an electrical bracket thereof, where an outer side of the electrical bracket may be conductively connected to other external devices, to maximize the function of the camera module.

An objective of the present disclosure is to provide a camera module and an electrical bracket thereof, to maximize the function of the camera module. Compared with the conventional COB module, the camera module has a high flatness performance, and its image quadrangular uniformity is superior to the conventional camera module.

Other advantages and features of the present disclosure will become apparent from the following description, and may be implemented by means and combinations particularly pointed out in the claims.

According to the present disclosure, the foregoing and other objectives and advantages may be implemented by a camera module, including:

an optical lens assembly;

a photosensitive chip; and at least one connecting device, where the photosensitive chip is capable of receiving lights passing through the optical lens assembly, and the connecting device is capable of connecting a circuit board or an electrical bracket to implement a conductible conduction of the photosensitive chip.

According to another aspect of the present disclosure, the present disclosure provides a method for conducting a camera module, including the following steps:

(a): disposing a conducting element on a first camera module electrical element of a camera module; and (b): connecting conductively and firmly the conducting element with a preset second camera module electrical element, where a method for the conductive and firm connection is specifically implemented as welding;

where the first camera module electrical element and the second camera module electrical element are two types respectively selected from a motor, an electrical bracket, a photosensitive chip, a circuit board and an electronic element, and the conducting element is specifically implemented as a metal body.

According to another aspect of the present disclosure, the present disclosure provides a method for conducting a camera module, including the following steps:

(A): disposing a conducting element on a first camera module electrical element of a camera module;

(B): disposing a coating on the conducting element, where the coating is specifically implemented as a metal coating, and the metal coating may be, but is not limited to a tin coating; and (C): connecting conductively and firmly the coating with a preset second camera module electrical element, where a method for the conductive and firm connection may be, but is not limited to welding;

where the first camera module electrical element and the second camera module electrical element are two types respectively selected from a motor, an electrical bracket, a photosensitive chip, a circuit board and an electronic element, and the conducting element is specifically implemented as a metal body.

According to another aspect of the present disclosure, the present disclosure provides a method for conducting a camera module, including the following steps:

(i): disposing a coating on a first camera module electrical element of a camera module, where the coating may be implemented as a metal coating, and the metal coating may be but is not limited to a tin coating; and (ii): connecting conductively and firmly the coating and a preset second camera module electrical element, where a method for a conductive and firm connection may be but is not limited to welding;

where the first camera module electrical element and the second camera module electrical element are two types respectively selected from a motor, an electrical bracket, a photosensitive chip, a circuit board and an electronic element.

The present disclosure further provides an electrical bracket for a camera module, including:

a bracket body; and at least one connecting unit, where the connecting unit is firmly disposed on the bracket body, so that the camera module has a stable structure and can be electrically conducted;

where the connecting unit includes a land and a conducting member, the land is disposed on the bracket body, and the land is conductively connected to the conducting member.

The present disclosure further provides a method for conducting a camera module, including the following steps:

S1: growing a metal layer on an electrical bracket; and

S2: connecting conductively the metal layer with some elements of the camera module.

The step S1 further includes the following steps:

S11: growing the metal layer on a photosensitive chip land of the electrical bracket;

S12: growing the metal layer on a motor land of the electrical bracket;

S13: growing the metal layer on an electronic element land of the electrical bracket; and S14: growing the metal layer on a flexible circuit board land of the electrical bracket.

The step S2 further includes the following steps:

S21: connecting conductively the metal layer with the photosensitive chip;

S22: connecting conductively the metal layer with the motor;

S23: connecting conductively the metal layer with the electronic element; and

S24: connecting conductively the metal layer with the flexible circuit board.

The present disclosure further provides a camera module, including:

an optical lens assembly;

an electrical bracket, including multiple bracket lands; and a photosensitive chip, including multiple chip lands connecting to the multiple bracket lands to implement a conduction.

The present disclosure further provides a method for assembling an electrical bracket and a photosensitive chip of a camera module, including the following steps:

(S01) aligning multiple bracket lands of an electrical bracket with multiple chip lands of a photosensitive chip respectively;

(S02) fixing the camera module to an ultrasonic working table;

(S03) applying a pressure to the camera module through a pressure head;

(S04) triggering a high frequency vibration through the ultrasonic working table; and (S05) causing the bracket lands and the chip lands to generate a high-frequency friction to aggregate.

The present disclosure further provides a method for assembling an electrical bracket and a photosensitive chip of a camera module, including the following steps:

(S001) coating or pasting a conductive medium on multiple bracket lands of an electrical bracket or coating or pasting the conductive medium on multiple chip lands of a photosensitive chip;

(S002) aligning the multiple bracket lands of the electrical bracket with the multiple chip lands of the photosensitive chip respectively;

(S003) pre-pasting the multiple bracket lands and the multiple chip lands; and (S004) thermally compressing and bonding the multiple bracket lands and the multiple chip lands.

The present disclosure further provides an electrical bracket for supporting a camera module, where the electrical bracket includes a bracket body and a circuit, the circuit is disposed on the bracket body so that the electrical bracket becomes a circuit board, the electrical bracket is electrically connected to a photosensitive chip by mounting a metal ball on the photosensitive chip of the camera module.

The present disclosure further provides a camera module, including:

an optical lens assembly;

a photosensitive chip; and an electrical bracket, the electrical bracket including a bracket body and a circuit, where the circuit is disposed on the bracket body so that the electrical bracket becomes a circuit board, the optical lens assembly is located above the photosensitive chip, and the photosensitive chip is electrically connected to an inner side of the electrical bracket by mounting a metal ball.

Through understanding to the following description and the accompanying drawings, more objectives and advantages of the present disclosure will be fully reflected.

These and other objectives, features, and advantages of the present disclosure will become apparent from the following detailed description, the accompanying drawings, and the claims.

DETAILED DESCRIPTION OF EMBODIMENTS

The following description is provided to disclose the present disclosure to enable those skilled in the art to implement the present disclosure. Preferred embodiments are provided in the following description only as examples and modifications will be apparent to those skilled in the art. The general principles of the present disclosure defined in the following description may be applied to other embodiments, alternatives, modifications, equivalents, and applications without departing from the spirit and scope of the present disclosure.

Figure 2:
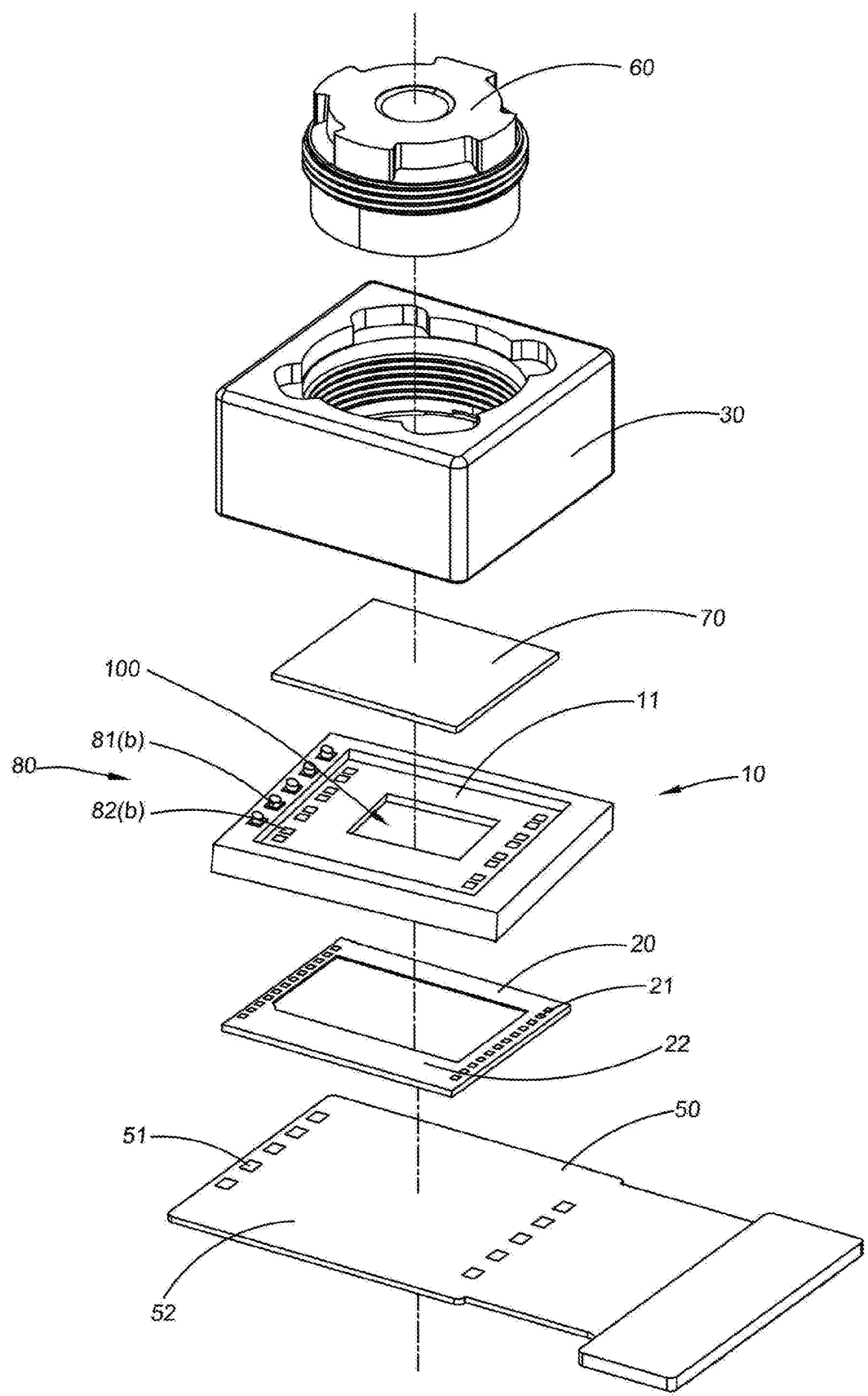
FIG. 2 is an assembly diagram of a camera module according to a first preferred embodiment of the present disclosure.
Figure 3:
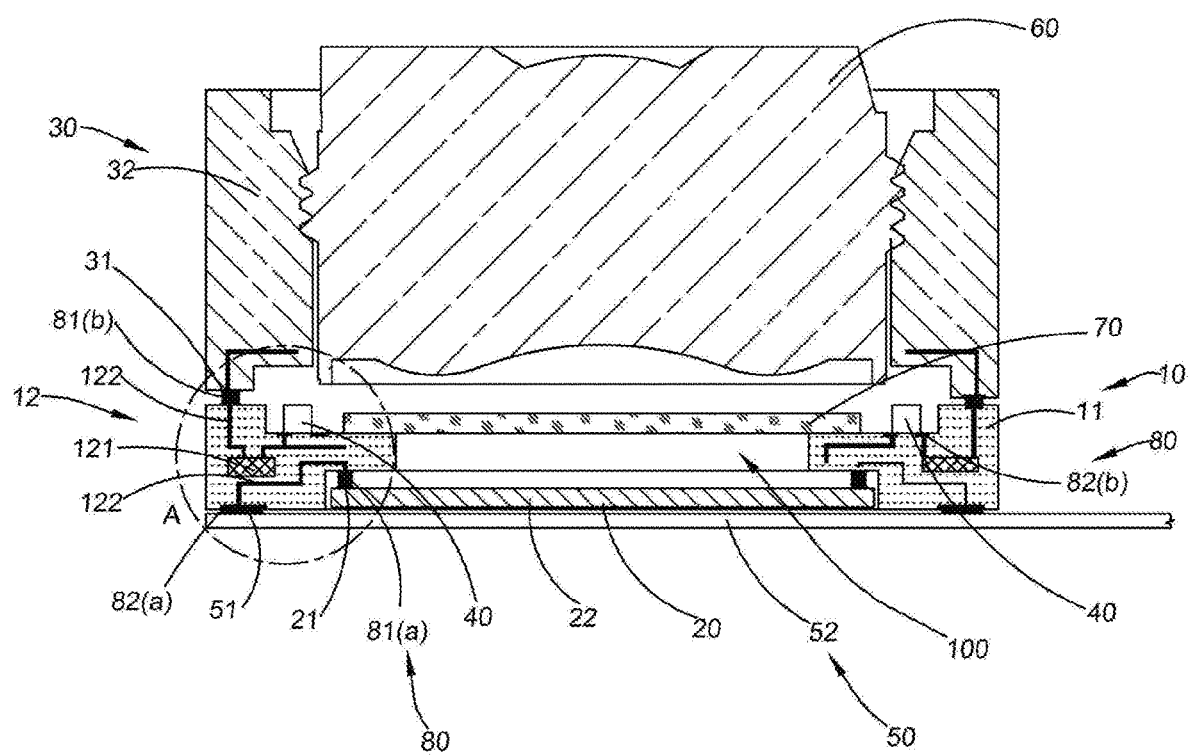
FIG. 3 is a section view of the camera module according to the above first preferred embodiment of the present disclosure.
Figure 4:
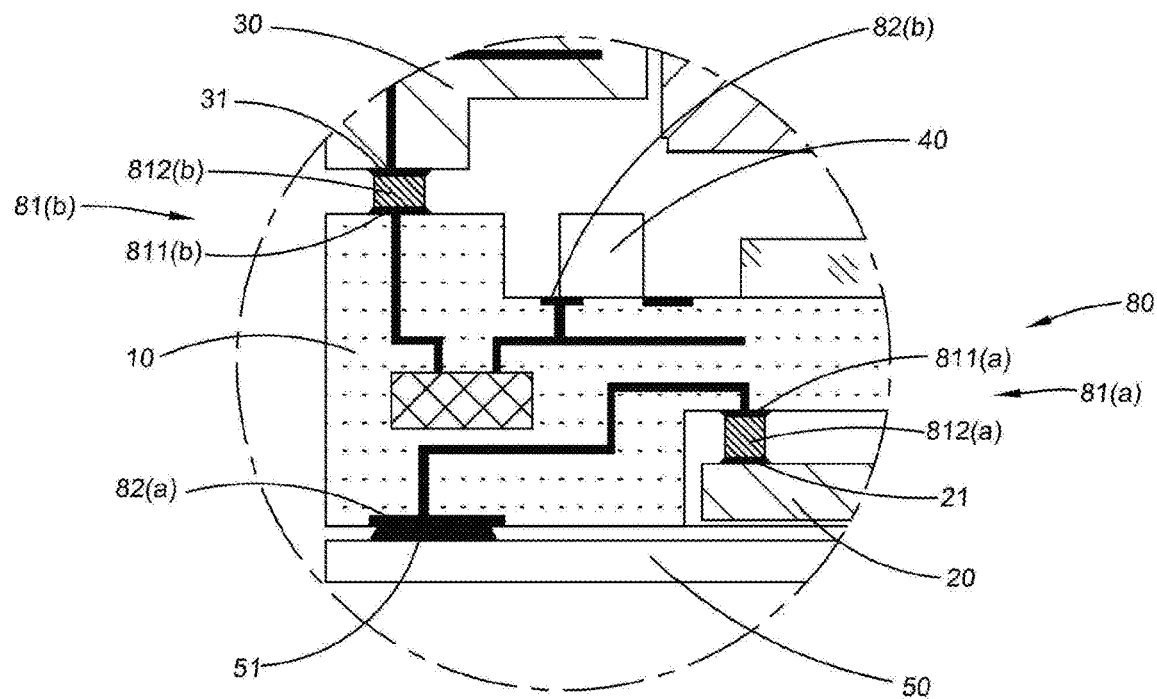
FIG. 4 is a partial enlarged view of the camera module according to the above first preferred embodiment of the present disclosure.
Figure 5:
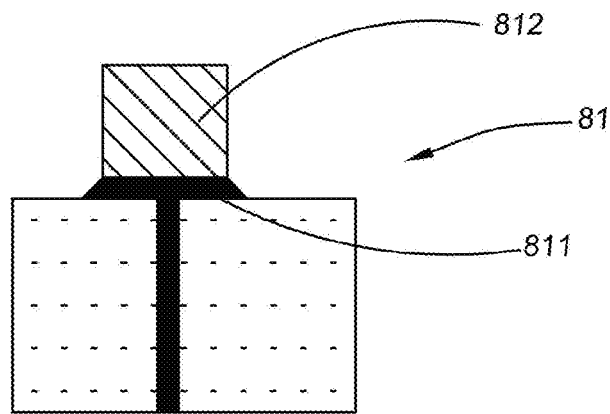
FIG. 5 illustrates a connecting device of the camera module according to the above first preferred embodiment of the present disclosure.

FIG. 2 and FIG. 3 illustrate a camera module according to a preferred embodiment of the present disclosure. The camera module includes an electrical bracket 10, a photosensitive chip 20, a motor 30, a series of electronic elements 40 (not shown in FIG. 2), a flexible circuit board 50, and an optical lens assembly 60. The electrical bracket 10 can provide support for the motor 30 of the camera module.

Specifically, the optical lens assembly 60 is mounted to the motor 30, and the optical lens assembly 60 may be driven by the motor 30 to be suitable for auto focusing. The flexible circuit board 50 and the motor 30 are disposed on different sides of the electrical bracket 10 so that the optical lens assembly 60 is located on the photosensitive path of the photosensitive chip 20. Thus, when the camera module is used for capturing an image of an object, lights reflected by an object can be received by the photosensitive chip 20 after being processed by the optical lens assembly 60, to be suitable for photoelectric conversion. That is, in the present disclosure, the electrical bracket 10 may be used to connect the flexible circuit board 50 with the motor 30. That is, the electrical bracket 10 integrates functions of a base and a circuit board of a conventional camera module, to assemble the motor lens module and connect the flexible circuit board of the photosensitive chip.

The electrical bracket 10 includes a bracket body 11 and a circuit 12 and has a clear aperture 100. The circuit 12 is embedded in the bracket body 11. As shown in FIG. 3, the camera module further includes a series of connecting devices 80 for conductively connecting the circuit 12 of the electrical bracket 10 and the photosensitive chip 20, the motor 30, the electronic element 40, and the flexible circuit board 50 of the camera module, to conduct the photosensitive chip 20, the motor 30, the electronic element 40, and the flexible circuit board 50 of the camera module to achieve their respective functions.

The circuit 12 includes multiple electrical elements 121 and a set of conductors 122, where the set of conductors 122 is conductively connected to the electrical elements 121 in a preset mode and implement conductible connections with the motor 30, the flexible circuit board 50 and the photosensitive chip 20 through the connecting devices 80. Therefore, a preset circuit is formed in the camera module to perform preset driving and adjustment.

As shown in FIG. 2 and FIG. 3, the connecting device 80 is disposed on the bracket body 11 of the electrical bracket 10 and is conductively connected to the circuit 12.

According to the preferred embodiment of the present disclosure, the camera module further includes an optical filter 70 used to filter out stray lights to further improve the image quality. The optical filter 70 and the electronic element 40 are both disposed on the bracket body 11 of the electrical bracket 10, and the electronic element 40 is conductively connected to the circuit 12. It is worth mentioning that the optical filter 70 disposed on the bracket body 11 of the electrical bracket 10 is only an example and is not a limitation of the disclosure.

The disposition position of the photosensitive chip 20 matches the position of the clear aperture 100 so that the photosensitive chip 20 can receive lights passing through the clear aperture.

As shown in the figures, the connecting device 80 may be implemented in many different ways. Specifically, in the preferred embodiment of the present disclosure, the connecting device 80 includes two sets of connecting devices 81 and multiple sets of connecting devices 82. The two sets of connecting devices 81 are respectively used to connect the photosensitive chip 20 with the motor 30. The multiple sets of connecting devices 82 are respectively used to connect the electronic element 40 with the flexible circuit board 50. It is worth mentioning that this arrangement of the present disclosure is merely an example of the present disclosure and not a limitation thereto. Those skilled in the art should understand that the connecting device 81 may alternatively be used to conductively connect the electronic element 40, the flexible circuit board 50, and the optical lens assembly 60.

The connecting device 80 according to the preferred embodiment of the present disclosure will be described in detail below. As shown in the figures, each connecting device 81 includes a connecting element 811 and a conducting element 812, where the conducting element 812 is disposed on the connecting element 811 to increase the height of the connecting device 81 and enable the connecting element 811 to be conductively connected to the photoconductive chip 20 and the motor 30.

It is worth mentioning that the connecting device 81 can not only be conductively connected to the motor 30, but also has a strong structure and can also provide a stable support for the motor 30. The connecting device 81 can not only be conductively connected to the photosensitive chip 20, but also has a strong structure and can firmly fix the photosensitive chip 20 at a preset position.

According to the preferred embodiment of the present disclosure, applications of the connecting device 81 to the conductible connection between the photosensitive chip 20 and the electrical bracket 10 and the conductible connection between the motor 30 and the electrical bracket 10 may be labeled as a photosensitive chip connecting device 81a and a motor connecting device 81b, respectively. That is, introduced from another viewpoint, it can be said that the connecting device 81 includes a set of photosensitive chip connecting devices 81a and a set of motor connecting devices 81b. It is worth mentioning that the two introduction methods of the connecting device 81 in the present disclosure are introduced from different perspectives regarding the connecting device 81, and are only disclosed in detail to better illustrate the preferred embodiment of the present disclosure and should not be construed as limiting the present disclosure.

Specifically, the photosensitive chip 20 is conductively connected to the electrical bracket 10. The photosensitive chip 20 includes a series of photosensitive chip conducting members 21 and a photosensitive chip body 22, where the photosensitive chip conducting member 21 is disposed on the photosensitive chip body 22, and the photosensitive chip conducting member 21 and the photosensitive chip connecting device 81a are conductively connected to implement an energized interconnection between the photosensitive chip 20 and the electrical bracket 10. According to the preferred embodiment of the present disclosure, each photosensitive chip connecting device 81a includes a photosensitive chip land 811*a* and a photosensitive chip conducting element 812*a*, where the photosensitive chip conducting element 812*a* is disposed on the photosensitive chip land 811*a*, in order to increase the height of the photosensitive chip connecting device 81*a* to enable the photosensitive chip land 811*a* to be conductively connected to the photosensitive chip 20.

It is worth mentioning that the photosensitive chip land 811*a* may be implemented as an ordinary PAD, which may utilize the PAD in the existing technology, reduce the production cost, and save resources.

According to the preferred embodiment of the present disclosure, the photosensitive chip conducting element 812*a* is specifically implemented as a metal body, wherein the material of the metal body implemented by the photosensitive chip conducting element 812*a* may be, but is not limited to, gold, copper, tin-nickel alloy and alloy thereof.

Specifically, according to the preferred embodiment of the present disclosure, first, the photosensitive chip conducting element 812*a* (specifically implemented as a layer of metal body in the preferred embodiment of the present disclosure) is grown on the photosensitive chip land 811*a* of the electrical bracket 10 through a preset metal process, and then the electrical bracket 10 and the photosensitive chip 20 are connected by a preset connection method, where the metal body may include but is not limited to gold, copper, tin-nickel alloy, etc., and the height of the photosensitive chip conducting element 812*a* may be set as required.

It is worth mentioning that this conductible connection method may make full use of existing ordinary PADs to reduce the cost of technological improvements, make full use of conventional processes and equipments, and avoid resource waste. Certainly, those skilled in the art should understand that the photosensitive chip land 811*a* may alternatively be implemented as other lands, which is not limited in the disclosure.

The motor 30 includes a series of motor conducting members 31 and a motor body 32, where the motor conducting members 31 are disposed on the motor body 32. The motor conducting member 31 and the motor connecting device 81*b* are conductively connected to implement an energized interconnection between the motor 30 and the electrical bracket 10. It is worth mentioning that the position of the motor conducting member 31 on the motor body 32 matches the position of the motor connecting device 81*b* on the electrical bracket 10. When the motor 30 is disposed on the electrical bracket 10, the motor 30 can be conductively connected to the circuit 12 and further be conductively connected to the flexible circuit board 50. More specifically, the motor conducting member 31 is conductively connected to the motor connecting device 81*b* on the electrical bracket 10.

According to the preferred embodiment of the present disclosure, the motor connecting device 81*b* includes a motor land 811*b* and a motor conducting element 812*b*, where the motor conducting element 812*b* is firmly disposed on the motor land 811*b* to implement the conductible conduction between the motor land 811*b* and the motor conducting member 31.

It is worth mentioning that the motor land 811*b* may be implemented as an ordinary PAD, which may utilize the PAD in the existing technology, reduce the production cost, and save resources.

According to the preferred embodiment of the present disclosure, the motor conducting element 812*b* is specifically implemented as a metal body, where the metal body implemented by the motor conducting element 812*b* may be, but is not limited to, gold, copper, tin-nickel alloy and alloys thereof.

Specifically, according to the preferred embodiment of the present disclosure, first, the motor conducting element 812*b* (specifically implemented as a layer of metal body in the preferred embodiment of the present disclosure, whose height may be set as required) is grown on the motor land 811*b* of the electrical bracket 10 through a preset metal process, and then the electrical bracket 10 and the motor 30 are connected by a preset connection method, where the metal body may include but is not limited to gold, copper, tin-nickel alloy, etc.

It is worth mentioning that this conductible connection method may make full use of existing ordinary PADs to reduce the cost of technological improvements, make full use of conventional processes and equipments, and avoid resource waste. Certainly, those skilled in the art should understand that the motor land 811*b* may alternatively be implemented as other lands. The present disclosure is not limited in this regard.

Based on the above description, according to the preferred embodiment of the present disclosure, the conducting element 812 is specifically implemented as a metal body, which may be, but is not limited to, gold, copper, tin-nickel alloy and alloys thereof.

According to the preferred embodiment of the present disclosure, the electrical bracket 10 and the electronic element 40 may be conductively connected by, but is not limited to, ACP (anisotropic conductive adhesive), ultrasonic welding, thermocompression welding, and reflow soldering.

Specifically, according to the preferred embodiment of the present disclosure, first, the conducting element 812 (specifically implemented as a layer of metal body in the preferred embodiment of the present disclosure, whose height may be set as required) is grown on the connecting element 811 of the electrical bracket 10 through a preset metal process, and then the electrical bracket 10 and the motor 30 are connected by a preset connection method, where the metal body may include but is not limited to gold, copper, tin-nickel alloy, etc. The connecting element 811 is specifically implemented as an ordinary metal land (ordinary PAD).

It is worth mentioning that this conductible connection method may make full use of existing ordinary PADs to reduce the cost of technological improvements, make full use of conventional processes and equipments, and avoid resource waste. Certainly, those skilled in the art should understand that the connecting element 811 may alternatively be implemented as other lands. The present disclosure is not limited in this regard.

The connection device 82 includes a series of circuit board connecting devices 82*a* and a series of electronic element connecting devices 82*b*. As shown in the figures, the electrical bracket 10 is conductively connected to the flexible circuit board 50 via the circuit board connecting device 82*a*. Specifically, the flexible circuit board 50 includes a series of circuit board conducting members 51 and a circuit board body 52, wherein the circuit board conducting member 51 is disposed on the circuit board body 52. The circuit board conducting member 51 and the corresponding circuit board connecting device 82*a* are conductively connected to each other, to realize the conductible connection between the electrical bracket 10 and the flexible circuit board 50.

According to the preferred embodiment of the present disclosure, the electrical bracket 10 is mounted on the flexible circuit board 50 so that the electrical bracket 10 is conductively connected to the flexible circuit board 50 while being supported stably by the flexible circuit board 50. It is worth mentioning that the position of the circuit board conducting member 51 on the circuit board body 52 matches the position of the circuit board connecting device 82a on the electrical bracket 10. When the flexible circuit board 50 is mounted on the electrical bracket 10, the flexible circuit board 50 can be conductively connected to the circuit 12. The circuit board conducting member 51 is conductively connected to the circuit board connecting device 82a on the electrical bracket 10, and the conductible connection method may be, but is not limited to, welding.

According to the preferred embodiment of the present disclosure, the circuit board connecting device 82a is specifically implemented as a circuit board metal land. The electrical bracket 10 is welded and connected to the flexible circuit board 50. It should be understood by those skilled in the art that this mounting arrangement and this welding connection method are merely examples of the present disclosure rather than limiting. The connection between the electrical bracket 10 and the flexible circuit board 50 may be implemented as but not limited to welding.

The electronic element connecting device 82b is disposed on the bracket body 11. The electronic element connecting device 82b is specifically implemented as an electronic element metal land for conductively connecting the electronic element 40. Those skilled in the art should understand that the conductible connection method of the electronic element 40 to the electrical bracket 10 may be but not limited to welding.

It is worth mentioning that, according to the preferred embodiment of the present disclosure, the circuit board connecting device 82a and the electronic element connecting device 82b connected with the flexible circuit board 50 and the electronic element 40 may alternatively be implemented as a conducting element including a metal body, similarly to the connecting device 81a and the motor connecting device 81b. The present disclosure is not limited in this regard.

It is worth mentioning that the flexible circuit board 50 and the electrical bracket 10 being separately formed merely an example of the present disclosure and not a limitation thereto. According to other embodiments of the present disclosure, the flexible circuit board 50 and the electrical bracket 10 may alternatively be formed as one body. In addition, the respective shapes or overall shape of the flexible circuit board 50 and the electrical bracket 10 may be arbitrarily set as required.

As shown in the figures, the electrical bracket 10 according to the present disclosure is made to be suitable for an imposition operation. Specifically, the metal body (the motor conducting element 812b, and the photosensitive chip conducting element 812a, etc.) of the connecting device 80 (implemented as a PAD in the preferred embodiment of the present disclosure) of the electrical bracket 10 may be grown by, but not limited to, methods such as plating and sputtering to perform the imposition operation.

It is worth mentioning that according to the above first preferred embodiment of the present disclosure, the connection method of the connecting device 81 being disposed on the electrical bracket 10 and then connecting with other elements of the camera module by welding or the like is also merely an example of the present disclosure and not a limitation thereto. According to other embodiments of the present disclosure, the connecting device 81 may alternatively be disposed on other elements of the camera module, such as the photosensitive chip 20, the motor 30, and then may be conductively connected to the electrical bracket 10 by means of welding or other connection methods.

The conductible connection of the electrical bracket 10 to the motor 30, the photosensitive chip 20, and the flexible circuit board 50 through the above connecting device may be achieved by, but is not limited to, ACP (anisotropic conductive adhesive), ultrasonic welding, thermocompression welding, and reflow soldering.

Figure 6A:
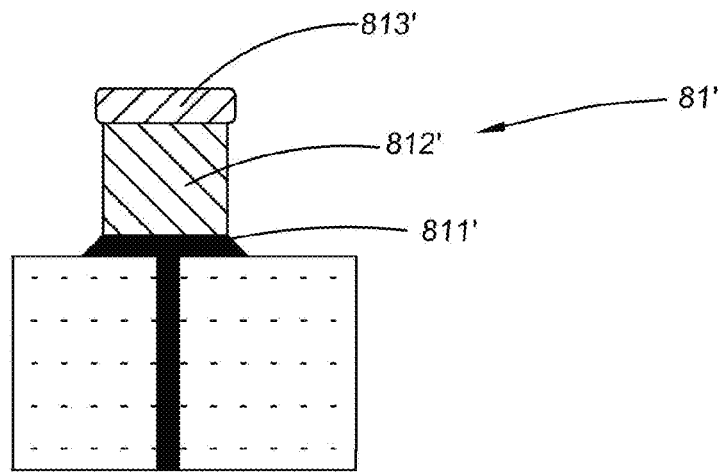
FIG. 6A illustrates an alternative embodiment of the connecting device of the camera module according to the above first preferred embodiment of the present disclosure.

FIG. 6A illustrates a first alternative embodiment of the connecting device 81 of the camera module according to the above preferred embodiment of the present disclosure. The connecting device 81' according to the first alternative embodiment includes a connecting element 811', a conducting element 812' and a coating 813', where the conducting element 812' is firmly disposed on the connecting element 811', in order to increase the height of the connecting device 81' and be conductively connected to the connecting element 811'. The coating 813' is firmly disposed on the conducting element 812' to further increase the height of the connecting device 81' to facilitate a conductible firm connection between the elements of the camera module through the connecting device 81' and facilitate the production of the camera module. According to the first alternative embodiment, the conducting element 812' is specifically implemented as a metal cylinder, where the connecting element 811' is specifically implemented as a metal land, the metal cylinder grows from the metal land, and its growth method may be, but is not limited to, a plating process. The material of the conducting element 812' may be selected from but not limited to gold, copper, tin-nickel alloy. According to this first alternative embodiment, the coating 813' is specifically implemented as a metal coating, the material of which is preferably tin, that is, the coating 813' is specifically implemented as a tin coating. The method of the coating 813' being disposed on the conducting element 812' may be selected from but not limited to a printing process and a spot coating process.

It is worth mentioning that the connecting element 811' and the conducting element 812' may be integrally formed by a plating process or the like, or may be separately manufactured. For example, the existing metal land is directly plated to grow the metal cylinder on the metal land. The present disclosure is not limited in this regard. It is worth mentioning that the connecting device 81' may be disposed on the electrical bracket 10, the photosensitive chip 20, the motor 30, the electronic element 40 or the flexible circuit board 50 of the camera module. The present disclosure is not limited in this regard. For the convenience of the process, the arrangement of the connecting device 81' is preferably disposed on the circuit board or the electrical bracket by the plating process. It is worth mentioning that the connecting element 811' of the connecting device 81' may be specifically implemented as a metal land on an electrical element such as the electrical bracket 10 and a conventional circuit board, which may make full use of the existing process, reduce the production cost, simplify the process, and at the same time make full use of the function and advantage of the connecting device 81'.

It is worth mentioning that the arrangement of the connecting device 81' according to the first alternative embodiment by growing a metal cylinder at the metal land of an electrical element such as a chip, a circuit board, an electrical bracket, and then disposing a tin coating on the grown metal cylinder is merely an example and not a limitation of the present disclosure. The conducting element 812' of the first alternative embodiment is formed by growing the metal cylinder, the height thereof may be preset as required, and the range of the height that can be achieved is large and can be highly selective. The provision of the coating 813' not only further increase the height of the connecting device 81', but also facilitates the conduction and connection with other elements. However, those skilled in the art should understand that this arrangement is merely an example and not a limitation of the present disclosure.

The conducting element 812' of the connecting device 81' according to the first alternative embodiment is specifically implemented as a metal cylinder, which is also merely an example and not a limitation of the present disclosure. According to other embodiments of the present disclosure, the conducting element 812' may alternatively be implemented as other metal bodies or other electric conductors, and the present disclosure is not limited in this regard. The conducting element 812' of the connecting device 81' specially implemented as the metal cylinder grown on the connecting element 811' by plating or other processes according to the first alternative embodiment is also merely an example and not a limitation of the present disclosure. According to other embodiments of the present disclosure, the conducting element 812' may alternatively be disposed on the connecting element 811' by other means, such as a ball mounting process.

Figure 6B:
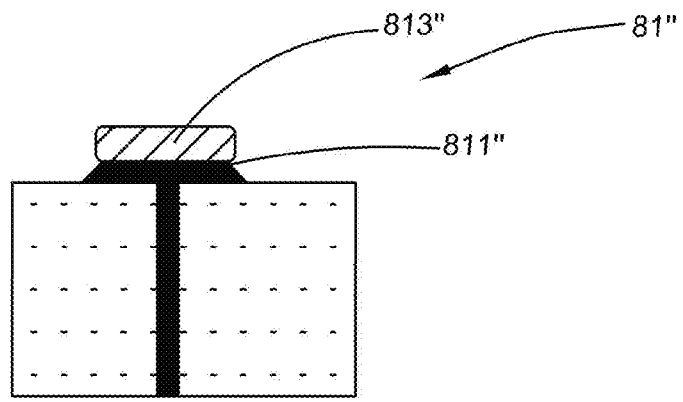
FIG. 6B illustrates another alternative embodiment of the connecting device of the camera module according to the above first preferred embodiment of the present disclosure.

FIG. 6B illustrates a second alternative embodiment of the connecting device 81 of the camera module according to the above preferred embodiment of the present disclosure. The connecting device 81" according to the second alternative embodiment includes a connecting element 811" and a coating 813", where the coating 813" is firmly disposed on the connecting element 811" in a conductible connection method, in order to increase the height of the connecting device 81" and help to realize an electrical conduction, and further facilitate an conductible firm connection between the elements of the camera module through the connecting device 81" and facilitate the production of the camera module. According to the second alternative embodiment, the connecting element 811" is specifically implemented as a metal land, where the coating 813" is specifically implemented as a metal coating, the material of which is preferably tin, that is, the coating 813" is specifically implemented as a tin coating. The method for disposing the coating 813" on the connecting element 811" may be selected from but not limited to a printing process and a spot coating process.

It is worth mentioning that the connecting device 81" may be disposed on the electrical bracket 10, the photosensitive chip 20, the motor 30, the electronic element 40 or the flexible circuit board 50 of the camera module. The present disclosure is not limited in this regard. For the convenience of the process, the connecting device 81" is preferably arranged such that the coating 813" is disposed on the circuit board or the electrical bracket. It is worth mentioning that the connecting element 811" of the connecting device 81" may be specifically implemented as a metal land on an electrical element such as the electrical bracket 10 and a conventional circuit board, which may make full use of the existing process, reduce the production cost, simplify the process, and at the same time make full use of the function and advantage of the connecting device 81".

Figure 6C:
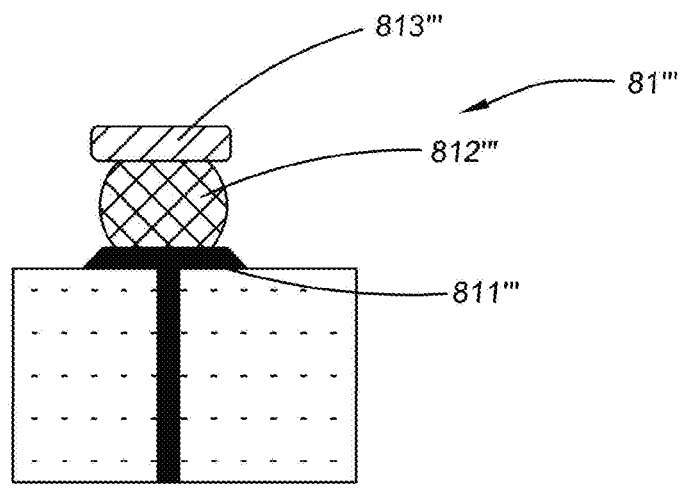
FIG. 6C illustrates another alternative embodiment of the connecting device of the camera module according to the above first preferred embodiment of the present disclosure.

FIG. 6C illustrates a third alternative embodiment of the connecting device 81 of the camera module according to the above preferred embodiment of the present disclosure. The connecting device 81''' according to the third alternative embodiment includes a connecting element 811''', a conducting element 812''' and a coating 813''', where the conducting element 812''' is firmly disposed on the connecting element 811''', in order to increase the height of the connecting device 81''' and be conductively connected to the connecting element 811'''. The coating 813''' is firmly disposed on the conducting element 812''' to further increase the height of the connecting device 81''' to facilitate a conductible firm connection between the elements of the camera module through the connecting device 81' ' and facilitate the production of the camera module. According to the third alternative embodiment, the conducting element 812''' is specifically implemented as a metal sphere, where the connecting element 811''' is specifically implemented as a metal land, the metal sphere may be but is not limited to being disposed on the metal land via a ball mounting process. The material of the conducting element 812''' may be selected from but not limited to gold, copper, tin-nickel alloy. According to this third alternative embodiment, the coating 813''' is specifically implemented as a metal coating, the material of which is preferably tin, that is, the coating 813''' is specifically implemented as a tin coating. The method for disposing the coating 813''' on the conducting element 812''' may be selected from but not limited to a printing process and a spot coating process.

It is worth mentioning that the connecting device 81''' may be disposed on the electrical bracket 10, the photosensitive chip 20, the motor 30, the electronic element 40 or the flexible circuit board 50 of the camera module. The present disclosure is not limited in this regard. For the convenience of the process, the connecting device 81''' is preferably disposed on the circuit board or the electrical bracket by the plating process. It is worth mentioning that the connecting element 811''' of the connecting device 81''' may be specifically implemented as a metal land on an electrical element such as the electrical bracket 10 and a conventional circuit board, which may make full use of the existing process, reduce the production cost, simplify the process, and at the same time make full use of the function and advantage of the connecting device 81'''.

It is worth mentioning that in the connecting device 81''' according to the third alternative embodiment, by mounting a metal sphere at the metal land of an electrical element such as a chip, a circuit board, and an electrical bracket, and then disposing a tin coating on the metal sphere mounted in the metal land, the coating 813''' specifically implemented as the tin coating not only can be used for conducting but also can increase the overall height of the connection device 81''', thereby solving the problem that the mounting of the metal sphere for once in a conventional flip chip process cannot meet the height requirement. In the conventional flip chip process, not only the method of increasing the height of the mounted ball by mounting two times is cumbersome, but also the firmness of the bonding is relatively weak and a conductible connection with other elements through a gold wire is still necessary.

According to the present disclosure, the coating 813''' specifically implemented as the tin coating not only satisfies the requirement of a conductible connection, but also can be stable between the elements conductively connected to each other by the connection device 81''', and may provide support between the conductively connected elements, so that the two elements electrically connected by the connecting device 81''' can be stably disposed in a preset position.

It is worth mentioning that the coating 813' of the connecting device 81', the coating 813" of the connecting device 81" and the coating 813''' of the connecting device 81''' according to the present disclosure are all specifically implemented as the tin coating, where the tin coating not only enables the conductible conduction between the electrical elements, but also facilitates the firm connection of the corresponding electrical elements, so that the electrical elements which are firmly conductively connected can not only realize the conduction, but also can be stably disposed in the preset position.

When a conductible firm connection is made between different elements, for example connecting by reflow soldering, a tin coating step is generally required. The present disclosure makes full use of the tin coating applied during the soldering, which not only makes it function as the firm connection, but also helps to increase the height of the connecting device 81', the connecting device 81" and the connecting device 81''', and vests the connecting device 81', the connecting device 81" and the connecting device 81''' with excellent performance.

Figure 6D:
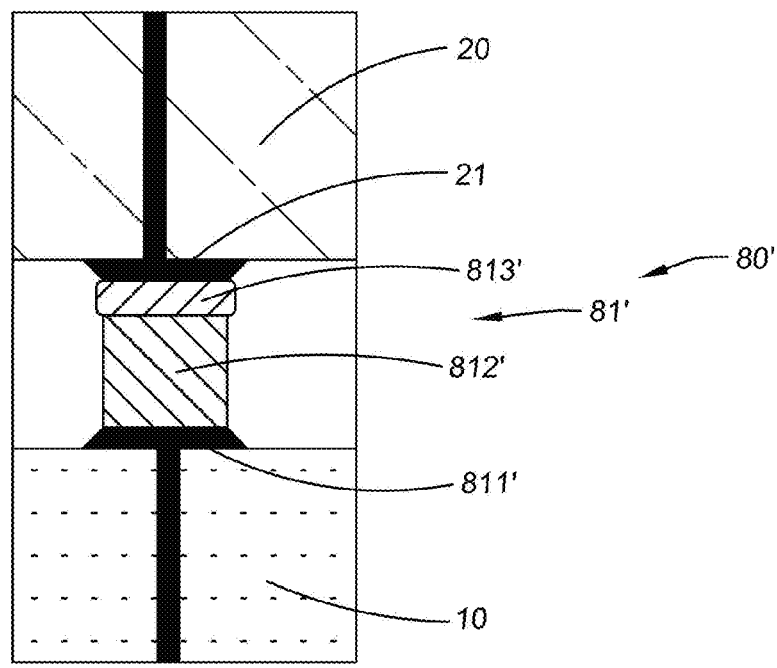
FIG. 6D illustrates another alternative embodiment of the connecting device of the camera module according to the above first preferred embodiment of the present disclosure.

FIG. 6D illustrates an application of an alternative embodiment of the connecting device 81 of the camera module according to the above preferred embodiment of the present disclosure.

The conducting element 812' of the connecting device 81' according to the first alternative embodiment is specifically implemented as a metal cylinder. The connecting element 811' is specifically implemented as a metal land. The coating 813' is specifically implemented as a tin coating. In this application example, the connecting device 81' is used for conductively connecting the electrical bracket 10 and the photosensitive chip 20. The connecting element 811' is specifically implemented as a photosensitive chip metal land disposed on the electrical bracket 10. The conducting element 812' is disposed on the photosensitive chip metal land. After the tin coating is disposed on the conducting element 812', it is firmly connected to the photosensitive chip conducting member 21 of the photosensitive chip 20 by reflow soldering.

It is worth mentioning that the above arrangement and application of the connecting device 81' are merely examples and not limitations of the present disclosure. The connecting device 81' may be arranged by disposing the connecting element 811' on the electrical bracket 10, and then connecting the tin coating implemented by the coating 813' to the photosensitive chip 20 by welding, or by disposing the connecting element 811' on the photosensitive chip 20, and then connecting the tin coating implemented by the coating 813' to the electrical bracket 10 by welding. That is, the orientation of the connecting device 81' is not limited.

Similarly, the orientation of the connecting device according to the present disclosure is not limited.

In addition, it is worth mentioning that the connecting device 81' may be used not only for connecting the electrical bracket 10 and the photosensitive chip 20 but also for connecting other elements.

FIG. 6D illustrates the structure of the connecting device 81' as an example. It should be understood by those skilled in the art that the application shown in FIG. 6D may be used for connecting devices of other structures, such as the connecting device 81" and the connecting device 81''' of the present disclosure.

Figure 1:
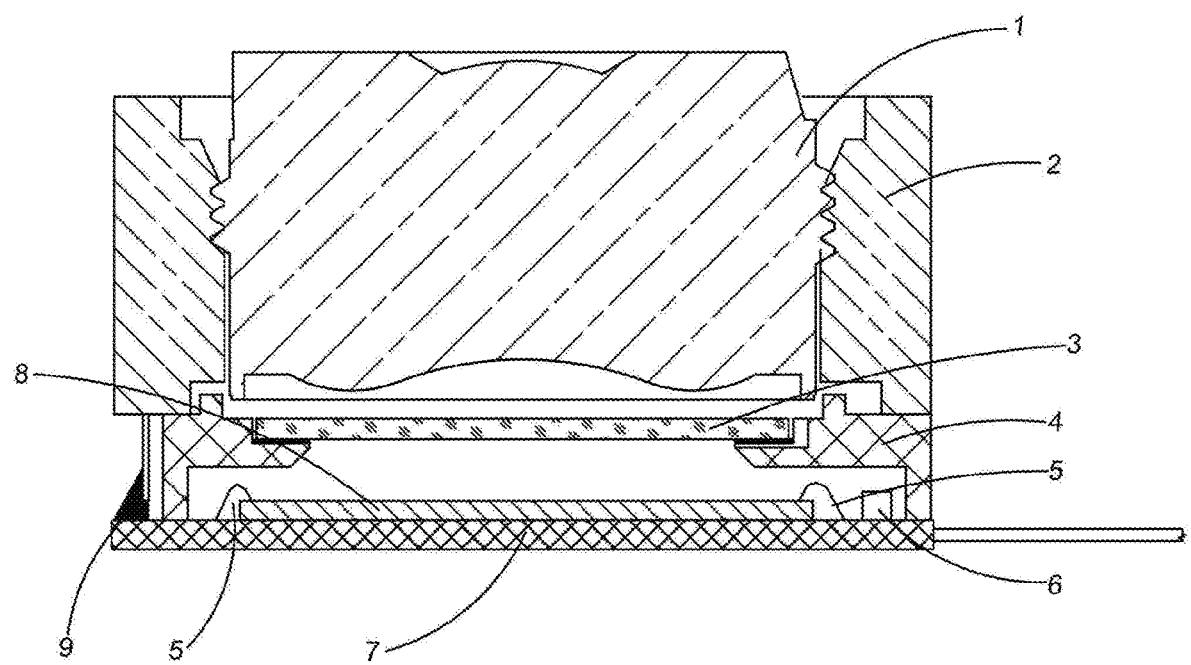
FIG. 1 is a sectional view of a camera module according to the existing technology.

It is worth mentioning that according to the first preferred embodiment of the present disclosure, the connecting device 81 used to conductively connect the photosensitive chip 20 or the motor 30 to the electrical bracket 10 is only an example of the present disclosure, not a limitation thereof. According to other embodiments of the present disclosure, the connecting device 81 can also be used to conductively connect other elements of the camera module, such as the flexible circuit board 50, to the electrical bracket 10. Those skilled in the art should understand that the connecting device 81 can be used not only for the conductible connection of the electrical bracket 10 of the camera module with other elements, but also can be used for the conductible connection between other elements of the camera module, such as the conductible connection between a existing circuit board and a photosensitive chip as shown in FIG. 1.

Figure 7:
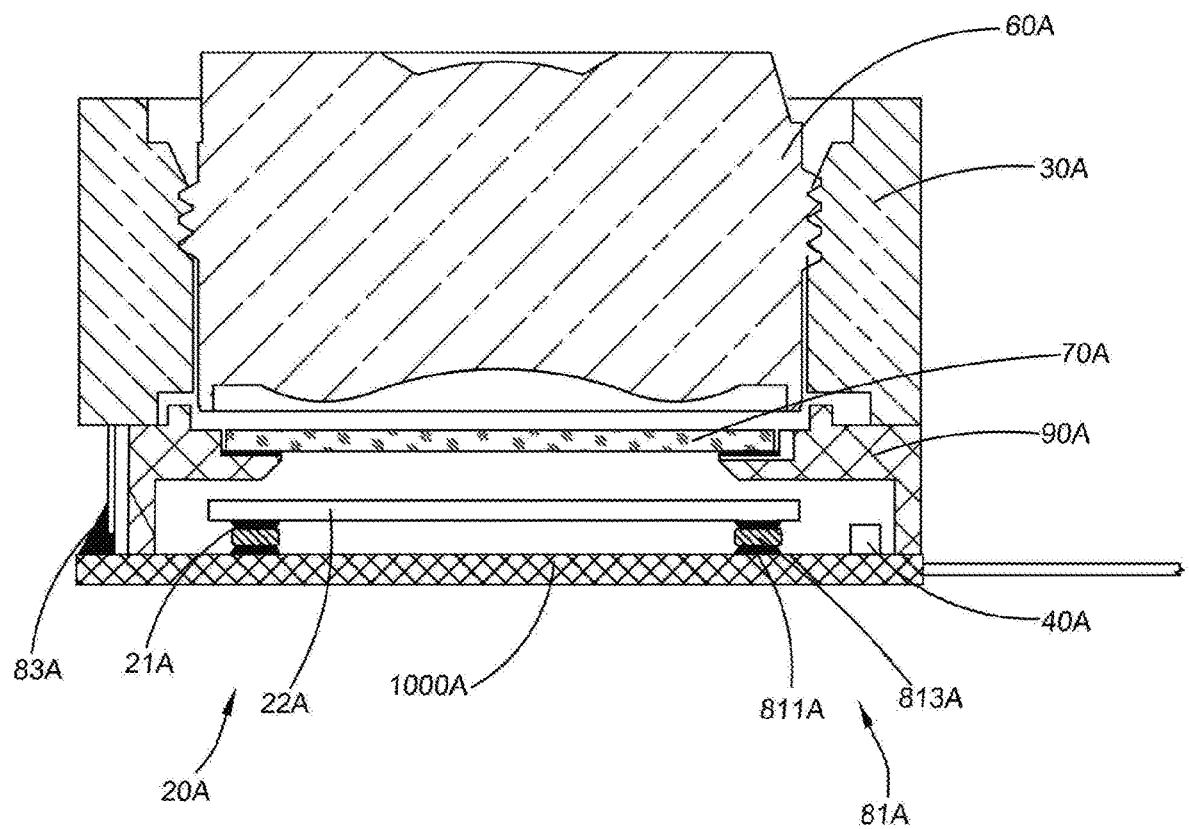
FIG. 7 illustrates a camera module according to a second preferred embodiment of the present disclosure.
Figure 8:
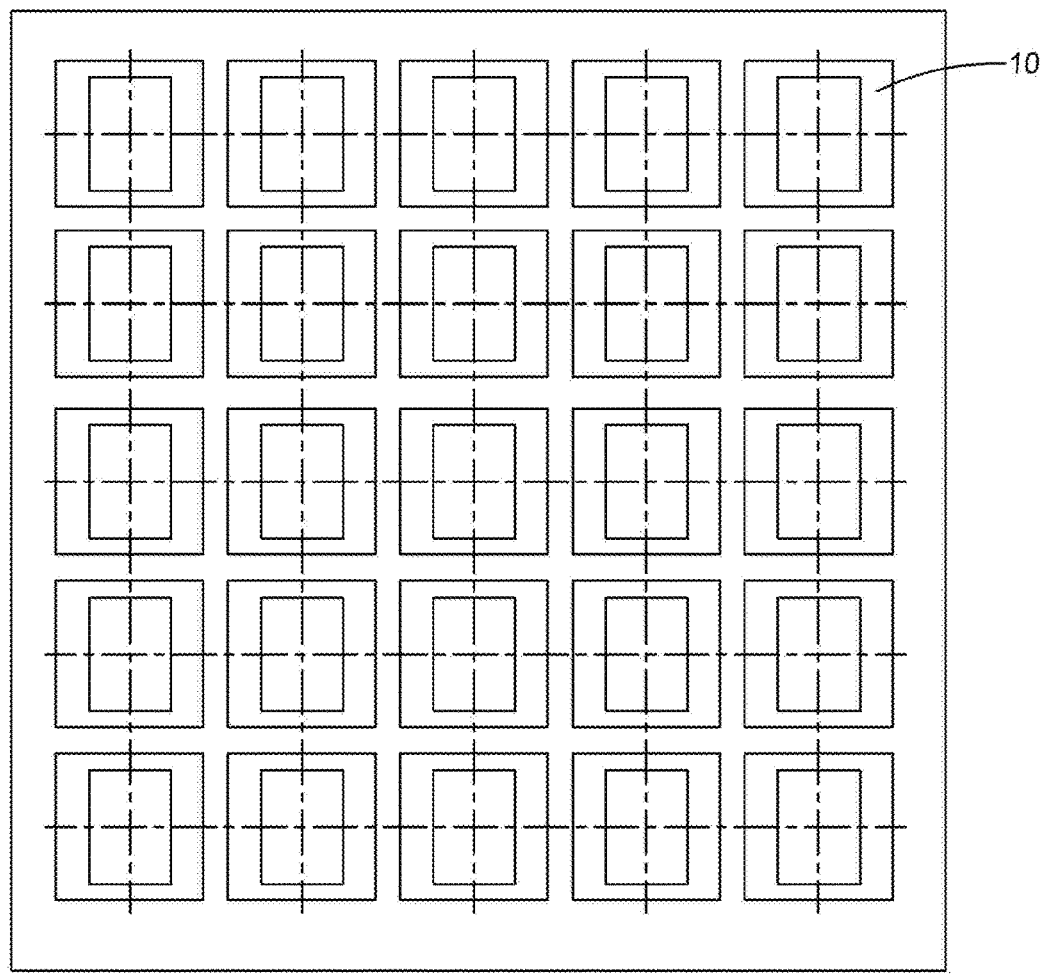
FIG. 8 illustrates that the production of the connecting device and alternative embodiments thereof of the camera module according to the above first preferred embodiment of the present disclosure is suitable for performing an imposition operation.
Figure 9A:
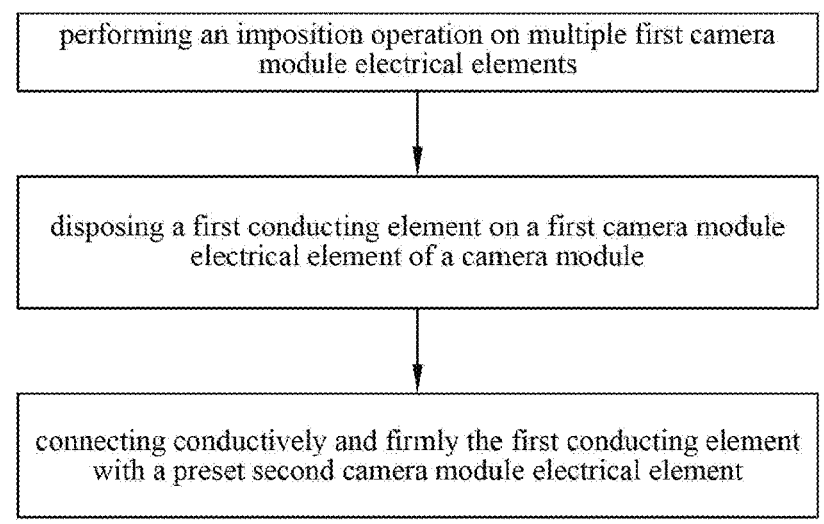
FIG. 9A to FIG. 9C illustrate a method for conducting a camera module according to the present disclosure.
Figure 9B:
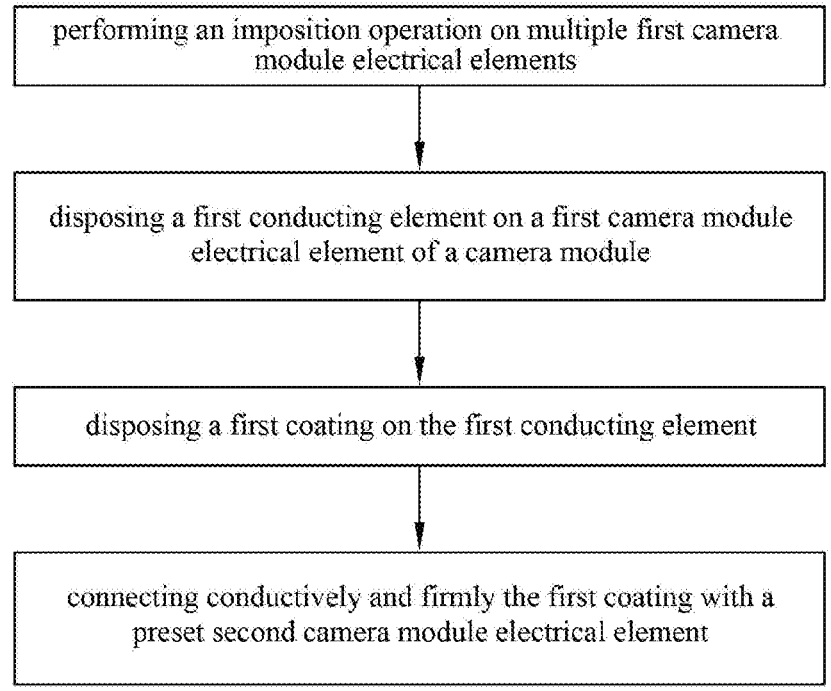
Figure 9C:
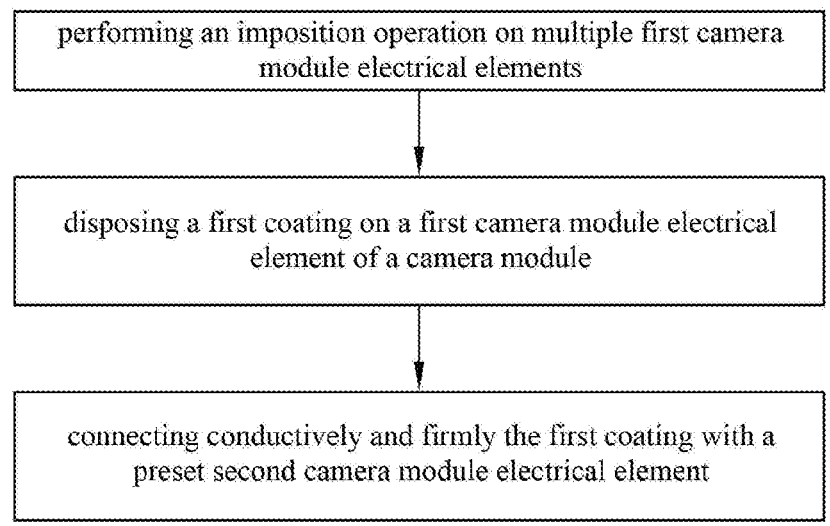

FIG. 7 illustrates a camera module according to a second preferred embodiment of the present disclosure. As shown in FIG. 7, the camera module includes a base 90A, a photosensitive chip 20A, a motor 30A, a series of electronic elements 40A, a rigid circuit board 1000A, and an optical lens assembly 60A. The base 90A can provide support for the motor 30A of the camera module.

Specifically, the optical lens assembly 60A is mounted to the motor 30A, and the optical lens assembly 60A may be driven by the motor 30A to be suitable for auto focusing. The rigid circuit board 1000A and the motor 30A are disposed on different sides of the base 90A, so that the optical lens assembly 60A is located on the photosensitive path of the photosensitive chip 20A. Thus, when the camera module is used for capturing an image of an object, lights reflected by an object can be received by the photosensitive chip 20A after being processed by the optical lens assembly 60A, to be suitable for photoelectric conversion. That is, in the present disclosure, the base 90A may be used to connect the rigid circuit board 1000A and the motor 30A. That is, the base 90A integrates functions of the base and the circuit board of the conventional camera module, to assemble the motor lens assembly module and connect the flexible circuit board of the photosensitive chip.

The base 90A includes a bracket body 91A and having a clear aperture 100A.

As shown in FIG. 7, the camera module further includes a series of connecting devices 80A for conductively connecting the rigid circuit board 1000A and the photosensitive chip 20A of the camera module, the motor 30A and the electronic element 40A, so that the photosensitive chip 20A, the motor 30A, and the electronic element 40A of the camera module are conducted so as to achieve their respective functions.

According to the preferred embodiment of the present disclosure, the camera module further includes an optical filter 70A, where the optical filter 70 is used to filter out stray lights to further improve the image quality. The optical filter 70 is disposed on the base 90A.

The disposition position of the photosensitive chip 20A matches the position of the clear aperture 100A so that the photosensitive chip 20A can receive lights passing through the clear aperture.

As shown in the figures, the connecting device 80A may be implemented in many different ways. Specifically, in the preferred embodiment of the present disclosure, the connecting device 80 includes a set of connecting devices 81A, a set of connecting devices 82A and a set of connecting devices 83A. The connecting devices 81A are used to conductively connect the photosensitive chip 20A and the rigid circuit board 1000A. The connecting devices 82A are used to conductively connect the electronic element 40A and the rigid circuit board 1000A. The connecting devices 83A are used to conductively connect the motor 30A and the rigid circuit board 1000A. It is worth mentioning that this arrangement of the present disclosure is merely an example of the present disclosure and is not limited thereto. It should be understood by those skilled in the art that the connecting device 81A may also be used to conductively connect the electronic element 40A or the motor 30A to the rigid circuit board 1000A.

The connecting device 80A according to the preferred embodiment of the present disclosure will be described in detail below. As shown in the figures, each connecting device 81A includes a connecting element 811A and a coating 813A, where the coating 813A is disposed on the connecting element 811A to increase the height of the connecting device 81A and enable the connecting element 811A to be connected conductively and firmly to the photoconductive chip 20A.

It is worth mentioning that the connecting device 81A can not only be conductively connected to the photoconductive chip 20A, but also has a strong structure and can firmly fix the photosensitive chip 20A at a preset position.

Specifically, the photosensitive chip 20A may be conductively connected to the rigid circuit board 1000A. The photosensitive chip 20A includes a series of photosensitive chip conducting members 21A and a photosensitive chip body 22A, where the photosensitive chip conducting member 21A is disposed on the photosensitive chip body 22A, and the photosensitive chip conducting member 21A and the connecting device 81A are conductively connected to implement an energized interconnection between the photosensitive chip 20A and the rigid circuit board 1000A. According to the preferred embodiment of the present disclosure, each connecting device 81A includes a connecting element 811A and a coating 813A, where the coating 813A is disposed firmly on the connecting device 81A through a conductible connection, in order to increase the height of the connecting device 81A and help to realize an electrical conduction, and further facilitate an conductible firm connection between the photosensitive chip 20A and the rigid circuit board 1000A through the connecting device 81A. The connecting element 811A is specifically implemented as a metal land, where the coating 813A is specifically implemented as a metal coating, the material of which is preferably tin, that is, the coating 813A is specifically implemented as a tin coating. The method of disposing the coating 813A on the connecting element 811A may be selected from but not limited to a printing process and a spot coating process.

It is worth mentioning that this conductible connection method may make full use of existing camera module production technology to reduce the cost of technological improvements, make full use of conventional processes and equipments, and avoid resource waste.

The motor 30A includes a series of motor conducting members 31A and a motor body 32A, where the motor conducting members 31A are disposed on the motor body 32A. The motor conducting member 31A is conductively connected to the rigid circuit board 1000A through the third connecting device 83A, to realize an energized interconnection between the motor 30A and the rigid circuit board 1000A.

According to the preferred embodiment of the present disclosure, the electronic element 40A is conductively connected to the rigid circuit board 1000A through the connecting device 82A, to realize an energized interconnection between the electronic element 40A and the rigid circuit board 1000A.

It is worth mentioning that according to the preferred embodiment of the present disclosure, the method in which the motor 30A is conductively connected to the rigid circuit board 1000A may alternatively be implemented similarly to the connecting device 81A. The present disclosure is not limited in this regard.

It is worth mentioning that the rigid circuit board 1000A and the base 90A being formed separately is merely an example of the present disclosure and is not limited thereto.

According to other embodiments of the present disclosure, the rigid circuit board 1000A and the base 90A may alternatively be formed as one body. In addition, the respective shapes or overall shape of the rigid circuit board 1000A and the base 90A may be arbitrarily set as required.

It is worth mentioning that the manufacture of the rigid circuit board 1000A according to the present disclosure is suitable for an imposition operation. The rigid circuit board 1000A having the above connecting device may also be formed by cutting after an overall operation. The conductible conduction method of the rigid circuit board 1000A with the motor 30A, the photosensitive chip 20A, and the flexible circuit board 50A through the connecting device may be, but is not limited to, ACP (anisotropic conductive adhesive), ultrasonic welding, thermocompression welding and reflow soldering. It is worth mentioning that the connecting device 81, the connecting device 81', and the connecting device 81''' according to the first preferred embodiment of the present disclosure and its alternative embodiments may all be used in the conductible connection of the rigid circuit board 1000A to the photosensitive chip 20A in the second preferred embodiment of the disclosure. The present disclosure is not limited in this regard.

The present disclosure provides a method for conducting a camera module, for conductively connecting various elements of the camera module. The method includes the following steps:

disposing a conducting element on a first camera module electrical element of the camera module, where the first camera module electrical element is selected from but not limited to a motor, an electrical bracket, a photosensitive chip, a circuit board, and an electronic element, and the conducting element may be implemented as a metal body; and connecting conductively and firmly the conducting element with a preset second camera module electrical element, where a method for a conductive and firm connection may be but is not limited to welding.

As described above, the manufacture of the electrical bracket 10 is suitable for an imposition operation. The conducting method may further include the following step before the step of disposing the conducting element:

performing an imposition operation on multiple first camera module electrical elements.

According to the present disclosure, a coating may also be disposed on the metal body. Alternatively, the present disclosure may not require the step of connecting conductively and firmly the conducting element with the preset second camera module electrical element, and accordingly the method may include the following steps:

disposing a coating on the conducting element, where the coating is specifically implemented as a metal coating, and the metal coating may be, but is not limited to, a tin coating; and connecting conductively and firmly the coating with a preset second camera module electrical element, where a method for the conductive and firm connection may be, but is not limited to welding.

The metal body may be a metal cylinder or a metal sphere, and its shape is not limited therewith. The method for disposing the metal body to the preset first camera module electrical element is selected from but not limited to plating and metal mounting.

It is worth mentioning that the first camera module electrical element and the second camera module electrical element may be motors, electrical brackets, photosensitive chips, circuit boards, and electronic elements of the camera module. The respective naming is just for the purpose of illustrating the present disclosure more conveniently and more clearly, to illustrate two conductively connectable elements of the camera module. The present disclosure is not limited in this regard.

According to the present disclosure, the step of disposing the conducting element may be specifically implemented as: disposing a metal body on a metal land of the first camera module electrical element of the camera module, where the first camera module electrical element is selected from but not limited to the motor, the electrical bracket, the photosensitive chip, the circuit board, and the electronic element.

It is worth mentioning that the metal coating, such as the metal land, may also be directly coated on the connecting element without the conducting element such as the metal body, so that the method for conducting the camera module includes the following step:

disposing a coating on a first camera module electrical element of a camera module, where the first camera module electrical element is selected from but not limited to a motor, an electrical bracket, a photosensitive chip, a circuit board, and an electronic element, the coating may be implemented as a metal coating, and the metal coating may be, but is not limited to, a tin coating.

It is worth mentioning that after the first camera module electrical element and the second camera module electrical element are aligned, a lamination thereof is connected through the reflow soldering process to implement a circuit conduction.

According to the present disclosure, the step may be specifically implemented as: disposing a metal coating on a metal land of the first camera module electrical element of the camera module, where the first camera module electrical element is selected from but not limited to the motor, the electrical bracket, the photosensitive chip, the circuit board, and the electronic element.

Figure 10A:
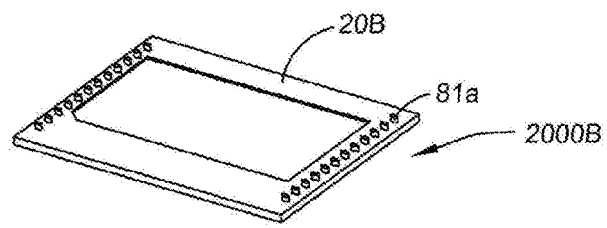
FIG. 10A and FIG. 10B illustrate a photosensitive chip assembly according to a third preferred embodiment of the present disclosure.
Figure 10B:
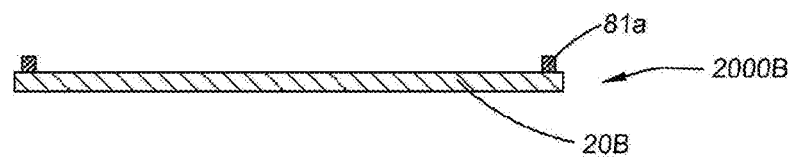

FIG. 10A and FIG. 10B illustrate a photosensitive chip assembly 2000B according to a third preferred embodiment of the present disclosure. The photosensitive chip assembly 2000B includes a photosensitive chip 20B and a set of photosensitive chip connecting devices 81a. The photosensitive chip connecting device 81a is formed on the photosensitive chip 20B by growing a metal, and is connected conductively and firmly to the photosensitive chip 20B. When the photosensitive chip assembly 2000B is used to form a camera module, the photosensitive chip connecting device 81a is used to conductively connect the photosensitive chip 20B to a preset element of the camera module, so that the photosensitive chip 20B achieves a function in the camera module.

The photosensitive chip connecting device 81a has a certain thickness so as to facilitate the conductible connection of the photosensitive chip 20B to the preset element of the camera module, and facilitate the assembly of the camera module. It is worth mentioning that the photosensitive chip connecting device 81a is formed by growing a metal, and its thickness may be set as required.

The photosensitive chip connecting device 81a is specifically implemented as a metal body. The material of the metal body implemented by the photosensitive chip connecting device 81a may be but is not limited to, gold, copper, alloy thereof, and tin-nickel alloy. It may be a metal or a variety of metals.

According to the third preferred embodiment of the present disclosure, the technical solution for forming the photosensitive chip connecting device 81a is to plate the metal by a semiconductor process, and copper is grown. In other words, the photosensitive chip connecting device 81a is formed in the photosensitive chip 20B through growing a micro copper pillar.

It is worth mentioning that according to the third preferred embodiment of the present disclosure, the photosensitive chip connecting device 81a and the internal circuit of the photosensitive chip 20B may be conductively connected so that the photosensitive chip 20B may achieve a preset function when assembled to the camera module.

Figure 11A:
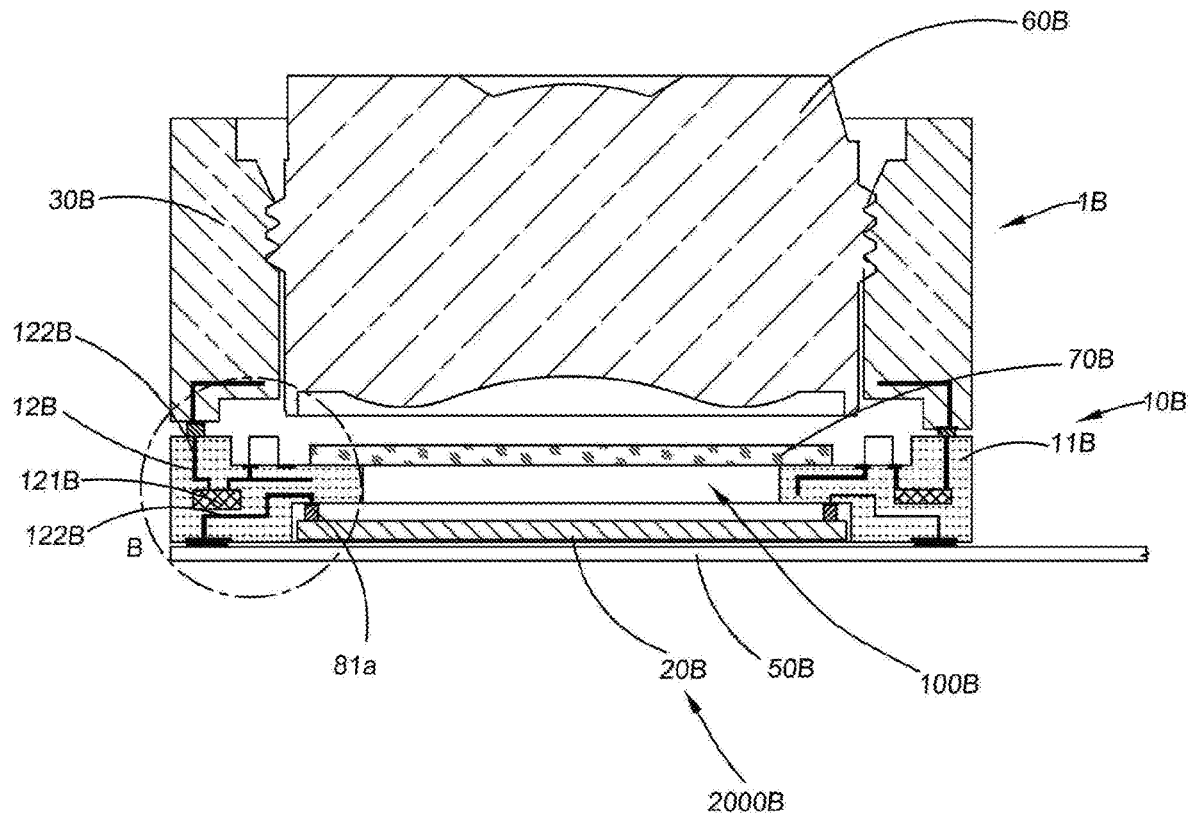
FIG. 11A and FIG. 11B illustrate an application of the photosensitive chip assembly according to the above third preferred embodiment of the present disclosure in a camera module.
Figure 11B:
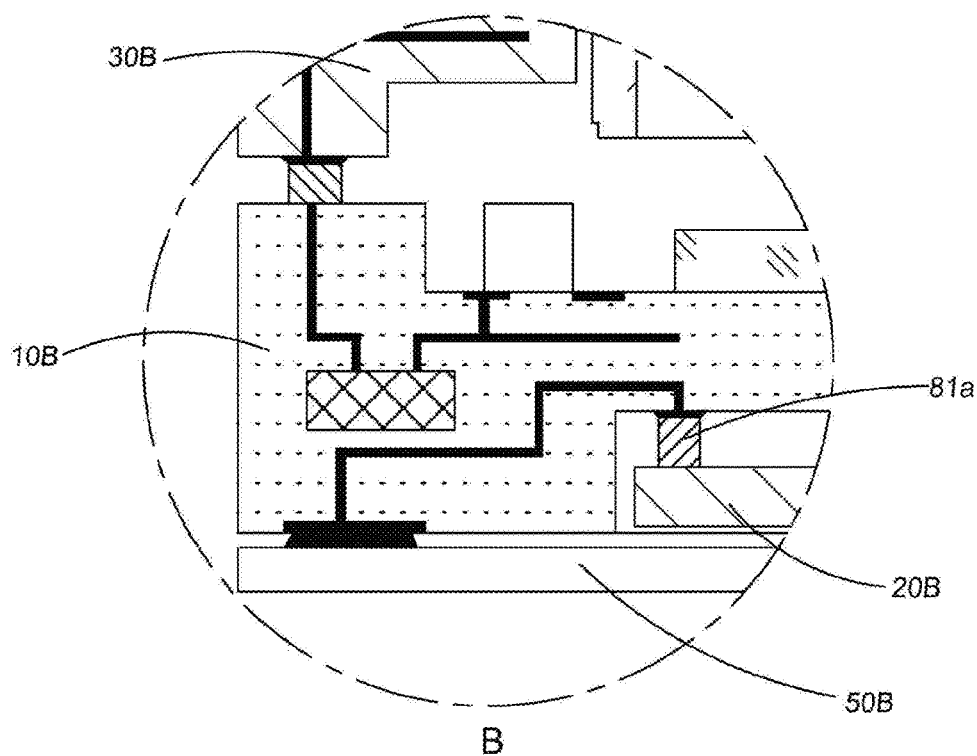

FIG. 11A illustrates an application of the photosensitive chip assembly 2000B according to the third preferred embodiment of the present disclosure in a camera module 1B. As shown in FIG. 11A, the camera module 1B includes an electrical bracket 10B, the photosensitive chip assembly 2000B, a motor 30B, a flexible circuit board 50B, and an optical lens assembly 60B, where the electrical bracket 10B can provide support for the motor 30B of the camera module 1B. It may be understood that, the camera module may alternatively be a fixed-focus camera module without the motor 30B.

Specifically, in this preferred embodiment, the optical lens assembly 60B is mounted to the motor 30B, and the optical lens assembly 60B may be driven by the motor 30B to be suitable for auto focusing. The flexible circuit board 50B and the motor 30B are disposed on different sides of the electrical bracket 10B so that the optical lens assembly 60B is located on the photosensitive path of the photosensitive chip 20B. Thus, when the camera module 1B is used for capturing an image of an object, lights reflected by the object can be received by the photosensitive chip 20B of the photosensitive chip assembly 2000B after being processed by the optical lens assembly 60B, to be suitable for photoelectric conversion. That is, in the present disclosure, the electrical bracket 10B may be used to connect the flexible circuit board 50B and the motor 30B. That is, the electrical bracket 10B integrates functions of the base and the circuit board of a conventional camera module 1B, to assemble the motor lens assembly module and connect the flexible circuit board of the photosensitive chip.

The electrical bracket 10B includes a bracket body 11B and a circuit 12B. The circuit 12B is embedded in the bracket body 11B. As shown in FIG. 11A, the camera module 1B further includes a series of connecting devices 80B for conductively connecting the circuit 12B of the electrical bracket 10B and the photosensitive chip 20B, the motor 30B, and the flexible circuit board 50B of the camera module 1B, to conduct the photosensitive chip 20B, the motor 30B, and the flexible circuit board 50B of the camera module 1B to achieve their respective functions.

The circuit 12B includes multiple electrical elements 121B and a set of conductors 122B, where the set of conductors 122B are conductively connected to the electrical elements 121B in a preset mode and implement conductible connections with the motor 30B, the flexible circuit board 50B and the photosensitive chip 20B through the connecting devices 80B. Therefore, the camera module 1B forms a preset circuit to perform preset driving and adjustment.

As shown in the figure, the connecting device 80B and the circuit 12B of the electrical bracket 10B are conductively connected.

According to the preferred embodiment of the present disclosure, the camera module 1B further includes an optical filter 70B, where the optical filter 70B is used to filter out stray lights to further improve the image quality. The optical filter 70B is disposed on the bracket body 11B of the electrical bracket 10B. It is worth mentioning that the optical filter 70B disposed on the bracket body 11B of the electrical bracket 10B is merely an example and not a limitation of the disclosure.

As shown in the figure, the electrical bracket 10B has a clear aperture 100B. The disposition position of the photosensitive chip 20B matches the position of the clear aperture 100B so that the photosensitive chip 20B can receive lights passing through the clear aperture 100B.

Specifically, according to the third preferred embodiment of the present disclosure, first, the photosensitive chip connecting element 81a (specifically implemented as a copper pillar in the preferred embodiment of the present disclosure) is grown on the photosensitive chip 20B through a preset metal process, and then the electrical bracket 10B and the photosensitive chip 20B are conductively connected by a preset connection method, where the metal body may include but is not limited to gold, copper, tin-nickel alloy, etc., and the height of the photosensitive chip connecting element 81a may be set as required.

According to the third preferred embodiment of the present disclosure, the production of the photosensitive chip assembly 2000B is suitable for the imposition operation. That is, the process of forming the photosensitive chip connecting device 81a on the photosensitive chip 20B may be an imposition operation. The imposition operation is very beneficial to the scaled and mechanized production of the photosensitive chip assembly 2000B, and increases the production efficiency and the production accuracy. An example of the method for producing the photosensitive chip assembly 2000B by the imposition operation will be described below.

The method for producing the photosensitive chip assembly 2000B by the imposition operation includes the following steps:

forming a photosensitive chip board, that is, forming a photosensitive chip wafer, where each photosensitive chip board can form multiple photosensitive chips 20B;

forming a series of photosensitive chip connecting devices 81a on the photosensitive chipboard so that the photosensitive chip connecting device 81a is conductively connected to the photosensitive chip board; and cutting the photosensitive chip board to form a multiple photosensitive chip assemblies 2000B.

It is worth mentioning that according to the preferred embodiment of the present disclosure, the method for producing the photosensitive chip assembly 2000B has the advantage of high production efficiency. In addition, the method of cutting after forming the photosensitive chip connecting device 81a has the advantages of convenient operation and accurate positioning, which does not require the imposition operation, and occupies little space in the production process.

In a specific example, the photosensitive chip connecting device 81a is formed by forming a copper pillar on the photosensitive chip board through a semiconductor metal plating process, that is, copper is plated on a preset position of the photosensitive chip board through the semiconductor plating process until the copper pillar formed by the semiconductor plating process reaches a predetermined thickness. Certainly, it may also be formed in other ways such as mounting a copper ball.

The photosensitive chip board is cut at the positions corresponding to forming photosensitive chips to form multiple photosensitive chips 20B each having the photosensitive chip connecting device 82a.

Figure 12:
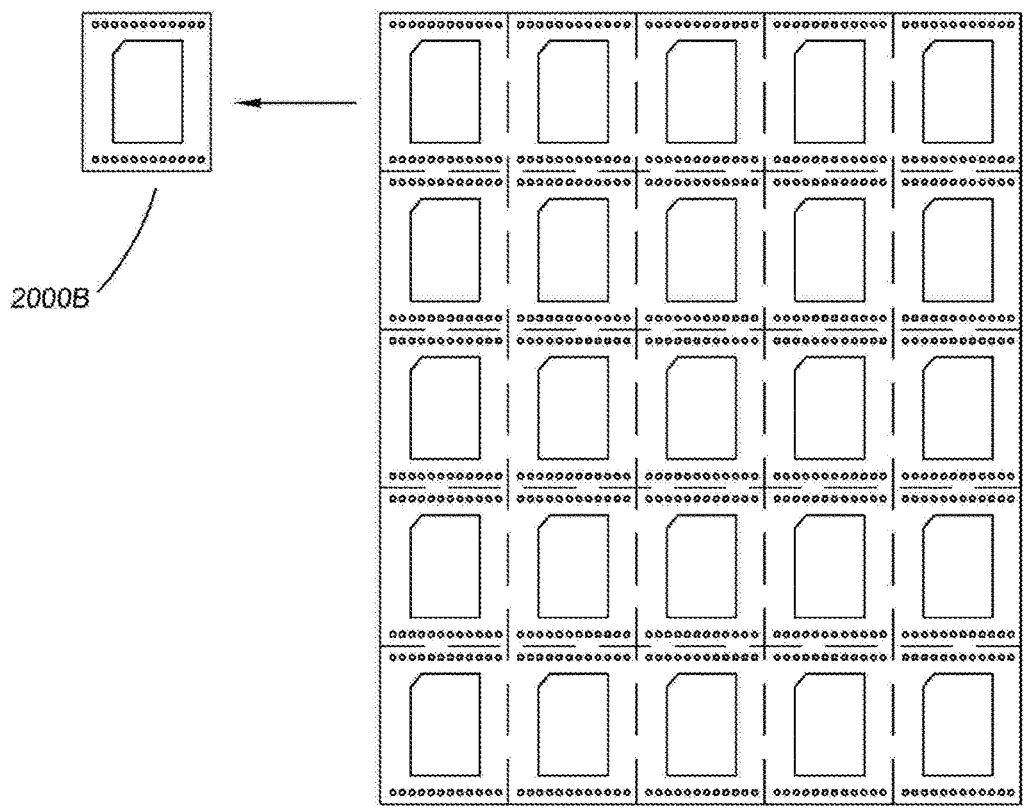
FIG. 12 illustrates that cutting after an overall operation is suitable for forming the photosensitive chip assembly according to the above third preferred embodiment of the present disclosure.

FIG. 12 illustrates the above imposition operation. In FIG. 12, a dashed line illustrates a cutting line for cutting a photosensitive chip board in step (S30b).

It is worth mentioning that further a method for conductively conducting the photosensitive chip 20B with the electrical bracket through the photosensitive chip connecting device 81a may be selected from ACP (anisotropic conductive adhesive), ultrasonic welding, thermocompression welding, reflow soldering and etc.

Figure 13:
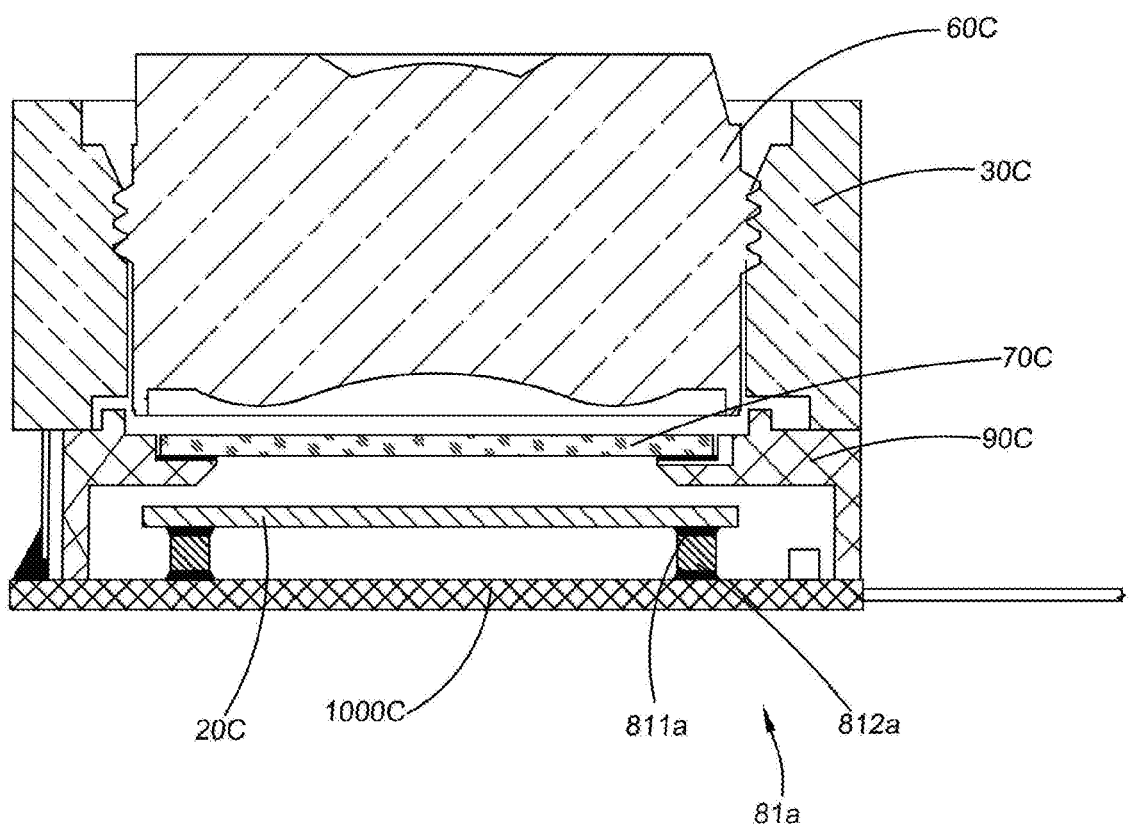
FIG. 13 illustrate a camera module having a photosensitive chip assembly according to a fourth preferred embodiment of the present disclosure.

FIG. 13 illustrates a photosensitive chip assembly and its application in a camera module according to a fourth preferred embodiment of the present disclosure. The photosensitive chip assembly includes a photosensitive chip 20C and a set of photosensitive chip connecting devices 81a. Each photosensitive chip connecting device 81a includes a connecting element 811a and a conducting element 812a, where the conducting element 812a is disposed on the connecting element 811a to increase the height of the connecting device 81a and enable the connecting element 811a to be conductively connected to the photosensitive chip 20 and the rigid circuit board 1000A.

The conducting element 812a of the photosensitive chip connecting device 81a is formed on the connecting element 811a by growing a metal. The connecting element 811a is specifically implemented as an ordinary metal land (ordinary PAD) previously disposed on the photosensitive chip 20C. The conducting element 812a is connected conductively and firmly to the connecting element 811a and thus conductively and firmly connected to the photosensitive chip 20C. When the photosensitive chip assembly is used to form a camera module, the photosensitive chip connecting device 81a is used to conductively connect the photosensitive chip 20C to a preset element of the camera module, so that the photosensitive chip 20C achieves a function in the camera module.

The photosensitive chip connecting device 81a has a certain thickness so as to facilitate the conductible connection of the photosensitive chip 20C to the preset element of the camera module, and facilitate the assembly of the camera module. It is worth mentioning that the photosensitive chip connecting device 81a is formed by growing a metal, and its thickness may be set as required.

The conducting element 812a of the photosensitive chip connecting device 81a is specifically implemented as a metal body. The material of the metal body implemented by the conducting element 812a of the photosensitive chip connecting device 81a may be but is not limited to, gold, copper, alloy thereof, and tin-nickel alloy. A metal or a variety of metals may be plated during plating. The conducting element 812a and the connecting element 811a may be the same metal or different metals.

According to the fourth preferred embodiment of the present disclosure, the technical solution for forming the photosensitive chip connecting device 81a is to plate the metal cylinder by a semiconductor process, for growing copper. The conducting element 812a of the photosensitive chip connecting device 81a is formed by growing a micro copper pillar on the conducting element 811a implemented as a chip pad.

It is worth mentioning that according to the fourth preferred embodiment of the present disclosure, the photosensitive chip connecting device 81a and the internal circuit of the photosensitive chip 20C may be conductively connected so that the photosensitive chip 20C may achieve a preset function when assembled to the camera module.

As shown in FIG. 13, the camera module includes a base 90C, a photosensitive chip 20C, a motor 30C, a circuit board 1000C, and an optical lens assembly 600. The base 900 can provide support for the motor 30C of the camera module. It may be understood that in the absence of the motor 30C, the camera module may be implemented as a fixed-focus camera module.

Specifically, the optical lens assembly 60C is mounted to the motor 30C, and the optical lens assembly 60C may be driven by the motor 30C to be suitable for auto focusing. The circuit board 1000C and the motor 30C are disposed on different sides of the base 90C, so that the optical lens assembly 60C is located on the photosensitive path of the photosensitive chip 20C. Thus, when the camera module is used for capturing an image of an object, lights reflected by the object can be received by the photosensitive chip 20C after being processed by the optical lens assembly 60C, to be suitable for photoelectric conversion. That is, in the present disclosure, the base 90C includes a bracket body 91C and has a clear aperture 100C, and the base 90C may be used to connect the circuit board 1000C and the motor 30C.

According to the preferred embodiment of the present disclosure, the camera module further includes an optical filter 70C, where the optical filter 70C is used to filter out stray lights to further improve the image quality. The optical filter 70C is disposed on the base 90C.

The disposition position of the photosensitive chip 20C matches the position of the clear aperture 100C so that the photosensitive chip 20C can receive lights passing through the clear aperture.

It is worth mentioning that the circuit board 1000C and the base 90C being separately formed is only an example of the present disclosure and is not a limitation of the present disclosure. According to other embodiments of the present disclosure, the circuit board 1000C and the base 90C may alternatively be formed as one body. In addition, the respective shapes or overall shape of the circuit board 1000C and the base 90C may be arbitrarily set as required.

It is worth mentioning that the production of the circuit board 1000C according to the present disclosure is suitable for an imposition operation.

According to the third preferred embodiment of the present disclosure, the production of the photosensitive chip 20C with the photosensitive chip connecting device 81a is suitable for the imposition operation. That is, the process of forming the photosensitive chip connecting device 81a on the photosensitive chip 20C may be an imposition operation. The imposition operation is very beneficial to the scaled and mechanized production of the photosensitive chip assembly 2000C, and increases the production efficiency and the production accuracy. An example of the method for producing the photosensitive chip 20C having the photosensitive chip connecting device 81a by the imposition operation will be described below.

It is worth mentioning that further a method for conductively conducting the photosensitive chip 20C with the circuit board 1000C (PCB board) through the conducting element 812a and the connecting element 811a may be selected from ACP (anisotropic conductive adhesive), ultrasonic welding, thermocompression welding, reflow soldering and etc.

The method for producing the photosensitive chip connecting device 81a by the imposition operation includes the following steps:

forming a photosensitive chip board, that is, forming a photosensitive chip wafer, where each photosensitive chip board can form multiple photosensitive chips 20C;

forming a series of conducting elements 812a on a series of connecting elements 811a of the photosensitive chip board; and cutting the photosensitive chip board to form multiple photosensitive chip assemblies 20C each having the photosensitive chip connecting device 81a.

Accordingly, this production method has the advantage of high production efficiency. In addition, the method of cutting after forming the photosensitive chip connecting device 81a has the advantages of convenient operation and accurate positioning, which does not require the imposition operation, and occupies little space in the production process.

In a specific example, the conducting element 812a of the photosensitive chip connecting device 81a is formed by forming a copper pillar on the photosensitive chip board through a semiconductor metal plating process, that is, copper is plated through the semiconductor plating process at a preset position of the photosensitive chip board until the copper pillar formed by plating reaches a preset thickness.

In addition, it may be understood that the structure and the forming process of the photosensitive chip connecting device 81a in the third and fourth embodiments may be replaced with each other.

Figure 14:
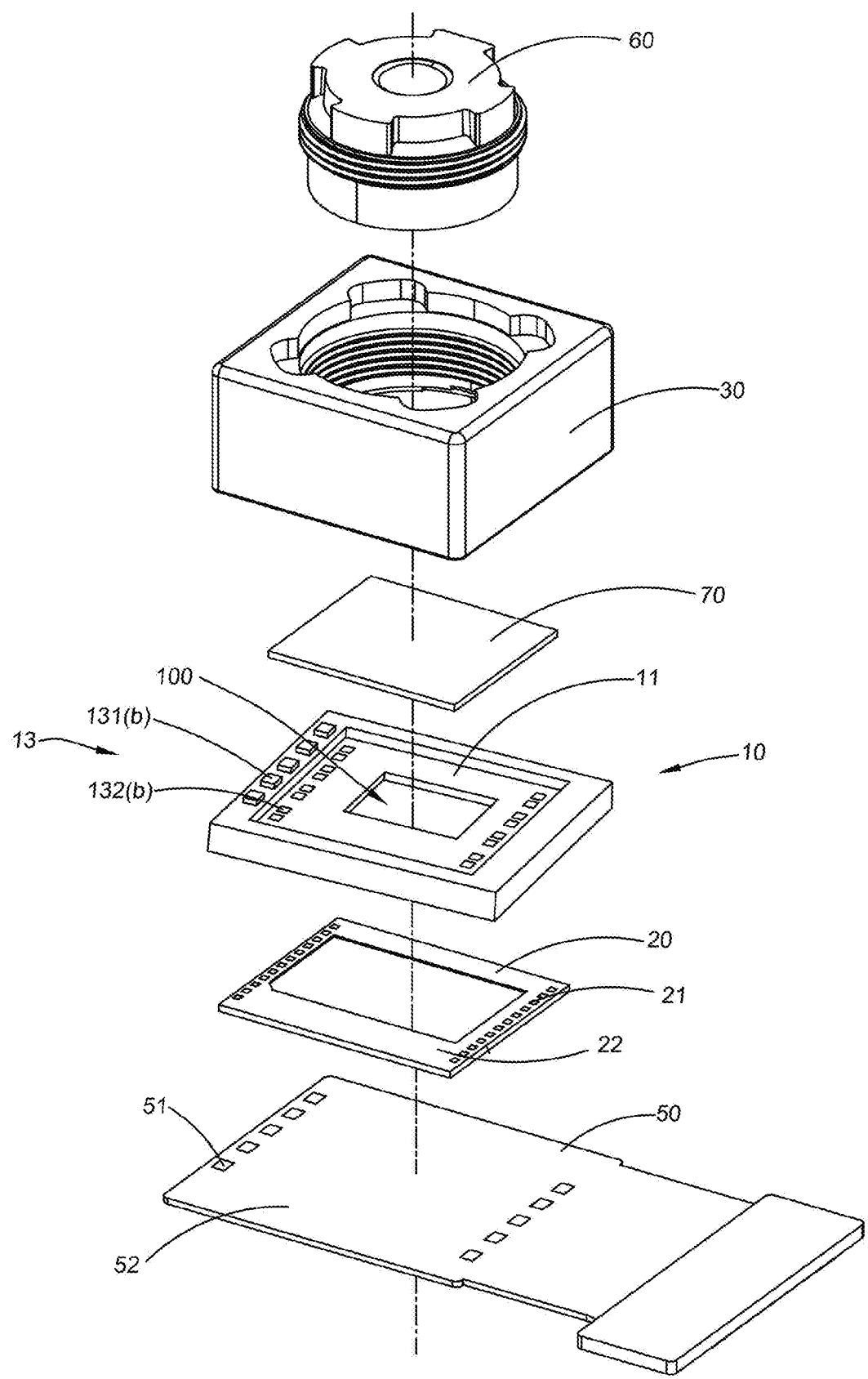
FIG. 14 is an assembly diagram of a camera module according to a fifth preferred embodiment of the present disclosure.
Figure 15:
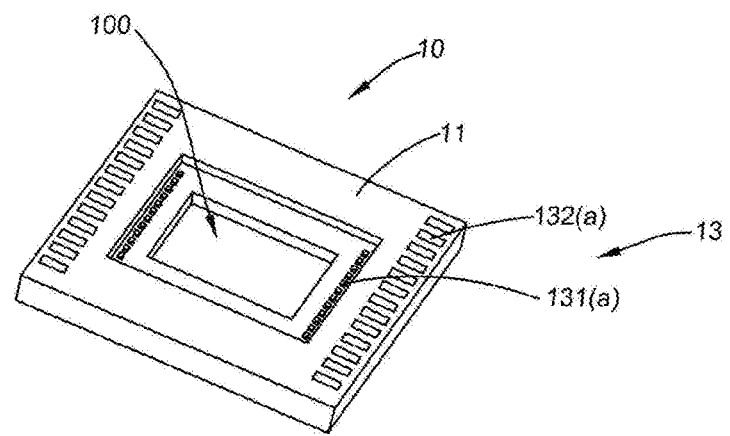
FIG. 15 illustrates an electrical bracket of the camera module according to the above preferred embodiment of the present disclosure.
Figure 16:
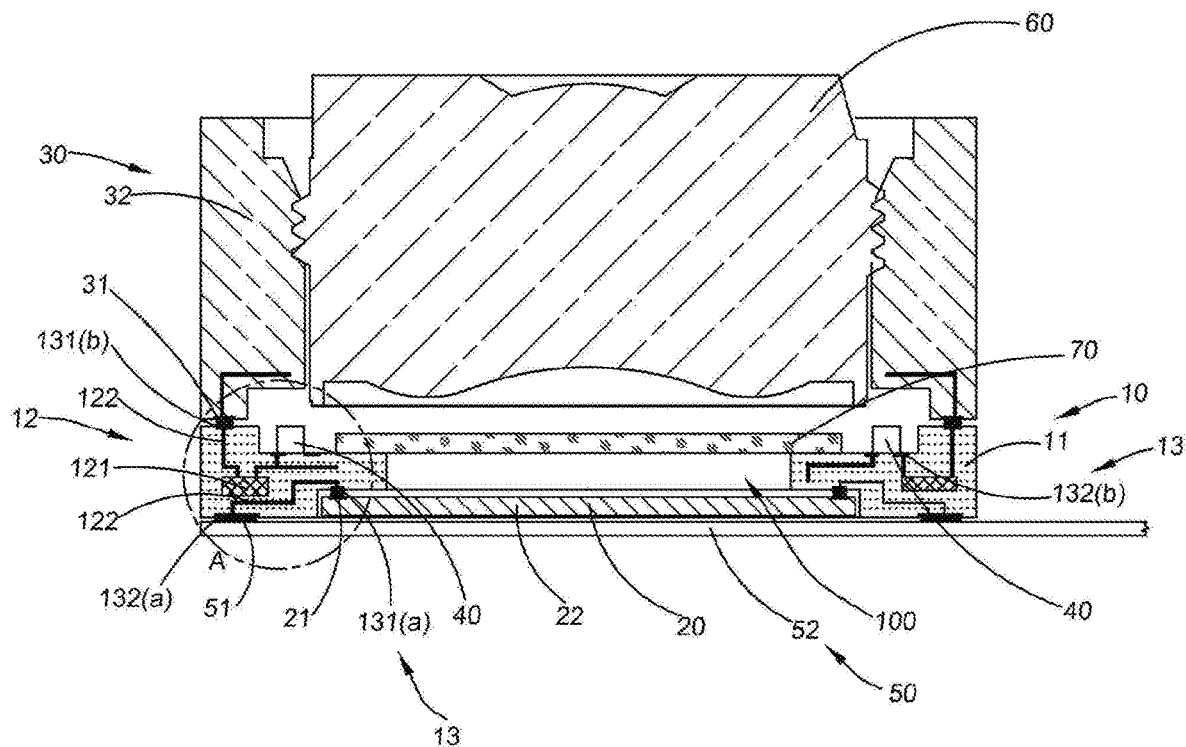
FIG. 16 is a section view of the camera module according to the above preferred embodiment of the present disclosure.
Figure 17:
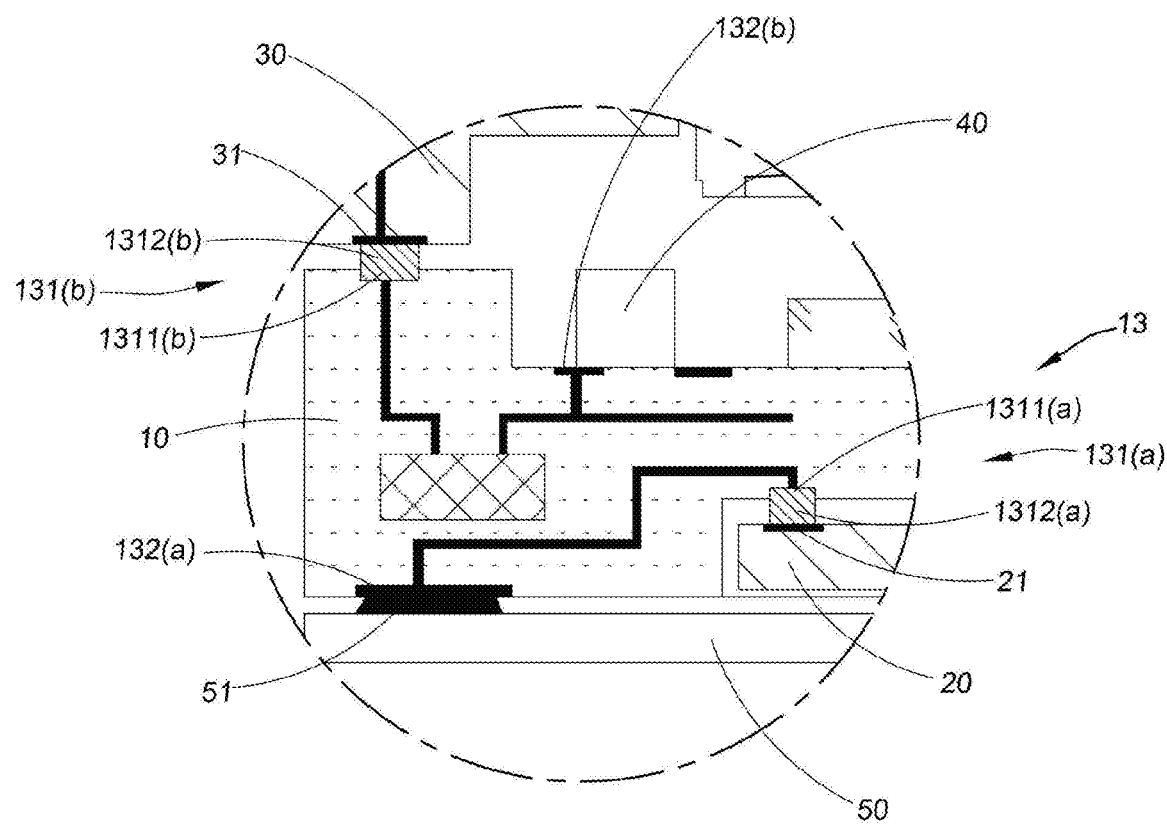
FIG. 17 is a partial enlarged view of the camera module according to the above preferred embodiment of the present disclosure.
Figure 18:
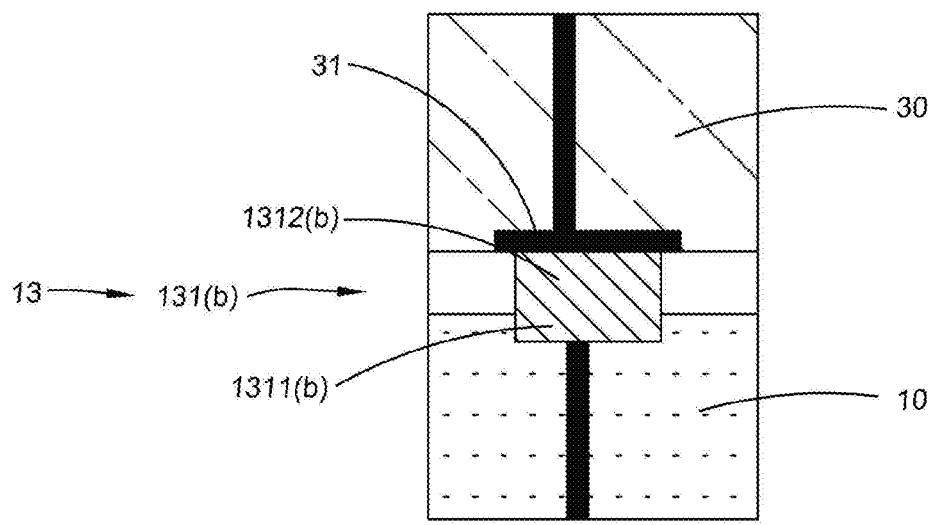
FIG. 18 illustrates that a connecting unit of the electrical bracket of the camera module according to the above preferred embodiment of the present disclosure is used to conductively connect the electrical bracket with a motor.
Figure 19:
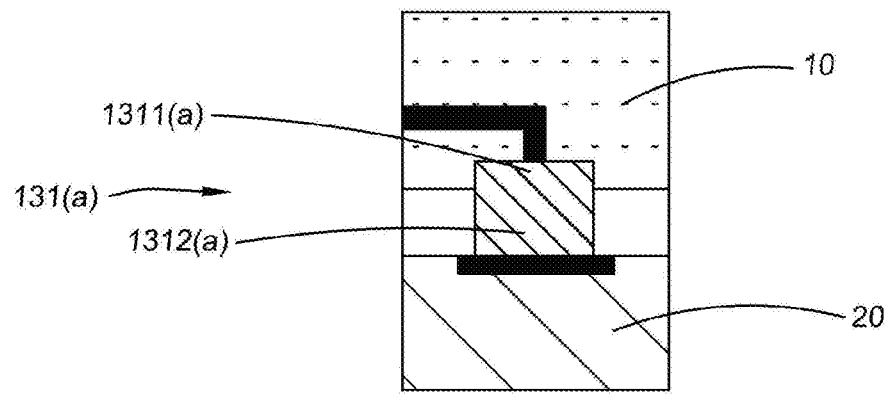
FIG. 19 illustrates that a connecting unit of the electrical bracket of the camera module according to the above preferred embodiment of the present disclosure is used to conductively connect the electrical bracket with a photosensitive chip.
Figure 20:
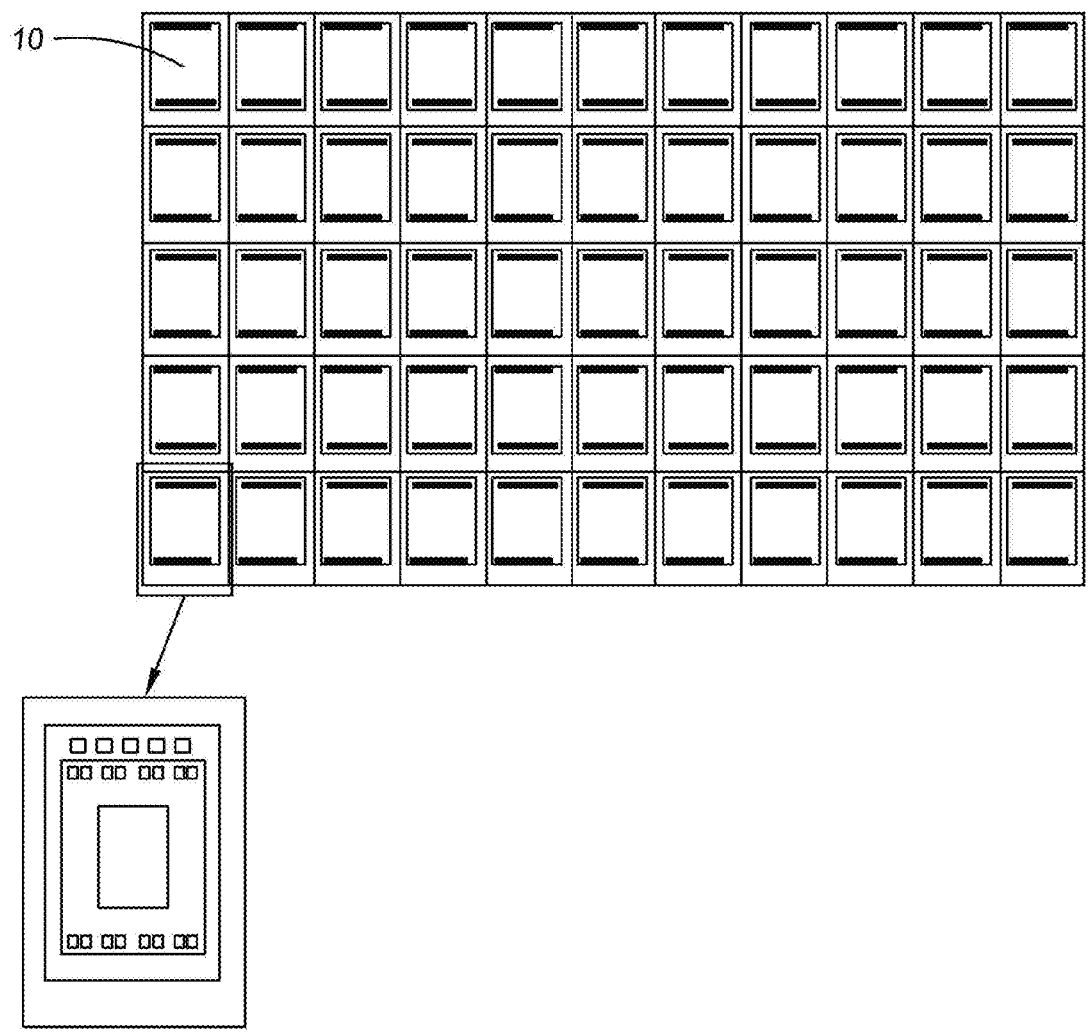
FIG. 20 illustrates that the manufacture of the electrical bracket of the camera module according to the above preferred embodiment of the present disclosure is suitable for performing an imposition operation.
Figure 21:
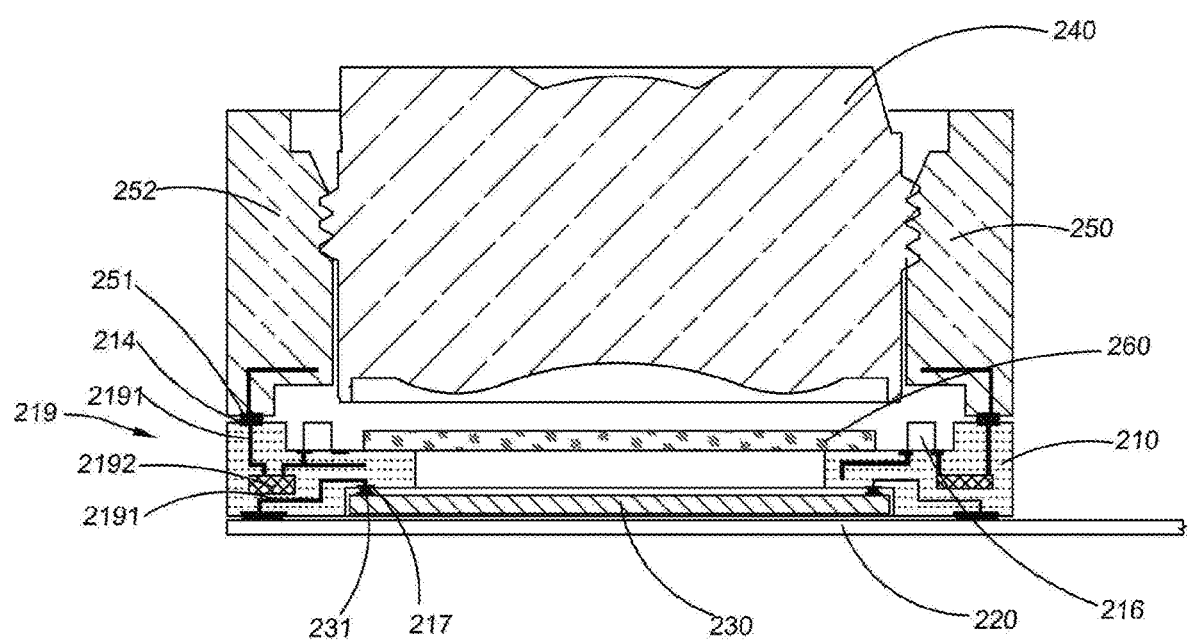
FIG. 21 is a section view of a camera module according to a sixth preferred embodiment of the present disclosure.
Figure 22:
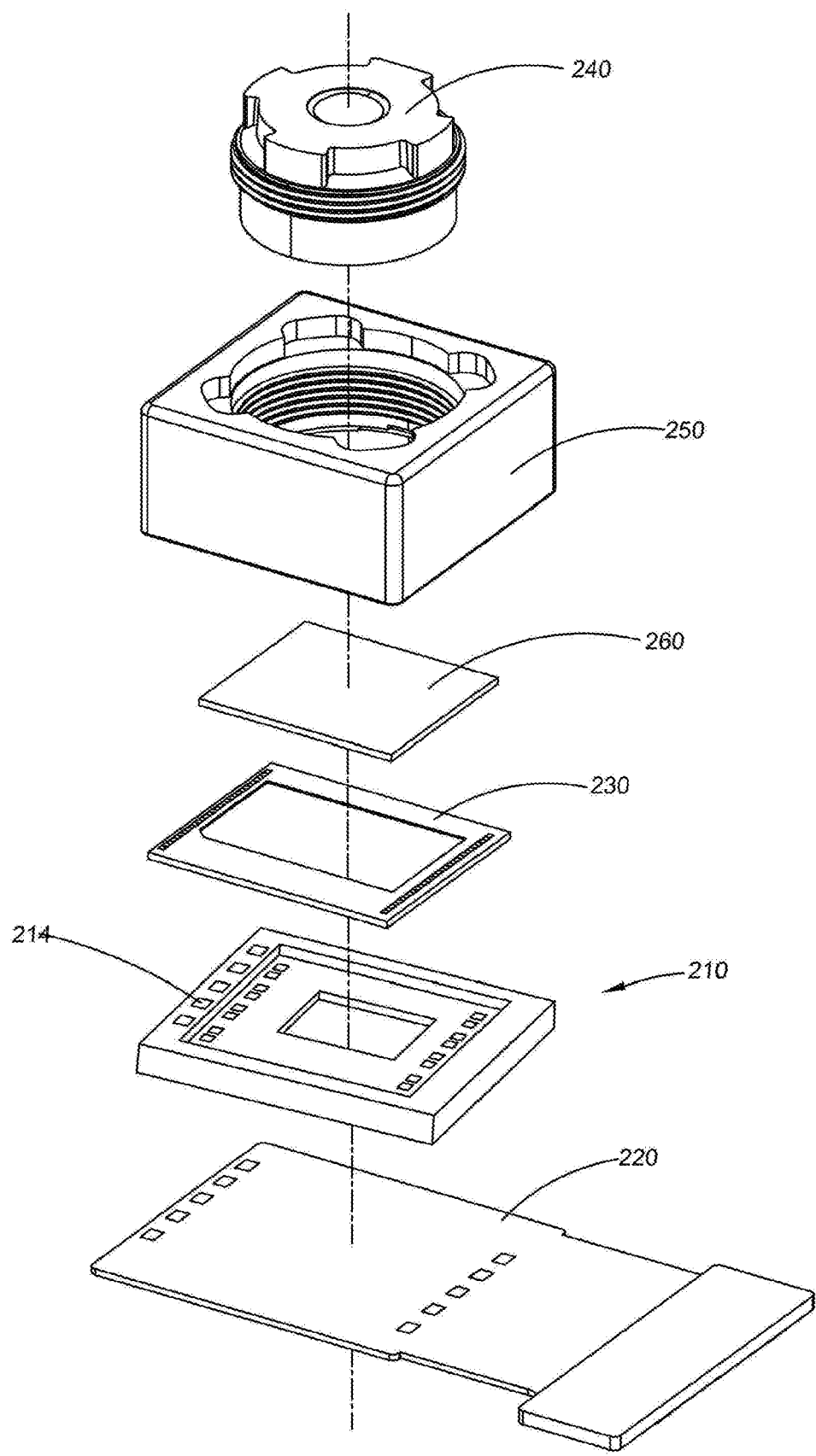
FIG. 22 is an exploded view of a camera module according to the above preferred embodiment of the present disclosure.

FIG. 14 to FIG. 16 illustrate a camera module according to a fifth preferred embodiment of the present disclosure. The camera module includes an electrical bracket 10, a photosensitive chip 20, a motor 30, a series of electronic elements 40, a flexible circuit board 50, and an optical lens assembly 60. The electrical bracket 10 can provide support for the motor 30 of the camera module.

Specifically, the optical lens assembly 60 is mounted to the motor 30, and the optical lens assembly 60 may be driven by the motor 30 to be suitable for auto focusing. The flexible circuit board 50 and the motor 30 are disposed on different sides of the electrical bracket 10 so that the optical lens assembly 60 is located on the photosensitive path of the photosensitive chip 20. Thus, when the camera module is used for capturing an image of an object, lights reflected by the object can be received by the photosensitive chip 20 after being processed by the optical lens assembly 60, to be suitable for photoelectric conversion. That is, in the present disclosure, the electrical bracket 10 may be used to connect the flexible circuit board 50 and the motor 30. That is, the electrical bracket 10 integrates functions of the base and the circuit board of a conventional camera module, to assemble the motor lens assembly module and connect the flexible circuit board of the photosensitive chip.

The electrical bracket 10 includes a bracket body 11, a circuit 12 and a series of connecting units 13 and has a clear aperture 100. The circuit 12 is embedded in the bracket body 11, where the connecting unit 13 is disposed on the surface of the bracket body 11. The circuit 12 includes multiple electrical elements 121 and a set of conductors 122, where the set of conductors 122 are conductively connected to the electrical elements 121 in a preset mode and implement conductible connections with the motor 30, the flexible circuit board 50 and the photosensitive chip 20 through the connecting units 13. Therefore, the camera module forms a preset circuit to perform preset driving and adjustment.

As shown in FIG. 14 and FIG. 16, according to the preferred embodiment of the present disclosure, the camera module further includes an optical filter 70, where the optical filter 70 is used to filter out stray lights to further improve the image quality. The optical filter 70 and the electronic element 40 are both disposed on the electrical bracket 10.

The disposition position of the photosensitive chip 20 matches the position of the clear aperture 100 so that the photosensitive chip 20 can receive lights passing through the clear aperture.

As shown in the figures, the connecting unit 13 may be implemented in many different ways. Specifically, in the preferred embodiment of the present disclosure, the connecting unit 13 includes two connecting units 131 and multiple connecting units 132. The two connecting units 131 are used to connect the photosensitive chip 20 and the motor 30. The multiple connecting units 132 are used to connect the electronic element 40 and the flexible circuit board 50. It is worth mentioning that this arrangement of the present disclosure is merely an example of the present disclosure and not a limitation thereto. Those skilled in the art should understand that the connecting units 131 and the connecting units 132 may all be used to connect the photosensitive chip 20, the motor 30, the electronic element 40, the flexible circuit board 50, and the optical lens assembly 60.

The connecting units 13 according to the preferred embodiment of the present disclosure will be described in detail below. As shown in the figures, the connecting units 13 include a land 1311 and a conducting element 1312, where the conducting element 1312 is disposed on the land 1311 to increase the height of the connecting units 131 and enable the land 1311 to be conductively connected to the photoconductive chip 20 and the motor 30.

According to the preferred embodiment of the present disclosure, the applications of the connecting units 131 to the conductible connection of the electrical bracket 10 to the photosensitive chip 20 and the motor 30 may be labeled as a photosensitive chip connecting unit 131a and a motor connecting unit 131b, respectively. That is, introduced from another viewpoint, it can be said that the connecting units 131 include a photosensitive chip connecting unit 131a and a motor connecting unit 131b. It is worth mentioning that the two introduction methods of the connecting units 131 in the present disclosure are introduced from different perspectives regarding the connecting units 131, and are only disclosed in detail to better illustrate the preferred embodiment of the present disclosure and should not be construed as limiting the present disclosure.

Specifically, the photosensitive chip 20 is conductively connected to the electrical bracket 10. The photosensitive chip 20 includes a series of photosensitive chip conducting members 21 and a photosensitive chip body 22, where the photosensitive chip conducting members 21 are disposed on the photosensitive chip body 22, and the photosensitive chip conducting members 21 and the photosensitive chip connecting unit 131a are conductively connected to implement an energized interconnection between the photosensitive chip 20 and the electrical bracket 10. According to the preferred embodiment of the present disclosure, the photosensitive chip connecting unit 131a includes a photosensitive chip land 1311a and a photosensitive chip conducting element 1312a, where the photosensitive chip conducting element 1312a is disposed on the photosensitive chip land 1311a, in order to increase the height of the photosensitive chip connecting unit 131a to enable the photosensitive chip land 1311a to be conductively connected to the photosensitive chip 20.

It is worth mentioning that the photosensitive chip land 1311a may be implemented as an ordinary PAD, which may utilize the PAD in the existing technology, reduce the production cost, and save resources. Specifically, the present disclosure uses a specific metal process to increase the height of the PAD to replace gold ball mounting and wire bonding. The connecting unit 131a has a compact structure and can satisfy the requirement for conducting the photosensitive chip conducting member 21.

According to the preferred embodiment of the present disclosure, the photosensitive chip conducting element 1312a is specifically implemented as a metal layer, where the metal layer implemented as the photosensitive chip conducting element 1312a may be but is not limited to gold, silver, copper, tin, aluminum, and alloy thereof.

According to the preferred embodiment of the present disclosure, the connection method that the electrical bracket 10 and the photosensitive chip 20 are conductively connected may be, but is not limited to, ACP (anisotropic conductive adhesive), ultrasonic welding, thermocompression welding, and reflow soldering.

Specifically, according to the preferred embodiment of the present disclosure, first, the photosensitive chip conducting element 1312a (specifically implemented as a metal layer in the preferred embodiment of the present disclosure, whose height ranges from 10 um to 100 um) is grown on the photosensitive chip land 1311a of the electrical bracket 10 through a preset metal process, and then the electrical bracket 10 and the photosensitive chip 20 are connected by a preset connection method, where the metal layer may include but is not limited to gold, silver, copper, tin, aluminum, and the like. The preset connection method may be, but is not limited to, ACP (anisotropic conductive adhesive), ultrasonic welding, thermocompression welding, and reflow soldering.

It is worth mentioning that this conductible connection method may make full use of existing ordinary PADs to reduce the cost of technological improvements, make full use of conventional processes and equipments, and avoid resource waste. Certainly, those skilled in the art should understand that the photosensitive chip land 1311a may alternatively be implemented as other lands. The present disclosure is not limited in this regard.

The motor 30 includes a series of motor conducting members 31 and a motor body 32, where the motor conducting members 31 are disposed on the motor body 32. The motor conducting members 31 and the motor connecting unit 131b are conductible connectable to implement an energized interconnection between the motor 30 and the electrical bracket 10. It is worth mentioning that the position of the motor conducting members 31 on the motor body 32 matches the position of the motor connecting unit 131b on the electrical bracket 10. When the motor 30 is disposed on the electrical bracket 10, the motor 30 can be conductively connected to the circuit 12 and thus be conductively connected to the flexible circuit board 50. More specifically, the motor conducting members 31 are conductively connected to the motor connecting unit 131b on the electrical bracket 10, and the method for the conductible connection may be, but is not limited to ACP (anisotropic conductive adhesive), ultrasonic welding, thermocompression welding, and reflow soldering.

According to the preferred embodiment of the present disclosure, the motor connecting unit 131b includes a motor land 1311b and a motor conducting element 1312b, where the motor conducting element 1312b is firmly disposed on the motor land 1311b to implement the conductible conduction of the motor land 1311b to the motor conducting member 31.

It is worth mentioning that the motor land 1311b may be implemented as an ordinary PAD, which may utilize the PAD in the existing technology, reduce the production cost, and save resources. Specifically, the present disclosure uses a specific metal process to increase the height of the PAD to replace gold ball mounting and wire bonding. The motor connecting unit 131b has a compact structure and can satisfy the requirement for conducting the motor conducting member 31.

According to the preferred embodiment of the present disclosure, the motor conducting element 1312b is specifically implemented as a metal layer, where the metal layer implemented by the motor conducting element 1312b may be, but is not limited to, gold, silver, copper, tin, aluminum and alloys thereof.

According to the preferred embodiment of the present disclosure, the connection method that the electrical bracket 10 and the motor 30 are conductively connected may be, but is not limited to, ACP (anisotropic conductive adhesive), ultrasonic welding, thermocompression welding, and reflow soldering.

Specifically, according to the preferred embodiment of the present disclosure, first, the motor conducting element 1312b (specifically implemented as a metal layer in the preferred embodiment of the present disclosure, whose height ranges from 10 um to 100 um) is grown on the motor land 1311b of the electrical bracket 10 through a preset metal process, and then the electrical bracket 10 and the motor 30 are connected by a preset connection method, where the metal layer may include but is not limited to gold, silver, copper, tin, aluminum, and the like. The preset connection method may be, but is not limited to, ACP (anisotropic conductive adhesive), ultrasonic welding, thermocompression welding, and reflow soldering.

It is worth mentioning that this conductible connection method may make full use of existing ordinary PADs to reduce the cost of technological improvements, make full use of conventional processes and equipments, and avoid resource waste. Certainly, those skilled in the art should understand that the motor land 1311b may alternatively be implemented as other lands. The present disclosure is not limited in this regard.

According to the preferred embodiment of the present disclosure, the conducting element 1312 is specifically implemented as a metal layer, where the metal layer implemented by the conducting element 1312 may be, but is not limited to, gold, silver, copper, tin, aluminum and alloys thereof.

According to the preferred embodiment of the present disclosure, the connection method that the electrical bracket 10 and the electronic element 40 are conductively connected may be, but is not limited to, ACP (anisotropic conductive adhesive), ultrasonic welding, thermocompression welding, and reflow soldering.

Specifically, according to the preferred embodiment of the present disclosure, first, the conducting element 1312 (specifically implemented as a metal layer in the preferred embodiment of the present disclosure, whose height ranges from 10 $\mu$m to 10 $\mu$m) is grown on the land 1311 of the electrical bracket 10 through a preset metal process, and then the electrical bracket 10 and the motor 30 are connected by a preset connection method, where the metal layer may include but is not limited to gold, silver, copper, tin, aluminum, and the like. The preset connection method may be, but is not limited to, ACP (anisotropic conductive adhesive), ultrasonic welding, thermocompression welding, and reflow soldering.

It is worth mentioning that this conductible connection method may make full use of existing ordinary PADs to reduce the cost of technological improvements, make full use of conventional processes and equipment, and avoid resource waste. Certainly, those skilled in the art should understand that the land 1311 may alternatively be implemented as other lands. The present disclosure is not limited in this regard.

The connection unit 132 includes a series of circuit board connecting units 132a and a series of electronic element connecting units 132b. As shown in the figures, the electrical bracket 10 is conductively connected to the flexible circuit board 50 via the circuit board connecting unit 132a. Specifically, the flexible circuit board 50 includes a series of circuit board conducting members 51 and a circuit board body 52, where the circuit board conducting members 51 are disposed on the circuit board body 52. The circuit board conducting members 51 and the corresponding circuit board connecting units 132a are conductively connected to each other, to realize the conductible connection between the electrical bracket 10 and the flexible circuit board 50.

According to the preferred embodiment of the present disclosure, the electrical bracket 10 is mounted on the flexible circuit board 50 so that the electrical bracket 10 is conductively connected to the flexible circuit board 50 while being supported stably by the flexible circuit board 50. It is worth mentioning that the position of the circuit board conducting member 51 on the circuit board body 52 matches the position of the circuit board connecting unit 82a on the electrical bracket 10. When the flexible circuit board 50 is mounted on the electrical bracket 10, the flexible circuit board 50 can be conductively connected to the circuit 12. The circuit board conducting member 51 is conductively connected to the circuit board connecting unit 132a on the electrical bracket 10, and the conductible connection method may be, but is not limited to, welding.

According to the preferred embodiment of the present disclosure, the circuit board connecting device 132a is specifically implemented as a circuit board pad. The electrical bracket 10 is welded to the flexible circuit board 50. It should be understood by those skilled in the art that this mounting arrangement and this welding connection method are merely examples of the present disclosure rather than limiting to the present disclosure. The connection between the electrical bracket 10 and the flexible circuit board 50 may be implemented as but not limited to welding.

The electronic element connecting unit 132b is disposed on the bracket body 11. The electronic element connecting unit 132b is specifically implemented as an electronic element pad for conductively connecting the electronic element 40. Those skilled in the art should understand that the conductible connection method of the electronic element 40 to the electrical bracket 10 may be but is not limited to welding.

It is worth mentioning that according to the preferred embodiment of the present disclosure, the circuit board connecting unit 132a and the electronic element connecting unit 132b connected with the flexible circuit board 50 and the electronic element 40 may alternatively be implemented as a conducting element including a metal layer, similarly to the connecting unit 131a and the motor connecting unit 131b. The present disclosure is not limited in this regard.

It is worth mentioning that the flexible circuit board 50 and the electrical bracket 10 being separately formed is merely an example of the present disclosure and not a limitation. According to other embodiments of the present disclosure, the flexible circuit board 50 and the electrical bracket 10 may alternatively be formed as one body. In addition, the respective shapes or overall shape of the flexible circuit board 50 and the electrical bracket 10 may be arbitrarily set as required.

As shown in the figures, the electrical bracket 10 according to the present disclosure is made to be suitable for an imposition operation. Specifically, for the metal layer (the motor conducting element 1312*b*, and the photosensitive chip conducting element 1312*a*, etc.) of the connecting unit 13 (implemented as a PAD in the preferred embodiment of the present disclosure) which can increase the height of the electrical bracket 10, the imposition operation may be achieved by, but not limited to, methods such as plating and sputtering.

The present disclosure provides a method for conducting the electrical bracket 10 with other devices, such as the motor 30, the photosensitive chip 20, the flexible circuit board 50, and/or the electronic element 40, that is, a conductible connection method includes the following steps:

S1: growing a metal layer on the electrical bracket 10; and

S2: connecting conductively the metal layer with a preset electrical element.

As described above, the manufacture of the electrical bracket 10 is suitable for the imposition operation. The conduction method may further include the following steps before step S1:

performing an imposition operation on multiple electrical brackets 10, which is, forming an imposition panel of the electrical bracket 10.

The electrical element to which the metal layer growing on the PAD of the electrical bracket is used for connection may be selected from but not limited to a chip and a motor. The above step S2 further includes the following steps:

S21: connecting conductively the metal layer with a photosensitive chip;

S22: connecting conductively the metal layer with a motor;

S23: connecting conductively the metal layer with a series of electronic elements; and S24: connecting conductively the metal layer with a flexible circuit board.

The above step S1 further includes the following steps:

S11: growing the metal layer on a photosensitive chip land of the electrical bracket;

S12: growing the metal layer on a motor land of the electrical bracket;

S13: growing the metal layer on an electronic element land of the electrical bracket; and S14: growing the metal layer on a flexible circuit board land of the electrical bracket.

FIG. 21 to FIG. 24 shows a camera module according to a sixth preferred embodiment of the present disclosure. The camera module includes an electrical bracket 210, a flexible circuit board 220, a photosensitive chip 230, and an optical lens assembly 240 and a motor 250. It may be understood that the autofocus module illustrated in the present disclosure, in other embodiments, may alternatively not have the motor 250, so that the camera module is a fixed-focus camera module.

In this embodiment, the optical lens assembly 240 is mounted to the motor 250, and the optical lens assembly 240 may be driven by the motor 250 to be suitable for auto focusing. The flexible circuit board 220 and the motor 250 are disposed on different sides of the electrical bracket 210 so that the optical lens assembly 240 is located on the photosensitive path of the photosensitive chip 230. Thus, when the camera module is used for capturing an image of an object, lights reflected by the object can be received by the photosensitive chip 230 after being processed by the optical lens assembly 240, to be suitable for photoelectric conversion. That is, in the present disclosure, the electrical bracket 210 may be used to connect the flexible circuit board 220 and the motor 250. That is, the electrical bracket 210 integrates functions of the base and the circuit board of a conventional camera module, to assemble the motor lens assembly module and connect the flexible circuit board of the photosensitive chip.

The electrical bracket 210 is provided with a circuit 219, where the circuit 219 includes multiple electrical elements 2192 and a set of conductors 2191, where the set of conductors 2191 are conductively connected to the electrical elements 2192 and the motor 250, the flexible circuit board 220 and the photosensitive chip 230 in a preset mode. Therefore, the camera module forms a preset circuit to perform preset driving and adjustment.

The electrical bracket 210 includes a motor pad 214, which is used to electrically connect the motor 250 to the circuit 219 so that the motor 250 can be driven to further drive the optical lens assembly 240, and thus adjust the camera module.

The photosensitive chip 230 is electrically connected to the flexible circuit board 220. Specifically, the photosensitive chip 230 is mounted on the electrical bracket 210, where the electrical bracket 210 is mounted on the flexible circuit board 220, and the photosensitive chip 230 is electrically connected to the flexible circuit board 220 through the conductor 2191 disposed on the electrical bracket 210.

The motor 250 includes a series of motor conducting members 251 and a motor body 252, where the motor conducting members 251 are disposed on the motor body 252. It is worth mentioning that the position of the motor conducting members 251 on the motor body 252 matches the position of the motor pad 214 on the electrical bracket 210. When the motor 250 is disposed on the electrical bracket 210, the motor 250 can be conductively connected to the circuit 219 and further be conductively connected to the flexible circuit board 220. More specifically, the motor conducting members 251 are conductively connected to the motor pad 214 on the electrical bracket 210, and the method for conductible connection may be, but is not limited to ACP (anisotropic conductive adhesive), ultrasonic welding, thermocompression welding, and reflow soldering.

According to the preferred embodiment of the present disclosure, the camera module further includes an optical filter 260, where the optical filter 260 is used to filter out stray lights to further improve the image quality. The optical filter 260 is disposed between the photosensitive chip 230 and the optical lens assembly 240 and supported by the electrical bracket 210.

Figure 23:
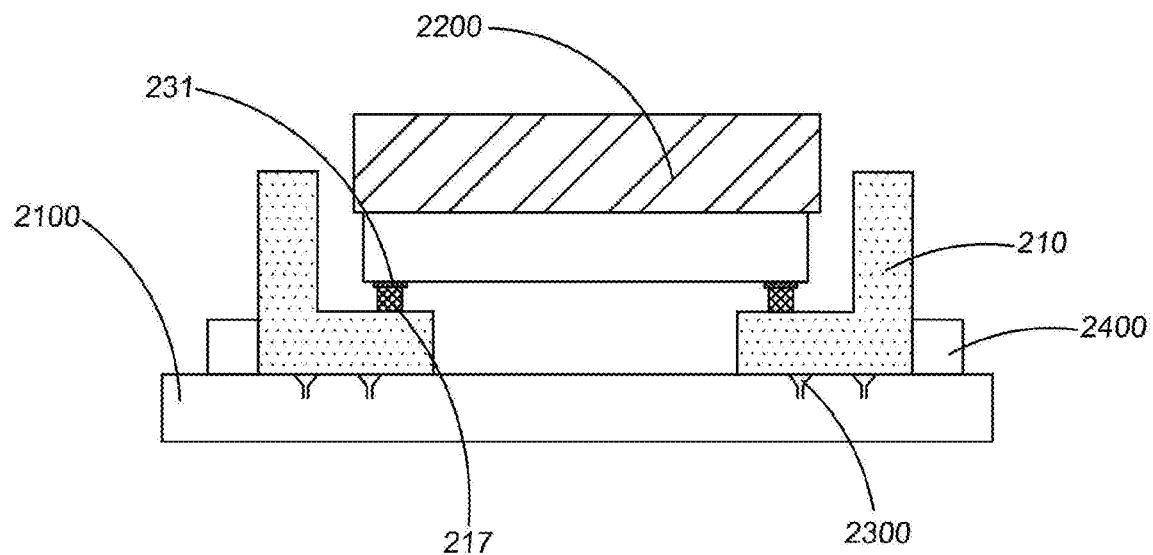
FIG. 23 is a schematic diagram of a method for assembling, using an ultrasonic process, an electrical bracket and a photosensitive chip of a camera module according to the above preferred embodiment of the present disclosure.

According to the preferred embodiment of the present disclosure, as shown in FIG. 23, the electrical bracket 210 includes multiple bracket lands 217. The photosensitive chip 230 includes multiple chip lands 231, where the multiple bracket lands 217 of the electrical bracket 210 are respectively aligned with the multiple chip lands 231 of the photosensitive chip 230, pre-fixed using a jig, and processed by an ultrasonic process so as to enable the conduction. It is worth mentioning that the bracket lands 217 may be made of a copper material. The chip lands 231 may be made of an aluminum material.

Figure 24:
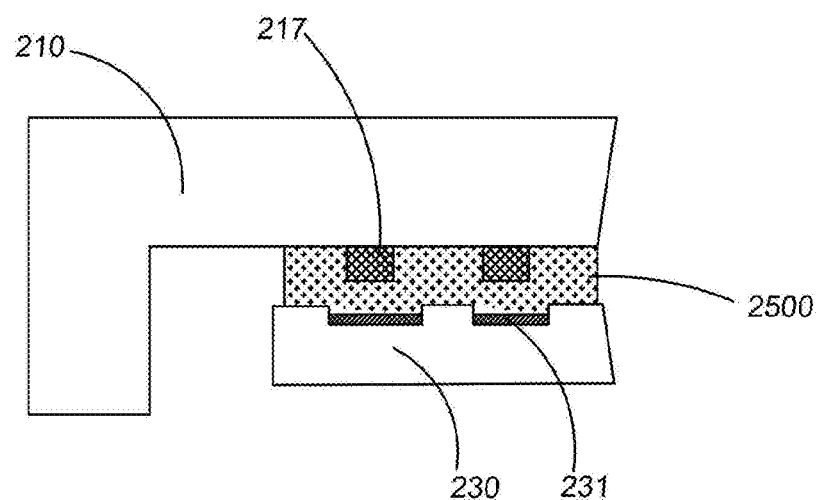
FIG. 24 is a partial schematic diagram of a method for assembling, using an ACF/ACA process, an electrical bracket and an IC of another camera module according to the above preferred embodiment of the present disclosure.

According to the preferred embodiment of the present disclosure, as shown in FIG. 24, an ACF/ACA process is used, where the ACF is an anisotropic conductive film and the ACA is an anisotropic conductive adhesive. Here, a conductive medium coated or pasted on the areas of the multiple bracket lands 217 of the electrical bracket 210 may be ACF or ACA, and the way of attaching the conductive medium is not limited thereto. Similarly, the conductive medium may also be attached to the area of the multiple chip lands 231 of the photosensitive chip 230, and the way of attaching the conductive medium is not limited thereto. Then, the bracket lands 217 and the chip lands 231 are pre-pasted after being aligned, where thermocompression welding may optionally be performed or not performed. It is worth mentioning that if thermocompression welding is used, the temperature of the hot pressing ranges from 150-200° C.

It is worth mentioning that, as shown in FIG. 23, a method for assembling a connection component of a camera module is further provided according to the preferred embodiment of the present disclosure, which includes the following steps:

(S01) aligning multiple bracket lands 217 of an electrical bracket 210 with multiple chip lands 231 of a photosensitive chip 230 respectively;

(S02) fixing the camera module to an ultrasonic working table 100;

(S03) applying a pressure to the camera module through a pressure head 200;

(S04) triggering a high frequency vibration through the ultrasonic working table 100; and (S05) causing the bracket lands 217 and the chip lands 231 to generate a high-frequency friction to aggregate.

It is worth mentioning that according to step (S03), the pressure head 200 has a heat whose temperature ranges from 150° C. to 250° C. The pressure applied by the pressure head is 25N to 50N to the camera module.

In addition, according to step (S04), the high frequency vibration has a frequency ranging from 17 KHZ to 27 KHZ.

In addition, according to step (S05), when the high-frequency friction is generated, the bracket lands 217 and the chip lands 231 are molecularly aggregated, thereby implementing the conduction.

In particular, according to step (S02), when the camera module is placed on the ultrasonic working table 100, the camera module is fixed on the ultrasonic working table 100 through multiple suction holes 300 to limit the movement of the module in the Z direction. In addition, multiple limiting devices 400 are arranged around the module to limit the movement of the camera module in the X and Y directions, which ensures that a correct position of the camera module is connected.

In addition, when the connection is performed, the photosensitive chip 230 is adsorbed on the pressure head through a suction hole on the pressure head, and the bracket lands 217 of the electrical bracket 210 contacts the chip lands 231 of the photosensitive chip 230 under a force.

It is worth mentioning that the bracket lands 217 may be made of a copper material. The chip lands 231 may be made of an aluminum material.

It should be understood by those skilled in the art that when the ultrasonic working table is used to perform the high frequency vibration to connect the bracket lands 217 with the chip lands 231, and step (S01) may be first performed for pre-assembly, so that the bracket lands 217 and the chip lands 231 are positioned in advance. Alternatively the positioning and connection of the bracket lands 217 and the chip lands 231 may be performed at the same time.

It is worth mentioning that, as shown in FIG. 24, another method for assembling a connection component of a camera module is further provided according to the preferred embodiment of the present disclosure, which includes the following steps:

(S001) coating or pasting a conductive medium 500 on multiple bracket lands 217 of an electrical bracket 210 or coating or pasting the conductive medium 500 on multiple chip lands 231 of a photosensitive chip 230;

(S002) aligning the multiple bracket lands 217 of the electrical bracket 210 with the multiple chip lands 231 of the photosensitive chip 230 respectively;

(S003) pre-pasting the multiple bracket lands 217 with the multiple chip lands 231; and (S004) thermally compressing and bonding the multiple bracket lands 217 and the multiple chip lands 231.

It is worth mentioning that according to step (S001), the conductive medium 500 may be ACF or ACA, i.e., anisotropic conductive film or anisotropic conductive adhesive.

It should be understood by those skilled in the art that the above (S003) is not an essential action, that is, after the pre-pasting, the thermocompression bonding may be performed, or the thermocompression bonding of step (S004) is directly performed after the alignment of step (S002) is performed. The temperature of the thermocompression bonding ranges from 150° C. to 250° C.

Figure 25:
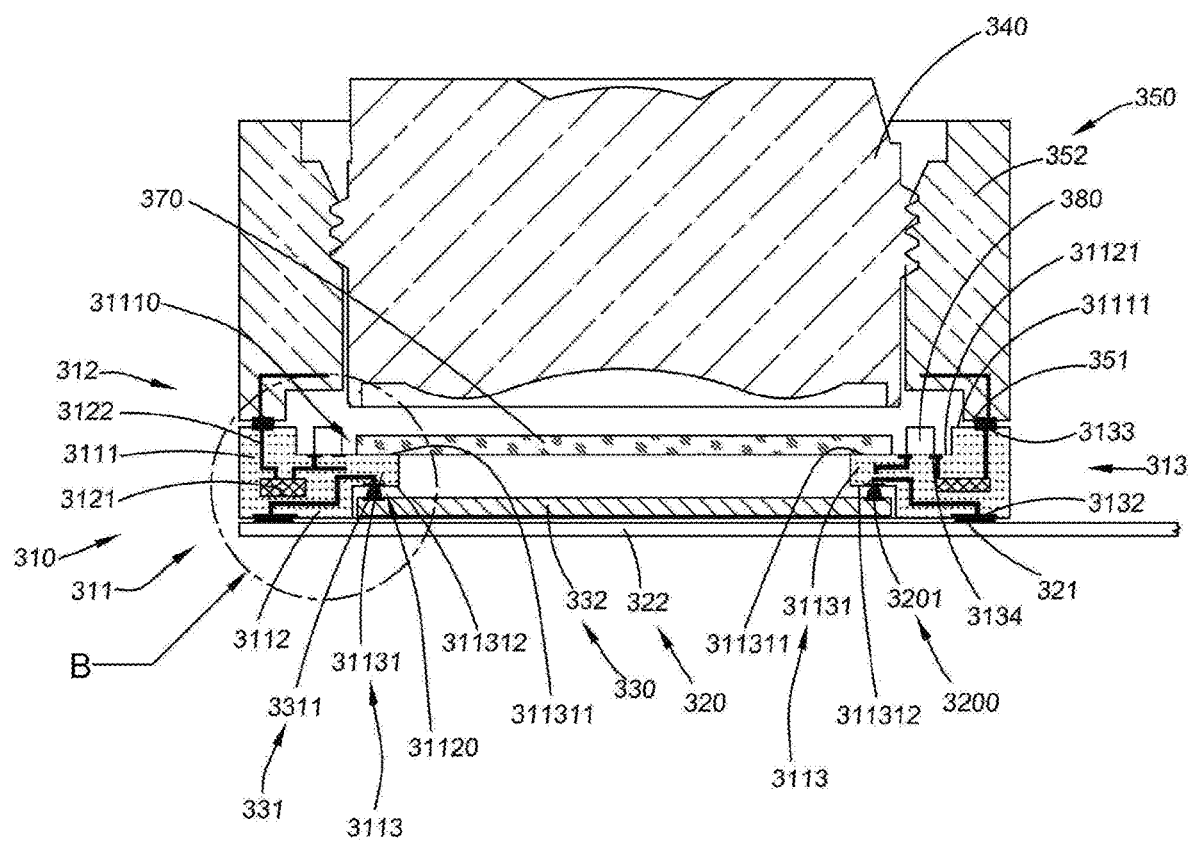
FIG. 25 is a section view of a camera module according to a seventh preferred embodiment of the present disclosure.
Figure 26:
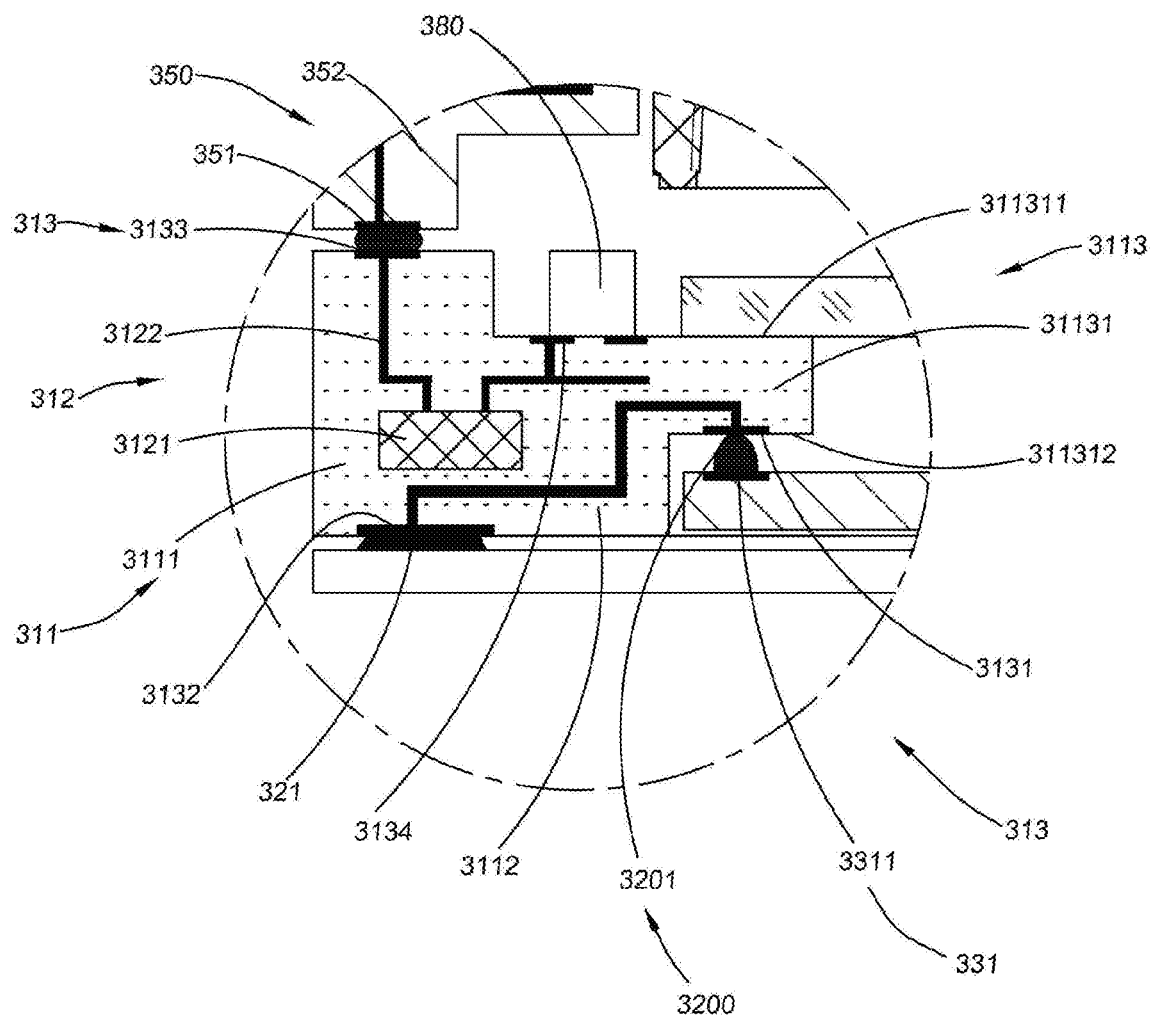
FIG. 26 is a partial enlarged view of the camera module according to the above preferred embodiment of the present disclosure.
Figure 27:
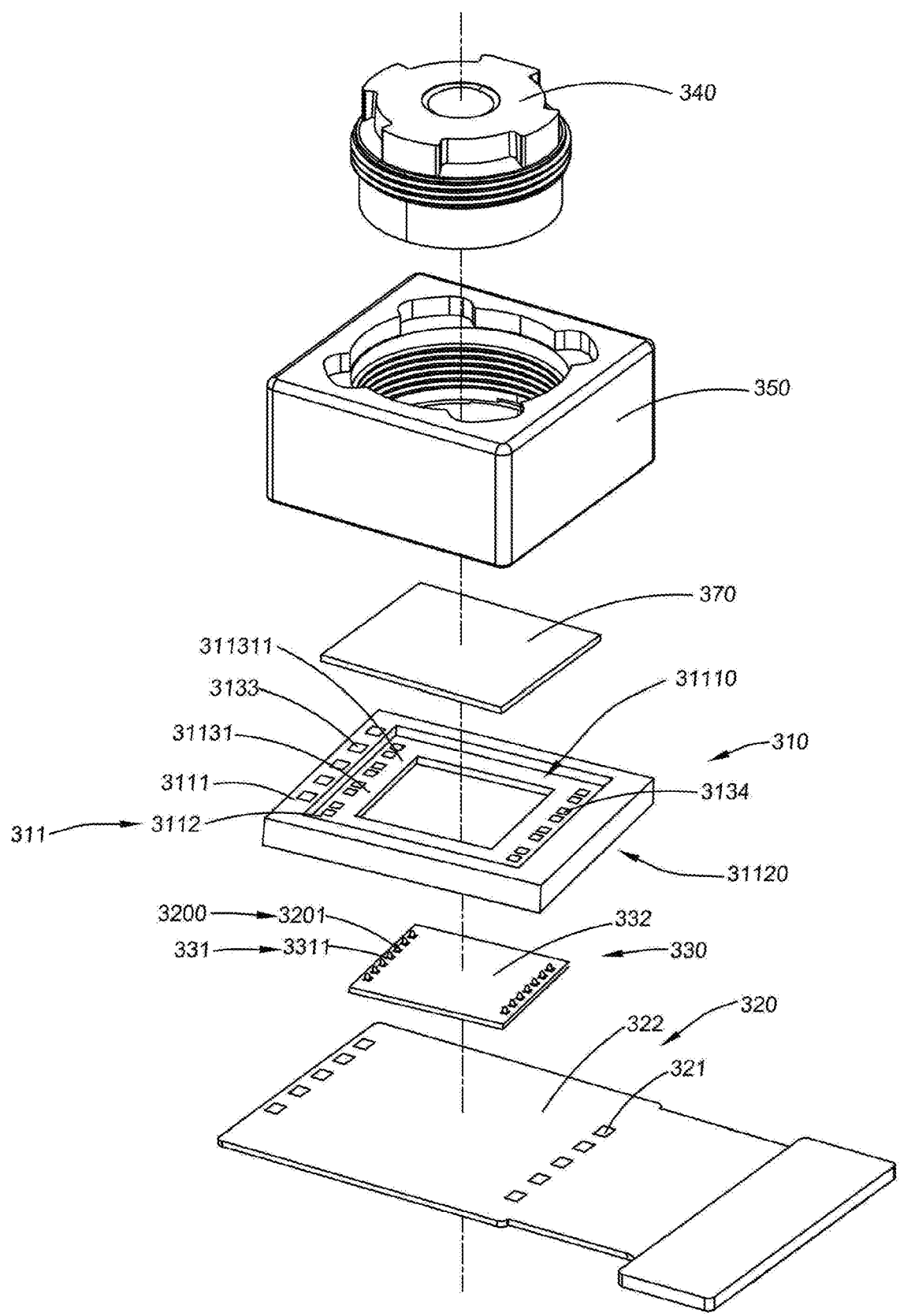
FIG. 27 is an assembly diagram of the camera module according to the above preferred embodiment of the present disclosure.

FIG. 25 to FIG. 27 illustrate a camera module according to a seventh preferred embodiment of the present disclosure. The camera module includes an electrical bracket 310, a flexible circuit board 320, a photosensitive chip 330, and an optical lens assembly 340 and a driving element 350.

The optical lens assembly 340 is mounted to the driving element 350, and the optical lens assembly 340 may be driven by the driving element 350 to be suitable for auto focusing. The flexible circuit board 320 and the driving element 350 are disposed on different sides of the electrical bracket 310 so that the optical lens assembly 340 is located on the photosensitive path of the photosensitive chip 330. Thus, when the camera module is used for capturing an image of an object, lights reflected by the object can be received by the photosensitive chip 330 after being processed by the optical lens assembly 340, to be suitable for photoelectric conversion. That is, in the present disclosure, the electrical bracket 310 may be used to connect the flexible circuit board 320 and the driving element 350. That is, the electrical bracket 310 integrates functions of the base and the circuit board of a conventional camera module, to assemble the lens assembly module and connect the flexible circuit board of the photosensitive chip.

The electrical bracket 310 includes a bracket body 311, a circuit 312 and a series of connecting units 313 and has a clear aperture 3100. The circuit 312 is embedded in the bracket body 311, where the connecting units 313 are disposed on the surface of the bracket body 311. The circuit 312 includes multiple electrical elements 3121 and a set of conductors 3122, where the set of conductors 3122 are conductively connected to the electrical elements 3121 in a preset mode and implement conductible connections with the driving element 350, the flexible circuit board 320 and the photosensitive chip 330 through the connecting units 313. Therefore, the camera module forms a preset circuit to perform preset driving and adjustment.

As shown in FIG. 25 to FIG. 27, according to the seventh preferred embodiment of the camera module of the present disclosure, the bracket body 311 includes a first bracket portion 3111, a second bracket portion 3112, and a third bracket portion 3113, and the first bracket portion 3111, the second bracket portion 3112, and the third bracket portion 3113 together form a hollow ring structure, where the first bracket portion 3111 is stacked on the second bracket portion 3112. The third bracket portion 3113 extends from the inner sides of the first bracket portion 3111 and the second bracket portion 3112 to form a boss 31131. The upper surface 311311 of the boss 31131 and the inner side surface of the bracket body 3111 form a first accommodating space 31110. The lower surface 11312 of the boss 31131 and the inner side surface of the bracket body 3111 form a second accommodating space 31120. It may be understood that the first bracket portion 3111, the second bracket portion 3112, and the third bracket portion 3113 are an integral structure made of laminated resin, which is divided into different parts for convenience of description.

Preferably, the third bracket portion 3113 is in an annular shape so that the boss 31131 is in an annular shape. As a variation of the seventh preferred embodiment of the camera module according to the present disclosure, those skilled in the art may determine the shape and number of the bosses 31131 according to the structure of the third bracket portion 3113. For example, the third bracket portion 3113 is set in an arbitrary shape, then the shape of the boss 31131 also changes accordingly, as long as the upper surface and the lower surface of the boss 31131 can form the first accommodating space 31110 and the second accommodating space 31120 respectively.

The boss structure and the first bracket portion 3111 of the bracket body 311 of the electrical bracket 310 of the camera module according to the seventh preferred embodiment of the present disclosure can not only provide a firm support for the driving element 350 and the optical lens assembly 340, but also facilitates fully forming spaces and provides a reasonable space for arranging other elements of the camera module.

Further, according to the seventh preferred embodiment of the present disclosure, the camera module further includes an optical filter 370 and a series of electronic elements 380, where the optical filter is used to filter out stray lights to further improve the image quality. The optical filter 370 and the electronic elements 380 are both disposed in the first accommodating space 31110 formed by the upper surface 311311 of the boss 31131 of the third bracket portion 3113, such that the first accommodating space 31110 provides a space for disposing the optical filter 370 and the electronic elements 380.

The disposition position of the photosensitive chip 320 matches the position of the clear aperture 3100. According to the seventh preferred embodiment of the present disclosure, the photosensitive chip 320 is disposed in the second accommodating space 31120 formed by the third bracket portion 3113 and the bracket body 311 so as to make full use of the space of the clear aperture 3100. The photosensitive chip 330 is electrically connected to the electrical bracket 310. Specifically, the photosensitive chip 330 includes a series of photosensitive chip electric conductors 331 and a photosensitive chip body 332, where the photosensitive chip electric conductors 331 are disposed on the photosensitive chip body 332.

The connecting units 313 of the electrical bracket 310 include a series of photosensitive chip connection points 3131, where the photosensitive chip electric conductors 331 and the corresponding photosensitive chip connection points 3131 are conductively connected, to realize an energized interconnection between the photosensitive chip 330 and the electrical bracket 310. According to the seventh preferred embodiment of the present disclosure, the photosensitive chip electric conductor 331 is specifically implemented as a chip pad, and the chip pad and the corresponding photosensitive chip connection point 3131 are electrically connected by mounting the metal ball 3200 on the chip pad. In other words, the photosensitive chip 330 is electrically connected to the photosensitive chip connection point 3131 of the electrical bracket 310 by mounting the metal ball 3200 on the chip pad of the photosensitive chip 330. More preferably, in the seventh preferred embodiment of the present disclosure, the metal ball 3200 is specifically implemented as a copper ball 3201, the height of the copper ball 3201 ranges from 30-100 um, and a diameter of a contact surface between the copper ball 3201 and the chip pad ranges from 40-100 um. Certainly, those skilled in the art should understand that the photosensitive chip 330 and the electrical bracket 310 may also be electrically connected by mounting a metal ball of another type, and those skilled in the art may also adjust correspondingly the height of the copper ball 3201 and the numerical value of the diameter of the contact surface between the copper ball 3201 and the chip pad according to the actual situation. In addition, those skilled in the art may use other methods to implement the conduction between the photosensitive chip 330 and the electrical bracket 310, such as ultrasonic welding and thermocompression bonding. Any technical solution adopted that is the same or similar to that of the present disclosure and achieves the same or similar technical effect as that of the present disclosure falls within the protection scope of the present disclosure, and the specific embodiment of the present disclosure is not limited thereto.

As shown in the figure, according to the seventh preferred embodiment of the present disclosure, the second accommodating space 31120 provides a sufficient disposition and protection space for the copper ball 3201, and enables the conductible connection between the photosensitive chip 330 and the electrical bracket 310 to be more stable.

It should be understood by those skilled in the art that the above structure of the bracket body 311 including the first bracket portion 3111, the second bracket portion 3112, and the third bracket portion 3113 is merely an example of the present disclosure and is not limited thereto. According to other embodiments of the present disclosure, the bracket body 311 may also form a stepped shape for two bosses, a stepped shape for three steps or a non-stepped shape, and the present disclosure is not limited in this regard. In the design process of the camera module, the shape of the bracket body 311 may be set as required.

As shown in FIG. 25 and FIG. 26, the electrical bracket 310 and the flexible circuit board 320 are conductively connected. Specifically, the connecting units 313 of the electrical bracket 310 also include a series of circuit board connection points 3132. The flexible circuit board 320 includes a series of circuit board electric conductors 321 and a circuit board body 322, where the circuit board electric conductors 321 are disposed on the circuit board body 322. The circuit board electric conductors 321 and the corresponding circuit board connection points 3132 are conductively connected to each other, so that the electrical bracket 310 and the flexible circuit board 320 are conductively connected, so that the electrical bracket can be electrically connected to the power supply. It should be noted that the connection between the circuit board connection points 3132 and the flexible circuit board 320 includes, but is not limited to, anisotropic conductive adhesive or welding. Those skilled in the art may select according to actual needs or circumstances. The specific embodiment of the present disclosure is not limited thereto.

According to the seventh preferred embodiment of the present disclosure, the electrical bracket 310 is mounted on the flexible circuit board 320 so that the electrical bracket 310 is stably supported by the flexible circuit board 320 while being conductively connected to the flexible circuit board 320. It is worth mentioning that the position of the circuit board electric conductors 321 on the circuit board body 322 matches the position of the circuit board connection points 3132 on the electrical bracket 310. When the flexible circuit board 320 is mounted on the electrical bracket 310, the flexible circuit board 320 can be conductively connected to the circuit 312. The circuit board electric conductors 321 and the circuit board connection points 3132 on the electrical bracket 310 are conductively connected, and its method of the conductible connection may be but not is limited to welding.

According to the seventh preferred embodiment of the present disclosure, the circuit board connection points 3132 are specifically implemented as a circuit board pad. The electrical bracket 310 is welded and connected to the flexible circuit board 320. It should be understood by those skilled in the art that such mounting placement and such welding connection are merely examples of the present disclosure and are not limitations thereof. The connection between the electrical bracket 310 and the flexible circuit board 320 may be implemented as but is not limited to welding.

The connecting units 313 further include a series of motor connection points 3133 and a series of electronic element connection points 3134, where the motor connection points 3133 are disposed on the first top surface 31111 of the first bracket portion 3111. According to the seventh preferred embodiment of the present disclosure, the motor connection points 3133 are specifically implemented as a motor pad. The motor pad is used to conductively connect the driving element 350 to the circuit 312, so that the driving element 350 can be driven and further drive the optical lens assembly 340 to adjust the camera module.

Preferably, in the first embodiment of the camera module according to the present disclosure, the driving element 350 is configured as a motor 350, but those skilled in the art may select the type of the driving element 350 according to the actual situation. The specific embodiment of the camera module of the present disclosure is not limited thereto. The motor 350 includes a series of motor electric conductors 351 and a motor body 352, where the motor electric conductors 351 are disposed on the motor body 352. It is worth mentioning that the position of the motor electric conductors 351 on the motor body 352 matches the position of the motor connection points 3133 on the electrical bracket 310. When the motor 350 is disposed on the electrical bracket 310, the motor 350 can be conductively connected to the circuit 312 and thus be conductively connected to the flexible circuit board 320. More specifically, the motor electric conductors 351 are conductively connected to the motor connection points 3133 on the electrical bracket 310, and the method for conductible connection may be, but is not limited to ACP (anisotropic conductive adhesive), ultrasonic welding, thermocompression welding, and reflow soldering.

According to the seventh preferred embodiment of the present disclosure, the electronic element connection points 3134 are disposed on the second top surface 31121 of the second bracket portion 3112. The electronic element connection points 3134 are specifically implemented as an electronic element pad for conductively connecting the electronic element 380. Those skilled in the art should understand that the conductible connection of the electronic element 380 to the electrical bracket 310 may be but is not limited to welding. As shown in FIG. 25 to FIG. 27, in the seventh preferred embodiment of the present disclosure, the second top surface 31121 of the second bracket portion 3112 is flush with the top surface 311311 of the boss 31131, i.e., the optical filter 370 and the electronic element 380 are on the same plane. Alternatively, those skilled in the art may also determine the relative positional relationship between the second top surface 31121 of the second bracket portion 3112 and the upper surface 311311 of the boss 31131 according to the actual situation. Any technical solution adopted that is the same or similar to that of the present disclosure and achieves the same or similar technical effect as that of the present disclosure falls within the protection scope of the present disclosure, and the specific embodiment of the present disclosure is not limited thereto.

It is worth mentioning that the flexible circuit board 320 and the electrical bracket 310 which are separately formed is only an example of the present disclosure and is not limited thereto. According to other embodiments of the present disclosure, the flexible circuit board 320 and the electrical bracket 310 may alternatively be formed as one body. In addition, the respective shapes or overall shape of the flexible circuit board 320 and the electrical bracket 310 may also be arbitrarily set as required.

In other words, the photosensitive chip 330 and the electrical bracket 310 can implement the conductible interconnection between the photosensitive chip connection points 3131, the circuit board connection points 3132, the motor connection points 3133 and the electronic element connection points 3134 included in the connecting units 313 through the circuit 312. Any technical solution adopted that is the same or similar to that of the present disclosure and achieves the same or similar technical effect as that of the present disclosure falls within the protection scope of the present disclosure, and the specific embodiment of the present disclosure is not limited thereto.

As a variant application of the preferred embodiment of the camera module according to the present disclosure, the connecting units 313 may further include one or more support points, and the support points may be conductively disposed. After being electrically conducted, the support point may be connected to a device that needs an electrical application. Certainly, the support point may alternatively be configured to be non-conductive, such as a welding spot or a pad, and may only be used as a fixing device. Those skilled in the art may determine the type of each support point in the connecting units 313 according to actual needs.

It should be noted that those skilled in the art may determine the material and the connection method of the circuit board connection points 3132, the motor connection points 3133, and the electronic element connection points 3134 included in the connecting units 313 according to actual needs. For example, the circuit board connection points 3132, the motor connection points 3133, and the electronic element connection points 3134 include but are not limited to gold wires, aluminum wires, copper wires, silver wires, or metal balls, etc., and the connection method of the circuit board connection points 3132, the motor connection points 3133 and the electronic element connection points 3134 also includes, but is not limited to, soldering, bonding, attachment connection, plug-in connection or crimping connection.

In addition, the photosensitive chip connection points 3131, the circuit board connection points 3132, the motor connection points 3133, and the electronic element connection points 3134 included in the connecting units 313 may all be specifically implemented as any shape and type such as a pad, a welding pillar or a glue dot, a glue pillar, as long as the photosensitive chip 330 and the electrical bracket 310 can be electrically connected to each other. In other words, any technical solution adopted that is the same or similar to that of the present disclosure and achieves the same or similar technical effect as that of the present disclosure falls within the protection scope of the present disclosure, and the specific embodiment of the camera module of the present disclosure is not limited thereto.

Those skilled in the art can understand that the above connecting units 313 and its arrangement are merely examples of the present disclosure and are not limited thereto. Any embodiment that can achieve the purpose of the present disclosure belongs to the scope of the present disclosure.

In addition, as a further preferred embodiment of the camera module according to the present disclosure, the camera module further includes a reinforcing element, and the reinforcing element is electrically connected to the flexible circuit board 320 for increasing the strength of the flexible circuit board 320. Specifically, in the preferred embodiment of the camera module according to the present disclosure, the reinforcing element is disposed under the flexible circuit board 320 and there is an electrical connection between the reinforcing element and the flexible circuit board 320. In other words, the strength of the flexible circuit board 320 is increased by using the reinforcing element, and the disposition of the reinforcing element does not affect the connection between the camera module and an external device. Preferably, in the preferred embodiment of the camera module according to the present disclosure, the reinforcing element is a metal plate, since the metal plate not only can achieve a solid and conductive function, but also can have an effect of heat dissipation. Thus, the performance of the camera module according to the present disclosure is further improved.

More specifically, in the preferred embodiment of the camera module according to the present disclosure, the metal plate includes but is not limited to a steel plate or a copper plate, and resin is laminated on the steel plate or the copper plate to connect the steel plate/copper plate and the flexible circuit board 320 to add a communication line inside the laminated resin, so as to realize an electrical connection between the flexible circuit board 320 and the steel plate/copper plate.

Those skilled in the art may select the material of the reinforcing element according to the actual situation. Any technical solution adopted that is the same or similar to that of the present disclosure and achieves the same or similar technical effect as that of the present disclosure all falls within the protection scope of the camera module of the present disclosure, and the specific embodiment of the present disclosure is not limited thereto.

It is worth mentioning that the electrical bracket according to the present disclosure may be applied not only to a zoom camera module but also to a fixed-focus camera module.

Figure 28:
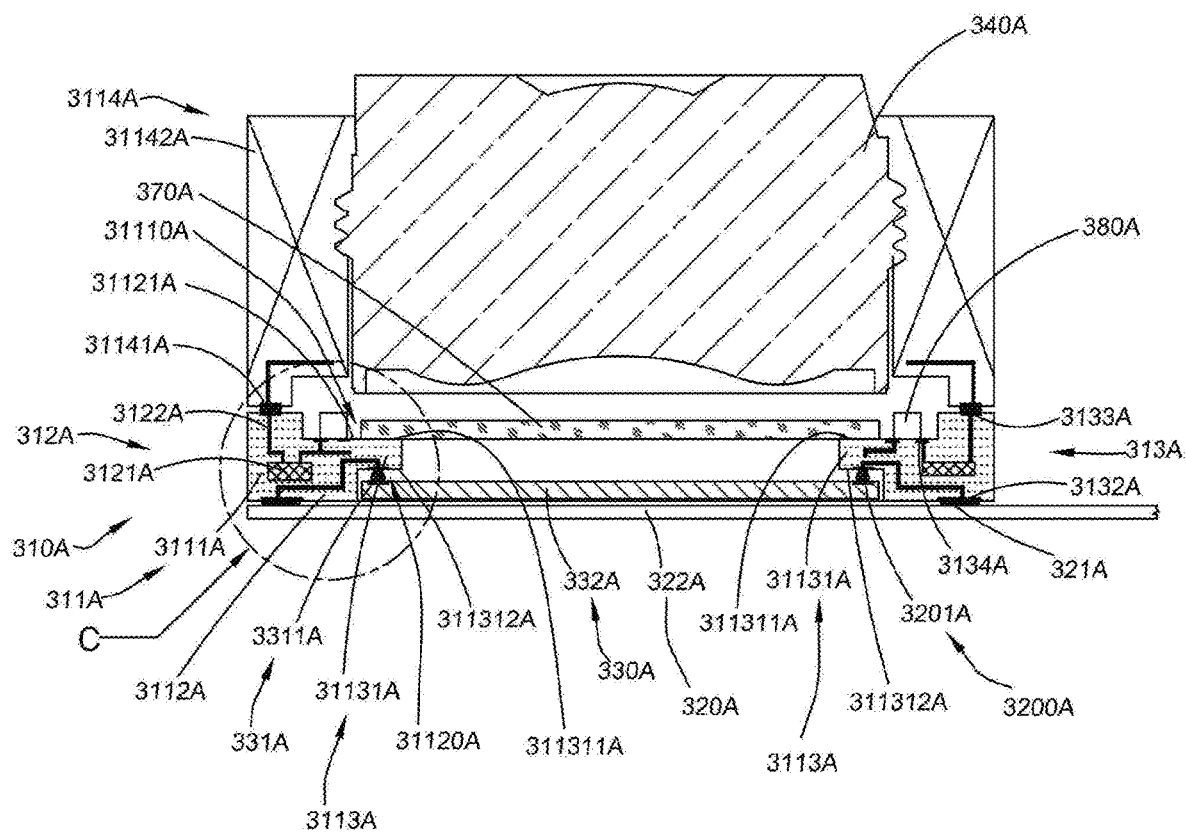
FIG. 28 is a section view of a camera module according to an eighth preferred embodiment of the present disclosure.
Figure 29:
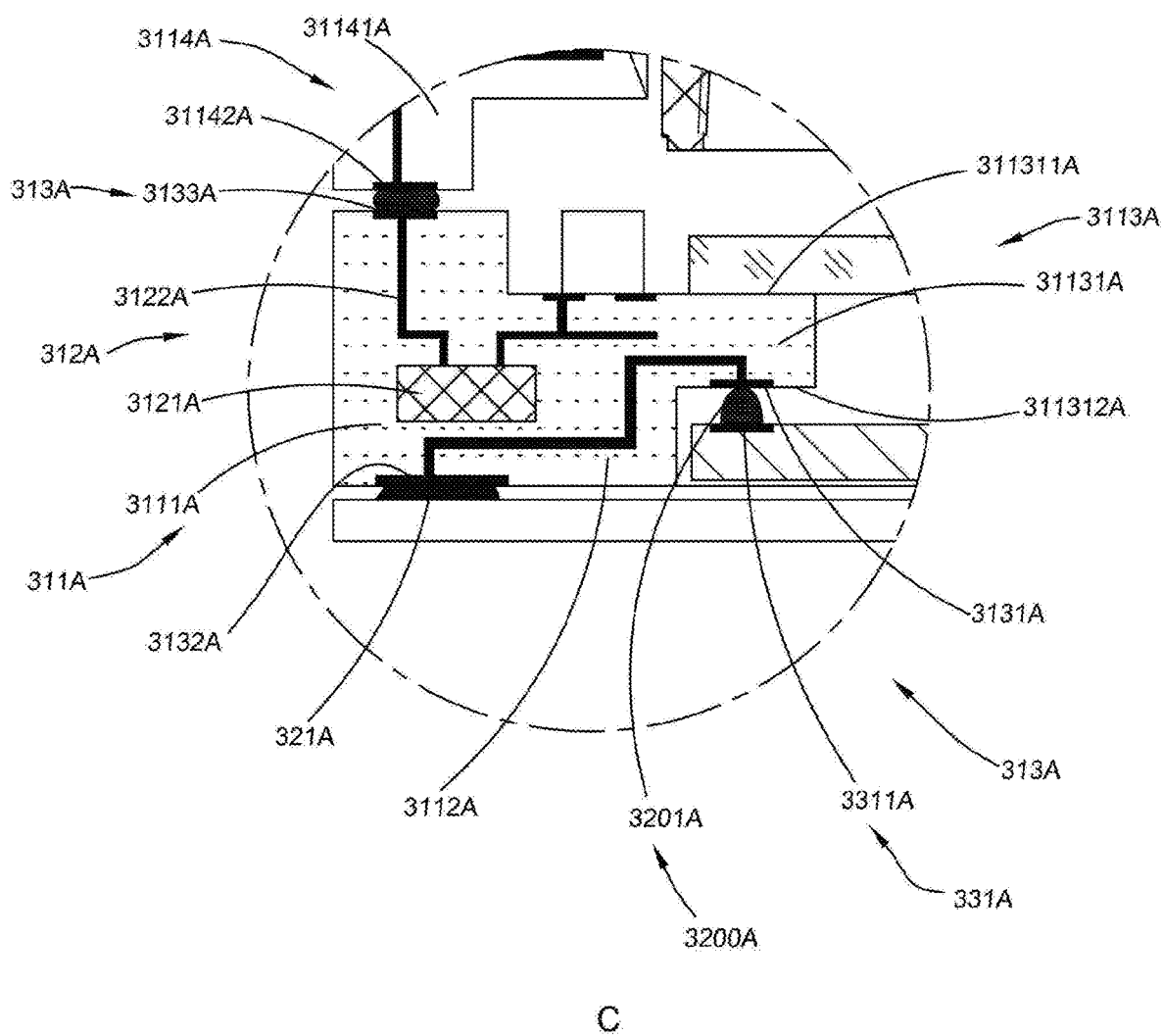
FIG. 29 is a partial enlarged view of the camera module according to the above preferred embodiment of the present disclosure.

FIG. 28 and FIG. 29 illustrate a camera module according to an eighth preferred embodiment of the present disclosure. The camera module includes an electrical bracket 310A, a flexible circuit board 320A, a photosensitive chip 330A, and an optical lens assembly 340A.

The electrical bracket 310A includes a bracket body 311A, a circuit 312A and a series of connecting units 313A and has a clear aperture 3100A. The circuit 312A includes multiple electrical elements 3121A and a set of conductors 3122A, where the set of conductors 3122A are conductively connected to the electrical elements 3121A in a preset mode and implement conductible connections with the flexible circuit board 320A and the photosensitive chip 330A through the connecting units 313A. Therefore, the camera module forms a preset circuit.

The optical lens assembly 340A and the photosensitive chip 330A are disposed on different sides of the electrical bracket 310A so that the optical lens assembly 340A is located on the photosensitive path of the photosensitive chip 330A. Thus, when the camera module is used for capturing an image of an object, lights reflected by the object can be received by the photosensitive chip 330A after being processed by the optical lens assembly 340A, to be suitable for photoelectric conversion. That is, in the present disclosure, the electrical bracket 310A may be used to connect the flexible circuit board 320A. That is, the electrical bracket 310A integrates functions of the base and the circuit board of a conventional camera module, to assemble the lens assembly module and connect the flexible circuit board of the photosensitive chip. As shown in FIG. 28 and FIG. 29, according to the eighth preferred embodiment of the present disclosure, the bracket body 311A includes a first bracket portion 3111A, a second bracket portion 3112A, a third bracket portion 3113A and a lens assembly supporter 114A. It is worth mentioning that the first bracket portion 3111A, the second bracket portion 3112A and the third bracket portion 3113A are integrally connected. The lens assembly supporter 114A may be integrally connected to the first bracket portion 3111A, the second bracket portion 3112A, or the third bracket portion 3113A of the bracket body 311A or may be detachably connected to the first bracket portion 3111A, the second bracket portion 3112A, or the third bracket portion 3113A of the bracket body 311A. According to the eighth preferred embodiment of the present disclosure, the lens assembly supporter 114A is detachably connected to the first bracket portion 3111A of the bracket body 311A. Certainly, those skilled in the art may also determine the connection method between the lens assembly supporter 114A and the first bracket portion 3111A of the bracket body 311A according to the actual situation, any technical solution adopted that is the same or similar to that of the present disclosure and achieves the same or similar technical effect as that of the present disclosure all falls within the protection scope of the present disclosure, and the present disclosure is not limited in this regard.

As shown in FIG. 28 to FIG. 29, according to the eighth preferred embodiment of the camera module of the present disclosure, the bracket body 311A includes a first bracket portion 3111A, a second bracket portion 3112A, and a third bracket portion 3113A, the first bracket portion 3111A, the second bracket portion 3112A, and the third bracket portion 3113A together form a hollow ring structure, where the first bracket portion 3111A is stacked on the second bracket portion 3112A. The third bracket portion 3113A extends from the inner sides of the first bracket portion 3111A and the second bracket portion 3112A to form a boss 31131A. The upper surface 311311A of the boss 31131A and the inner side surface of the bracket body 3111A form a first accommodating space 31110A. The lower surface 11312A of the boss 31131A and the inner side surface of the bracket body 3111A form a second accommodating space 31120A. Preferably, the third bracket portion 3113A is in an annular shape so that the boss 31131A is in an annular shape. As the eighth preferred embodiment of the camera module according to the present disclosure, those skilled in the art may determine the shape and number of the bosses 31131A according to the structure of the third bracket portion 3113A. For example, the third bracket portion 3113A is set in an arbitrary shape, then the shape of the boss 31131A also changes accordingly, as long as the upper surface and the lower surface of the boss 31131A can form the first accommodating space 31110A and the second accommodating space 31120A respectively.

The boss structure and the first bracket portion 3111 of the bracket body 311A of the electrical bracket 310A of the camera module of the eighth preferred embodiment of the present disclosure can not only provide a firm support for the driving element 350 and the optical lens assembly 340, but also facilitates fully forming a space and provides a reasonable setting space for other elements of the camera module.

Further, according to the eighth preferred embodiment of the present disclosure, the camera module further includes an optical filter 370A and a series of electronic elements 380A, where the optical filter 370A is used to filter out stray lights to further improve the image quality. The optical filter 370A and the electronic elements 380A are both disposed in the first accommodating space 31110A formed by the upper surface 311311A of the boss 31131A formed by the third bracket portion 3113A, such that the first accommodating space 31110A provides a disposition space for the optical filter 370A and the electronic elements 380A.

The disposition position of the photosensitive chip 330A matches the position of the clear aperture 3100A. According to the eighth preferred embodiment of the present disclosure, the photosensitive chip 330A is disposed in the second accommodating space 31120A formed by the third bracket portion 3113A and the bracket body 311A so as to make full use of the space of the clear aperture 3100A. The photosensitive chip 330A is electrically connected to the electrical bracket 310A. Specifically, the photosensitive chip 330A includes a series of photosensitive chip electric conductors 331A and a photosensitive chip body 332A, where the photosensitive chip electric conductors 331A are disposed on the photosensitive chip body 332A.

The connecting units 313A of the electrical bracket 310A include a series of photosensitive chip connection points 3131A, where the photosensitive chip electric conductors 331A and the corresponding photosensitive chip connection points 3131A are conductively connected, to realize an energized interconnection between the photosensitive chip 330A and the electrical bracket 310A. According to the eighth preferred embodiment of the present disclosure, the photosensitive chip electric conductor 331A is specifically implemented as a chip pad, and the chip pad and the corresponding photosensitive chip connection point 3131A are electrically connected by mounting the metal ball 3200A on the chip pad. In other words, the photosensitive chip 330A is electrically connected to the photosensitive chip connection point 3131A of the electrical bracket 310A by mounting the metal ball 3200A on the chip pad of the photosensitive chip 330A. More preferably, in the eighth preferred embodiment of the present disclosure, the metal ball 3200A is specifically implemented as a copper ball 3201A, the height of the copper ball 3201A ranges from 30-100 um, and a diameter of the contact surface between the copper ball 3201A and the chip pad ranges from 40-100 um. Certainly, those skilled in the art should understand that the photosensitive chip 330A and the electrical bracket 310A may also be electrically connected by mounting a metal ball of another type, and those skilled in the art may also adjust correspondingly the height of the copper ball 3201A and the numerical value of the diameter of the contact surface between the copper ball 3201A and the chip pad according to the actual situation. In addition, those skilled in the art may use other methods to implement the conduction between the photosensitive chip 330A and the electrical bracket 310A, such as ultrasonic welding and thermocompression bonding. Any technical solution adopted that is the same or similar to that of the present disclosure and achieves the same or similar technical effect as that of the present disclosure falls within the protection scope of the present disclosure, and the specific embodiment of the present disclosure is not limited thereto.

As shown in the figures, according to the eighth preferred embodiment of the present disclosure, the second accommodating space 31120A provides a sufficient disposition and protection space for the copper ball 3201A, and enables the conductible connection between the photosensitive chip 330A and the electrical bracket 310A to be more stable.

It should be understood by those skilled in the art that the above structure of the bracket body 311A including the first bracket portion 3111A, the second bracket portion 3112A, and the third bracket portion 3113A is merely an example of the present disclosure and is not limited thereto. According to other embodiments of the present disclosure, the bracket body 311A may also form a stepped shape for two bosses, a stepped shape for three steps or a non-stepped shape, and the present disclosure is not limited in this regard. In the design process of the camera module, the shape of the bracket body 311A may be set as required.

As shown in FIG. 28 and FIG. 29, the electrical bracket 310A and the flexible circuit board 320A are conductively connected. Specifically, the connecting units 313A of the electrical bracket 310A also include a series of circuit board connection points 3132A. The flexible circuit board 320A includes a series of circuit board electric conductors 321A and a circuit board body 322A, where the circuit board electric conductors 321A are disposed on the circuit board body 322A. The circuit board electric conductors 321A and the corresponding circuit board connection points 3132A are conductively connected to each other, so that the electrical bracket 310A and the flexible circuit board 320A are conductively connected, so that the electrical bracket can be electrically connected to the power supply.

According to the eighth preferred embodiment of the present disclosure, the electrical bracket 310A is mounted on the flexible circuit board 320A so that the electrical bracket 310A is stably supported by the flexible circuit board 320A while being conductively connected to the flexible circuit board 320A. It is worth mentioning that the position of the circuit board electric conductors 321A on the circuit board body 322A matches the position of the circuit board connection points 3132A on the electrical bracket 310A. When the flexible circuit board 320A is mounted on the electrical bracket 310A, the flexible circuit board 320A can be conductively connected to the circuit 312A. The circuit board electric conductors 321A and the circuit board connection points 3132A on the electrical bracket 310A are conductively connected, and its method of the conductible connection may be but is not limited to welding.

According to the eighth preferred embodiment of the present disclosure, the circuit board connection points 3132A are specifically implemented as a circuit board pad. The electrical bracket 310A is welded and connected to the flexible circuit board 320A. It should be understood by those skilled in the art that such mounting placement and such welding connection are merely examples of the present disclosure and are not limitations thereof. The connection between the electrical bracket 310A and the flexible circuit board 320A may be implemented as but is not limited to welding.

The connecting units 313A further include a series of lens assembly supporter connection points 133A and a series of electronic element connection points 3134A, where the lens assembly supporter connection points 133A are disposed on the first top surface 31111A of the first bracket portion 3111A. According to the eighth preferred embodiment of the present disclosure, the lens assembly supporter connection points 133A are specifically implemented as a lens assembly supporter pad. It is worth mentioning that not only the first bracket portion 3111A, the second bracket portion 3112A, and the third bracket portion 3113A of the bracket body 311A can be used for embedding the circuit, the lens assembly supporter 114A can also be used for embedding the circuit to further increase available space of intrinsic elements and further reduce the size of the entire camera module. The lens assembly supporter pad is used to conductively connect the circuit embedded in the lens assembly supporter 114A to the circuit embedded in the first bracket portion 3111A, the second bracket portion 3112A, and the third bracket portion 3113A, to further form the circuit 312A. It should be understood by those skilled in the art that in the embodiment in which the lens assembly supporter 114A is integrally connected to the first bracket portion 3111A, the second bracket portion 3112A, or the third bracket portion 3113A, the lens assembly supporter connection points 133A are not required.

According to the eighth preferred embodiment of the present disclosure, the lens assembly supporter 114A includes a series of lens assembly supporter electric conductors 1141A and a lens assembly support body 1142A, where the lens assembly supporter electric conductors 1141A are disposed on the lens assembly support body 1142A. It is worth mentioning that the position of the lens assembly supporter electric conductors 1141A on the lens assembly support body 1142A matches the position of the lens assembly supporter connection points 133A on the electrical bracket 310A. When the lens assembly supporter 114A is disposed on the first bracket portion 3111A of the electrical bracket 310A, the lens assembly supporter 114A can be conductively connected to the circuit 312A and thus be conductively connected to the flexible circuit board 320A. More specifically, the lens assembly supporter electric conductors 1141A and the lens assembly supporter connection points 133A on the electrical bracket 310A are conductively connected, and its method of conductible connection may be, but is not limited to, ACP (anisotropic conductive adhesive), ultrasonic welding, thermocompression welding, and reflow soldering.

According to the eighth preferred embodiment of the present disclosure, the electronic element connection points 3134A are disposed on the second top surface 31121A of the second bracket portion 3112A. The electronic element connection points 3134A are specifically implemented as an electronic element pad for conductively connecting the electronic element 380A. Those skilled in the art should understand that the conductible connection of the electronic element 380A to the electrical bracket 310A may be but is not limited to welding.

It is worth mentioning that the flexible circuit board 320A and the electrical bracket 310A which are separately formed is only an example of the present disclosure and is not limited thereto. According to other embodiments of the present disclosure, the flexible circuit board 320A and the electrical bracket 310A may alternatively be formed as one body. In addition, the respective shapes or overall shape of the flexible circuit board 320A and the electrical bracket 310A may also be arbitrarily set as required.

In other words, the photosensitive chip 330A and the electrical bracket 310A can implement a conductible interconnection between the photosensitive chip connection points 3131A, the circuit board connection points 3132A, the motor connection points 3133A and the electronic element connection points 3134A included in the connecting units 313A through the circuit 312A. Any technical solution adopted that is the same or similar to that of the present disclosure and achieves the same or similar technical effect as that of the present disclosure falls within the protection scope of the present disclosure, and the specific embodiment of the present disclosure is not limited thereto.

As a variant application of the preferred embodiment of the camera module according to the present disclosure, the connecting units 313A may further include more connection points, and the connection points may be conductively disposed. After being electrically conducted, the connection point may be connected to a device that needs an electrical application. Certainly, the connection point may alternatively be configured to be non-conductive, such as a welding spot or a pad, and may only be used as a fixing device. Those skilled in the art may determine the type of each connection point in the connecting units 313A according to actual needs.

It should be noted that those skilled in the art may determine the material and the connection method of the circuit board connection points 3132A, the motor connection points 3133A, and the electronic element connection points 3134A included in the connecting units 313A according to actual needs. For example, the circuit board connection points 3132A, the motor connection points 3133A, and the electronic element connection points 3134A include but are not limited to gold wires, aluminum wires, copper wires, silver wires, or metal balls, etc., and the connection method of the circuit board connection points 3132A, the motor connection points 3133A and the electronic element connection points 3134A also includes, but is not limited to, soldering, bonding, attachment connection, plug-in connection or crimping connection.

In addition, the photosensitive chip connection points 3131A, the circuit board connection points 3132A, the motor connection points 3133A, and the electronic element connection points 3134A included in the connecting units 313A may all be specifically implemented as any shape and type such as a pad, a welding pillar or a glue dot, a glue pillar, as long as the photosensitive chip 330A and the electrical bracket 310A can be electrically connected to each other. In other words, any technical solution adopted that is the same or similar to that of the present disclosure and achieves the same or similar technical effect as that of the present disclosure falls within the protection scope of the present disclosure, and the specific embodiment of the camera module of the present disclosure is not limited thereto.

Those skilled in the art can understand that the above connecting units 313A and its arrangement are merely examples of the present disclosure and are not limited thereto. Any embodiment that can achieve the purpose of the present disclosure belongs to the scope of the present disclosure.

In addition, as a further preferred embodiment of the camera module according to the present disclosure, the camera module further includes a reinforcing element, and the reinforcing element is electrically connected to the flexible circuit board 320A for increasing the strength of the flexible circuit board 320A. Specifically, in the preferred embodiment of the camera module according to the present disclosure, the reinforcing element is disposed under the flexible circuit board 320A and there is an electrical connection between the reinforcing element and the flexible circuit board 320A. In other words, the strength of the flexible circuit board 320A is increased by using the reinforcing element, and the disposition of the reinforcing element does not affect the connection between the camera module and an external device. Preferably, in the preferred embodiment of the camera module according to the present disclosure, the reinforcing element is a metal plate, since the metal plate not only can achieve a solid and conductive function, but also can has an effect of heat dissipation. Thus, the performance of the camera module according to the present disclosure is further improved.

More specifically, in the preferred embodiment of the camera module according to the present disclosure, the metal plate includes but is not limited to a steel plate or a copper plate, and resin is laminated on the steel plate or the copper plate to connect the steel plate/copper plate and the flexible circuit board 320A to add a communication line inside the laminated resin, so as to realize an electrical connection between the flexible circuit board 320A and the steel plate/copper plate.

Those skilled in the art may select the material of the reinforcing element according to the actual situation. Any technical solution adopted that is the same or similar to that of the present disclosure and achieves the same or similar technical effect as that of the present disclosure falls within the protection scope of the camera module of the present disclosure, and the specific embodiment of the present disclosure is not limited thereto.

In addition, the present disclosure also provides an electrical connection method of a camera module. The electrical connection method of the camera module includes the following steps:

disposing a series of electrical elements and a series of conductors for conductively connecting the electrical elements on an electrical bracket;

connecting conductively a photosensitive chip to the electrical bracket; and connecting conductively a flexible circuit board to the electrical bracket.

The electrical connection method of the camera module according to the present disclosure further includes the following steps:

connecting conductively a motor to the electrical bracket; and connecting an electronic device through the flexible circuit board to input a control signal.

Here, the photosensitive chip and the electrical bracket are electrically connected by mounting a metal ball, and more preferably, the metal ball is a copper ball.

Figure 30:
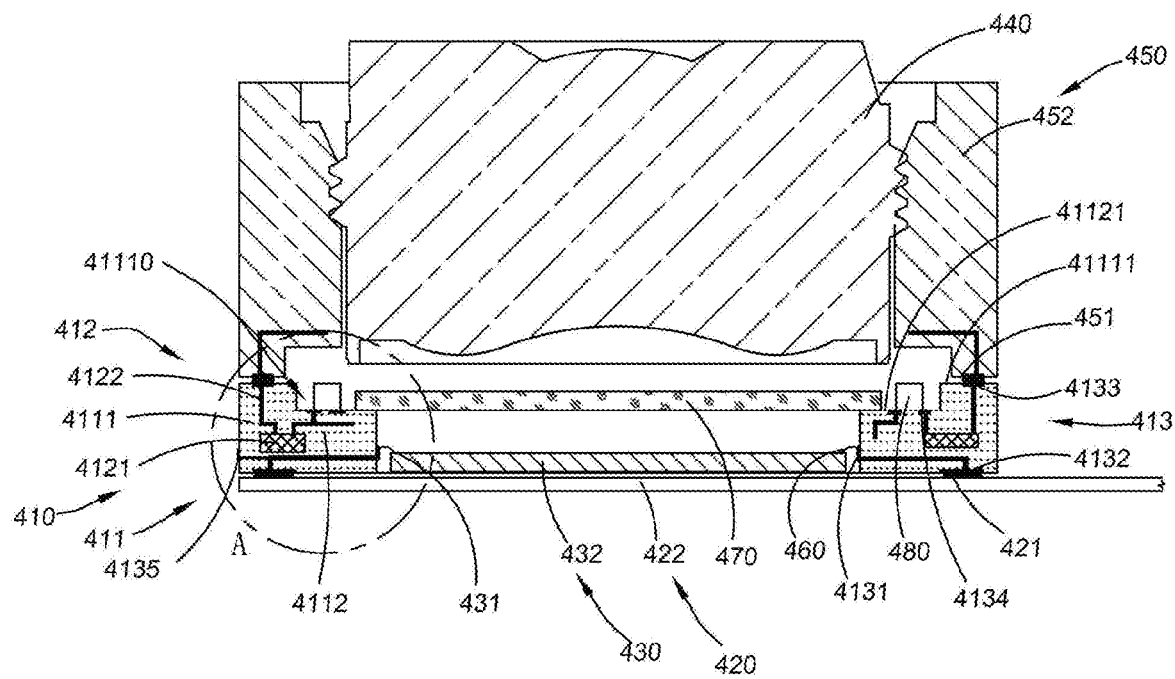
FIG. 30 is a section view of a camera module according to a ninth preferred embodiment of the present disclosure.
Figure 31:
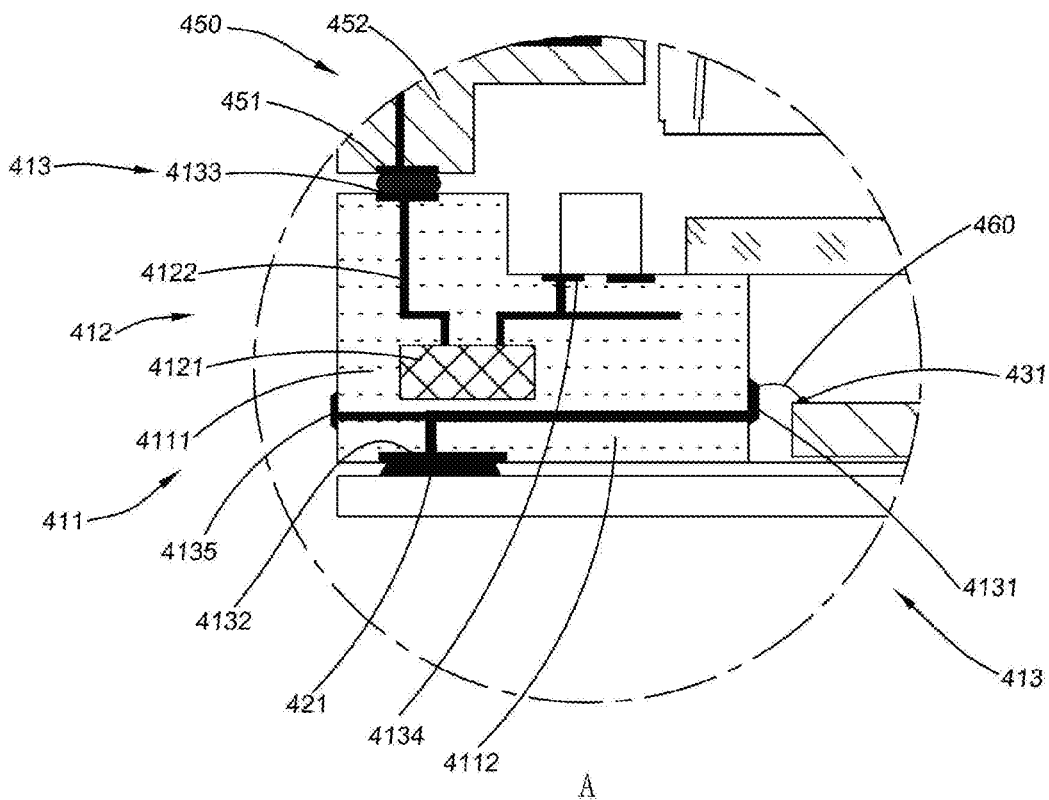
FIG. 31 is a partial enlarged view of the camera module according to the above preferred embodiment of the present disclosure.
Figure 32:
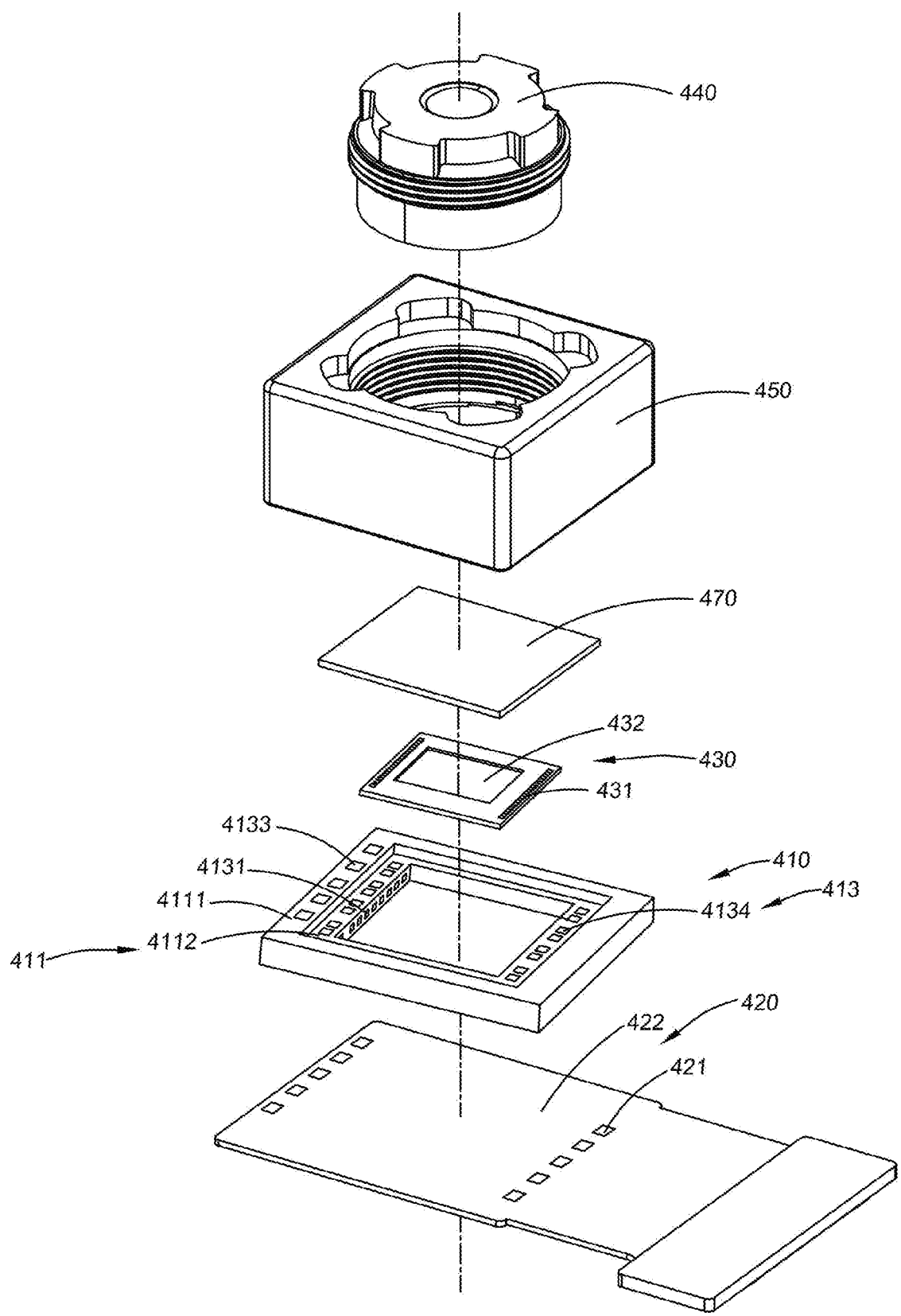
FIG. 32 is an assembly diagram of the camera module according to the above preferred embodiment of the present disclosure.

FIG. 30 to FIG. 32 illustrate a camera module according to a ninth preferred embodiment of the present disclosure. The camera module includes an electrical bracket 410, a flexible circuit board 420, a photosensitive chip 430, an optical lens assembly 440 and a driving element 450.

In the ninth preferred embodiment of the camera module according to the present disclosure, the driving element 450 is configured as a motor, but those skilled in the art may select the type of the driving element 450 according to the actual situation. The specific implementation of the camera module according to the present disclosure is not limited thereto.

The optical lens assembly 440 is mounted to the motor 450, and the optical lens assembly 440 may be driven by the motor 450 to be suitable for auto focusing. The flexible circuit board 420 and the motor 450 are disposed on different sides of the electrical bracket 410 so that the optical lens assembly 440 is located on the photosensitive path of the photosensitive chip 430. Thus, when the camera module is used for capturing an image of an object, lights reflected by the object can be received by the photosensitive chip 430 after being processed by the optical lens assembly 440, to be suitable for photoelectric conversion. That is, in the present disclosure, the electrical bracket 410 may be used to connect the flexible circuit board 420 and the motor 450. That is, the electrical bracket 410 integrates functions of the base and the circuit board of a conventional camera module, to assemble the motor lens assembly module and connect the flexible circuit board of the photosensitive chip.

As shown in FIG. 30 to FIG. 32, the electrical bracket 410 includes a bracket body 411, a circuit 412 and a series of connecting structures 413 and has a clear aperture 4100. The circuit 412 is embedded in the bracket body 411, where the connecting structures 413 are disposed on the surface of the bracket body 411. The circuit 412 includes multiple electrical elements 4121 and a set of conductors 4122, where the set of conductors 4122 are conductively connected to the electrical elements 4121 in a preset mode and implement conductible connections with the motor 450, the flexible circuit board 420 and the photosensitive chip 430 through the connecting structures 413. Therefore, the camera module forms a preset circuit to perform preset driving and adjustment.

As shown in FIG. 30 and FIG. 31, according to the ninth preferred embodiment of the present disclosure, the bracket body 411 includes a first bracket portion 4111 and a second bracket portion 4112, where the first bracket portion 4111 forms an outer ring. It may be understood that the first and second bracket portions 4111 and 4112 are for the convenience of description, are integrally formed, and may be integrally formed by laminated resin. The second bracket portion 4112 is integrally disposed on an inner side of the first bracket portion 4111. The clear aperture 4100 is disposed in the second bracket portion 4112. The second bracket portion 4112 forms an inner ring body. The first bracket portion 4111 has a first top surface 41111. The second bracket portion 4112 has a second top surface 41121. The second top surface 41121 is concave with respect to the first top surface 41111 to form a first groove 41110. The stepped structure of the bracket body 411 of the electrical bracket 410 of the camera module according to the ninth preferred embodiment of the present disclosure can not only provide a firm support for the motor 450 and the optical lens assembly 440 through the first bracket portion 4111, but also facilitates fully using the space and provides a reasonable disposition space for other elements of the camera module. For example, according to the ninth preferred embodiment of the present disclosure, the camera module further includes an optical filter 470 and a series of electronic elements 480, where the optical filter 470 is used to filter out stray lights to further improve the image quality. The optical filter 470 and the electronic elements 480 are both disposed on the second top surface 41121 of the second bracket portion 4112, such that the first groove 41110 provides a disposition space for the optical filter 470 and the electronic elements 480.

The disposition position of the photosensitive chip 430 matches the position of the clear aperture 4100. According to the ninth preferred embodiment of the present disclosure, the photosensitive chip 430 is disposed in the clear aperture 4100 and surrounded by the second bracket portion 4112 so as to make full use of space of the clear aperture 4100.

The photosensitive chip 430 is electrically connected to the electrical bracket 410. Specifically, the photosensitive chip 430 includes a series of photosensitive chip electric conductors 431 and a photosensitive chip body 432, where the photosensitive chip electric conductors 431 are disposed on the photosensitive chip body 432. The connecting structures 413 of the electrical bracket 410 include a series of photosensitive chip connection points 4131, where the photosensitive chip electric conductors 431 and the corresponding photosensitive chip connection points 4131 are conductively connected, to realize an energized interconnection between the photosensitive chip 430 and the electrical bracket 410. According to the ninth preferred embodiment of the present disclosure, each photosensitive chip electric conductor 431 is conductively connected to a corresponding photosensitive chip connection point 4131 by a conventional COB method. That is, the photosensitive chip 430 is conductively connected by pulling out a lead 460 (gold wire, copper wire, aluminum wire, silver wire), to the photosensitive chip connection point 4131 of the electrical bracket 410 through the conventional COB method. According to the ninth preferred embodiment of the present disclosure, the photosensitive chip connection points 4131 may be specifically implemented as a pin or a pad, but is not limited to a pin and a pad. In other words, the conductible connection between the photosensitive chip 430 and the electrical bracket 410 may make full use of the existing mature electrical connection process, so as to reduce the cost of technological improvements, make full use of conventional processes and equipments, and avoid resource waste. Certainly, those skilled in the art should understand that the conductible connection between the photosensitive chip 430 and the electrical bracket 410 may also be realized by any other conductible connection method capable of achieving the objective of the present disclosure. The present disclosure is not limited in this regard.

According to the ninth preferred embodiment of the present disclosure, the photosensitive chip connection points 4131 are disposed on the inner side of the second bracket portion 4112. The clear aperture 4100 provides a sufficient space for the lead 460 to be disposed and protected.

As shown in the figures, the electrical bracket 410 and the flexible circuit board 420 are conductively connected. Specifically, the connecting structures 413 of the electrical bracket 410 also include a series of circuit board connection points 4132. The flexible circuit board 420 includes a series of circuit board electric conductors 421 and a circuit board body 422, where the circuit board electric conductors 421 are disposed on the circuit board body 422. The circuit board electric conductors 421 and the corresponding circuit board connection points 4132 are conductively connected to each other, so that the electrical bracket 410 and the flexible circuit board 420 are conductively connected, so that the electrical bracket can be electrically connected to the power supply.

According to the ninth preferred embodiment of the present disclosure, the electrical bracket 410 is mounted on the flexible circuit board 420 so that the electrical bracket 410 is stably supported by the flexible circuit board 420 while being conductively connected to the flexible circuit board 420. It is worth mentioning that the position of the circuit board electric conductors 421 on the circuit board body 422 matches the position of the circuit board connection points 4132 on the electrical bracket 410. When the flexible circuit board 420 is mounted on the electrical bracket 410, the flexible circuit board 420 can be conductively connected to the circuit 412. The circuit board electric conductors 421 and the circuit board connection points 4132 on the electrical bracket 410 are conductively connected, and its method of conductible connection may be but is not limited to welding.

According to the ninth preferred embodiment of the present disclosure, the circuit board connection points 4132 are specifically implemented as a circuit board pad. The electrical bracket 410 is welded to the flexible circuit board 420. It should be understood by those skilled in the art that such mounting placement and such welding connection are merely examples of the present disclosure and are not limitations thereof. The connection between the electrical bracket 410 and the flexible circuit board 420 may be implemented as but is not limited to welding.

The connecting structures 413 further include a series of motor connection points 4133 and a series of electronic element connection points 4134, where the motor connection points 4133 are disposed on the first top surface 41111 of the first bracket portion 4111. According to the ninth preferred embodiment of the present disclosure, the motor connection points 4133 are specifically implemented as a motor pad. The motor pad is used to conductively connect the motor 450 to the circuit 412, so that the motor 450 can be driven and further drive the optical lens assembly 440 to adjust the camera module.

The motor 450 includes a series of motor electric conductors 451 and a motor body 452, where the motor electric conductors 451 are disposed on the motor body 452. It is worth mentioning that the position of the motor electric conductors 451 on the motor body 452 matches the position of the motor connection points 4133 on the electrical bracket 410. When the motor 450 is disposed on the electrical bracket 410, the motor 450 can be conductively connected to the circuit 412 and thus be conductively connected to the flexible circuit board 420. More specifically, the motor electric conductors 451 are conductively connected to the motor connection points 4133 on the electrical bracket 410, and the method for the conductible connection may be, but is not limited to ACP (anisotropic conductive adhesive), ultrasonic welding, thermocompression welding, and reflow soldering.

According to the ninth preferred embodiment of the present disclosure, the electronic element connection points 4134 are disposed on the second top surface 41121 of the second bracket portion 4112. The electronic element connection points 4134 are specifically implemented as an electronic element pad for conductively connecting the electronic element 480. Those skilled in the art should understand that the conductible connection of the electronic element 480 to the electrical bracket 410 may be but is not limited to welding, and may alternatively be specifically implemented as an electronic element glue pad or a welding spot, which belongs to the protection scope of the present disclosure. The specific embodiment of the present disclosure is not limited thereto.

It is worth mentioning that the electrical bracket according to the present disclosure may be applied not only to a zoom camera module but also to a fixed-focus camera module.

Figure 33:
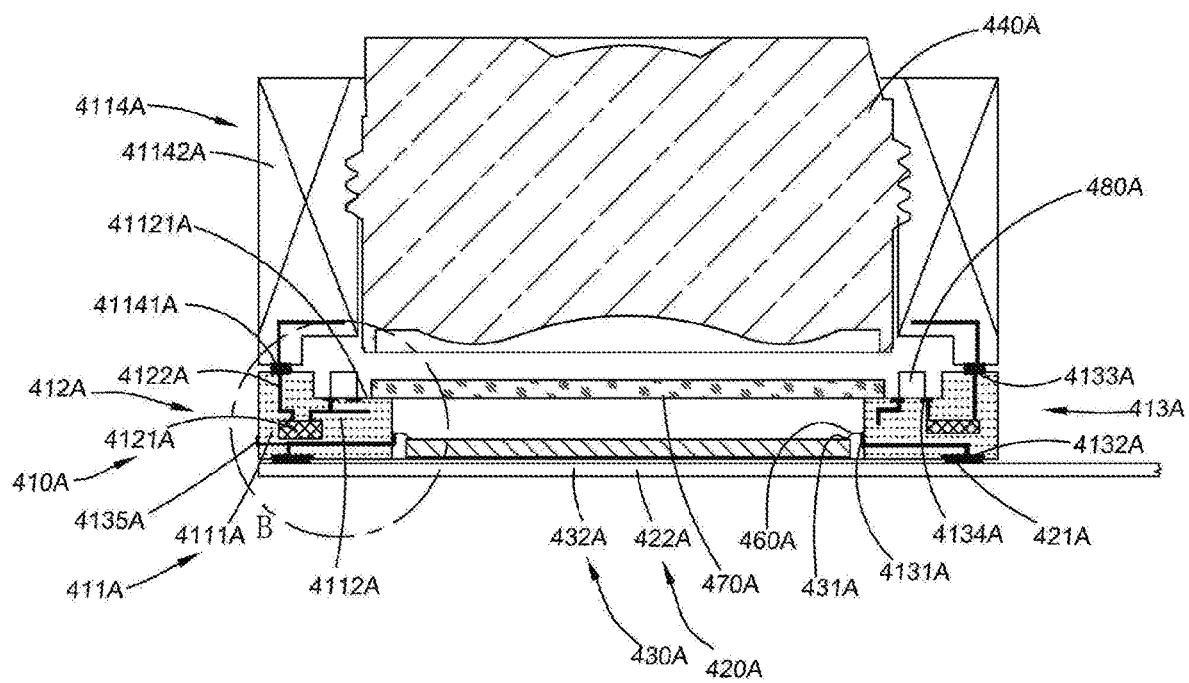
FIG. 33 is a section view of a camera module according to a tenth preferred embodiment of the present disclosure.
Figure 34:
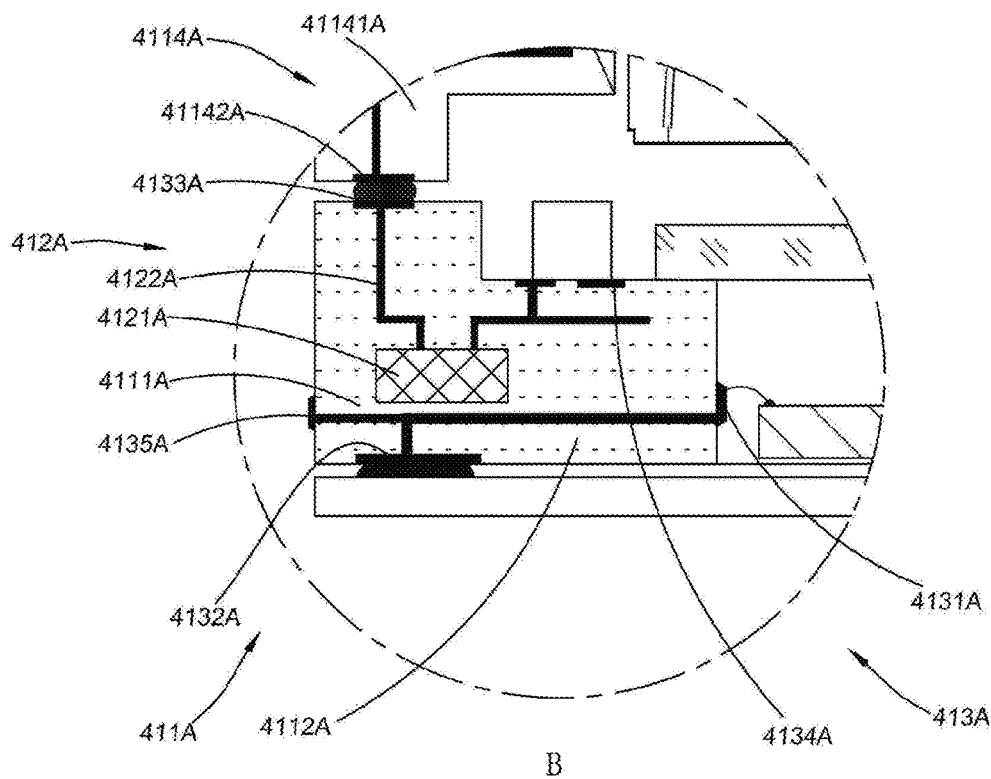
FIG. 34 is a partial enlarged view of the camera module according to the above-preferred embodiment of the present disclosure.

The electronic element connection points 4134 are shown in FIG. 33 and FIG. 34. According to the tenth preferred embodiment of the present disclosure, the bracket body 411A includes a first bracket portion 4111A, a second bracket portion 4112A, and a lens assembly supporter 4114A. It is worth mentioning that the first bracket portion 4111A and the second bracket portion 4112A are integrally connected, such as formed integrally by laminated resin. The lens assembly supporter 4114A may be integrally connected to the first bracket portion 4111A or the second bracket portion 4112A of the bracket body 411A, or may be detachably connected to the first bracket portion 4111A or the second bracket portion 4112A of the bracket body 411A. According to the tenth preferred embodiment of the present disclosure, the lens assembly supporter 4114A is detachably connected to the first bracket portion 4111A of the bracket body 411A. The present disclosure is not limited in this regard.

According to the tenth preferred embodiment of the present disclosure, the first bracket portion 4111A forms an outer ring. The second bracket portion 4112A is integrally disposed on the inner side of the first bracket portion 4111A. The clear aperture 4100A is disposed in the second bracket portion 4112A. The second bracket portion 4112A forms an inner ring body. The first bracket portion 4111A has a first top surface 41111A. The second bracket portion 4112A has a second top surface 41121A. The second top surface 41121A is concave with respect to the first top surface 41111A to form a first groove 41110A. The stepped structure of the bracket body 411A of the electrical bracket 410A of the camera module according to the tenth preferred embodiment of the present disclosure can not only provide a firm support for the lens assembly supporter 4114A and the optical lens assembly 440A through the first bracket portion 4111A, but also facilitates fully using spaces and provides a reasonable disposition space for other elements of the camera module. For example, according to the tenth preferred embodiment of the present disclosure, the camera module further includes an optical filter 470A and a series of electronic elements 480A, where the optical filter 470A is used to filter out stray lights to further improve the image quality. The optical filter 470A and the electronic elements 480A are both disposed on the second top surface 41121A of the second bracket portion 4112A, such that the first groove 41110A provides a disposition space for the optical filter 470A and the electronic elements 480A.

The disposition position of the photosensitive chip 430A matches the position of the clear aperture 4100A. According to the tenth preferred embodiment of the present disclosure, the photosensitive chip 430A is disposed in the clear aperture 4100A and surrounded by the second bracket portion 4112A so as to make full use of the space of the clear aperture 4100A.

The photosensitive chip 430A is electrically connected to the electrical bracket 410A. Specifically, the photosensitive chip 430A includes a series of photosensitive chip electric conductors 431A and a photosensitive chip body 432A, where the photosensitive chip electric conductors 431A are disposed on the photosensitive chip body 432A. The connecting structures 413A of the electrical bracket 410A include a series of photosensitive chip connection points 4131A, where the photosensitive chip electric conductors 431A and the corresponding photosensitive chip connection points 4131A are conductively connected, to realize an energized interconnection between the photosensitive chip 430A and the electrical bracket 410A. According to the tenth preferred embodiment of the present disclosure, each photosensitive chip electric conductor 431A is conductively connected to a corresponding photosensitive chip connection point 4131A by a conventional COB method. That is, the photosensitive chip 430A is conductively connected by pulling out a lead 460A (gold wire, copper wire, aluminum wire, silver wire), to the photosensitive chip connection point 4131A of the electrical bracket 410A through the conventional COB method. According to the tenth preferred embodiment of the present disclosure, the photosensitive chip connection points 4131A may be specifically implemented as a pin or a pad, but is not limited to a pin and a pad. In other words, the conductible connection between the photosensitive chip 430A and the electrical bracket 410A may make full use of the existing mature electrical connection process, so as to reduce the cost of technological improvements, make full use of conventional processes and equipments, and avoid resource waste. Certainly, those skilled in the art should understand that the conductible connection between the photosensitive chip 430A and the electrical bracket 410A may also be realized by any other conductible connection method capable of achieving the objective of the present disclosure. The present disclosure is not limited in this regard.

According to the tenth preferred embodiment of the present disclosure, the photosensitive chip connection points 4131A are disposed on an inner side of the second bracket portion 4112A. The clear aperture 4100A provides a sufficient space for the lead 460A to be disposed and protected.

As shown in the figures, the electrical bracket 410A and the flexible circuit board 420A are conductively connected. Specifically, the connecting structures 413A of the electrical bracket 410A also include a series of circuit board connection points 4132A disposed on the bottom surface of the electrical bracket 410A. The flexible circuit board 420A includes a series of circuit board electric conductors 421A and a circuit board body 422A, where the circuit board electric conductors 421A are disposed on the circuit board body 422A. The circuit board electric conductors 421A and the corresponding circuit board connection points 4132A are conductively connected to each other, so that the electrical bracket 410A and the flexible circuit board 420A are conductively connected, so that the electrical bracket can be electrically connected to the power supply.

According to the tenth preferred embodiment of the present disclosure, the electrical bracket 410A is mounted on the flexible circuit board 420A so that the electrical bracket 410A is stably supported by the flexible circuit board 420A while being conductively connected to the flexible circuit board 420A. It is worth mentioning that the position of the circuit board electric conductors 421A on the circuit board body 422A matches the position of the circuit board connection points 4132A on the electrical bracket 410A. When the flexible circuit board 420A is mounted on the electrical bracket 410A, the flexible circuit board 420A can be conductively connected to the circuit 412A. The circuit board electric conductors 421A and the circuit board connection points 4132A on the electrical bracket 410A are conductively connected, and its method of conductible connection may be but is not limited to welding.

According to the tenth preferred embodiment of the present disclosure, the circuit board connection points 4132A are specifically implemented as a circuit board pad. The electrical bracket 410A is welded and connected to the flexible circuit board 420A. It should be understood by those skilled in the art that such mounting placement and such welding connection are merely examples of the present disclosure and are not limitations thereof. The connection between the electrical bracket 410A and the flexible circuit board 420A may be implemented as but is not limited to welding.

The connecting structures 413A further include a series of lens assembly supporter connection points 4133A and a series of electronic element connection points 4134A, where the lens assembly supporter connection points 4133A are disposed on the first top surface 41111A of the first bracket portion 4111A. According to the tenth preferred embodiment of the present disclosure, the lens assembly supporter connection points 4133A are specifically implemented as a lens assembly supporter pad. It is worth mentioning that not only the first bracket portion 4111A and the second bracket portion 4112A of the bracket body 411A can be used for embedding the circuit, the lens assembly supporter 4114A can also be used for embedding the circuit to further increase available space of intrinsic elements and further reduce the size of the entire camera module. The lens assembly supporter pad is used to conductively connect the circuit embedded in the lens assembly supporter 4114A to the circuit embedded in the first bracket portion 4111A and the second bracket portion 4112A, to further form the circuit 412A. It should be understood by those skilled in the art that in the embodiment in which the lens assembly supporter 4114A is integrally connected to the first bracket portion 4111A or the second bracket portion 4112A, the lens assembly supporter connection points 4133A are not required.

As a further preferred embodiment of the second embodiment of the camera module according to the present disclosure, the lens assembly supporter 4114A may be in an integral structure with the electric bracket 410A. That is, the lens assembly supporter 4114A is electrically extended directly on the top surface of the electrical bracket 410A, and the two forms an entity. In such configuration, the connecting structures 413A does not need to further include the lens assembly supporter connection points 4133A, so that the structure of the electrical bracket 410A is more compact and simplified.

According to the tenth preferred embodiment of the present disclosure, the lens assembly supporter 4114A includes a series of lens assembly supporter electric conductors 1141A and a lens assembly support body 1142A, where the lens assembly supporter electric conductors 1141A are disposed on the lens assembly support body 1142A. It is worth mentioning that the position of the lens assembly supporter electric conductors 1141A on the lens assembly support body 1142A matches the position of the lens assembly supporter connection points 4133A on the electrical bracket 410A. When the lens assembly supporter 4114A is disposed on the electrical bracket 410A, the lens assembly supporter 4114A can be conductively connected to the circuit 412A and thus be conductively connected to the flexible circuit board 420A. More specifically, the lens assembly supporter electric conductors 1141A and the lens assembly supporter connection points 4133A on the electrical bracket 410A are conductively connected, and its method of conductible connection may be, but is not limited to, ACP (anisotropic conductive adhesive), ultrasonic welding, thermocompression welding, and reflow soldering.

According to the tenth preferred embodiment of the present disclosure, the electronic element connection points 4134A are disposed on the second top surface 41121A of the second bracket portion 4112A. The electronic element connection points 4134A are specifically implemented as an electronic element pad for conductively connecting the electronic element 480A. Those skilled in the art should understand that the conductible connection of the electronic element 480A and the electrical bracket 410A may be but is not limited to welding.

The connecting structures 413A further includes a series of external device connection points 4135A. The external device connection points 4135A are disposed at an outer side 41112A of the first bracket portion 4111. The external device connection points 4135A are used to connect a series of external devices. The external device includes but is not limited to a PCB, an application device, and the like, and the connection method of the external device connection points 4135A includes but is not limited to welding, bonding, etc., as long as the electrical connection with the photosensitive chip 430A can be implemented through the circuit 412A and the photosensitive chip connection points 4131A. In other words, the photosensitive chip 430A and the electrical bracket 410A can implement a conductible interconnection between the photosensitive chip connection points 4131A, the circuit board connection points 4132A, the lens assembly supporter connection points 4133A, the electronic element connection points 4134A included in the connecting structures 413 and the external device connection points 4135A through the circuit 412A. Any technical solution adopted that is the same or similar to that of the present disclosure and achieves the same or similar technical effect as that of the present disclosure falls within the protection scope of the present disclosure, and the specific embodiment of the present disclosure is not limited thereto.

As a variant application of the preferred embodiment of the camera module according to the present disclosure, the connecting structures 413A may further include one or more support points, and the support points may be conductively disposed. After being electrically conducted, the support point may be connected to a device that needs an electrical application. Certainly, the support point may alternatively be configured to be non-conductive, such as a welding spot or a pad, and may only be used as a fixing device. Those skilled in the art may determine the type of each support point in the connecting structures 413A according to actual needs.

It should be noted that those skilled in the art may determine the material and the connection method of the photosensitive chip connection points 4131A, the circuit board connection points 4132A, the lens assembly supporter connection points 4133A, the electronic element connection points 4134A and the external device connection points 4135A included in the connecting structures 413A according to actual needs. For example, the photosensitive chip connection points 4131A, the circuit board connection points 4132A, the lens assembly supporter connection points 4133A, the electronic element connection points 4134A and the external device connection points 4135A include but are not limited to gold wires, aluminum wires, copper wires or silver wires, etc., and the connection method of the photosensitive chip connection points 4131A, the circuit board connection points 4132A, the lens assembly supporter connection points 4133A, the electronic element connection points 4134A and the external device connection points 4135A also includes, but is not limited to, soldering, bonding, attachment connection, plug-in connection or crimping connection.

In addition, the photosensitive chip connection points 4131A, the circuit board connection points 4132A, the lens assembly supporter connection points 4133A, the electronic element connection points 4134A and the external device connection points 4135A included in the connecting structures 413A may all be specifically implemented as any shape and type such as a pad, a welding pillar or a glue dot, a glue pillar, as long as the photosensitive chip 430A and the electrical bracket 410A can be conductively interconnected. In other words, any technical solution adopted that is the same or similar to that of the present disclosure and achieves the same or similar technical effect as that of the present disclosure falls within the protection scope of the present disclosure, and the specific embodiment of the camera module of the present disclosure is not limited thereto.

In addition, as a further preferred embodiment of the camera module according to the present disclosure, the camera module further includes a reinforcing element, and the reinforcing element is electrically connected to the flexible circuit board 420A for increasing the strength of the flexible circuit board 420A. Specifically, in the preferred embodiment of the camera module according to the present disclosure, the reinforcing element is disposed under the flexible circuit board 420A and there is an electrical connection between the reinforcing element and the flexible circuit board 420A. In other words, the strength of the flexible circuit board 420A is increased by using the reinforcing element, and the disposition of the reinforcing element does not affect the connection between the camera module and an external device. Preferably, in the preferred embodiment of the camera module according to the present disclosure, the reinforcing element is a metal plate, since the metal plate not only can achieve a solid and conductive function, but also can achieves an effect of heat dissipation. Thus, the performance of the camera module according to the present disclosure is further improved.

More specifically, in the preferred embodiment of the camera module according to the present disclosure, the metal plate includes but is not limited to a steel plate or a copper plate, and resin is laminated on the steel plate or the copper plate to connect the steel plate/copper plate and the flexible circuit board 420A to add a communication line inside the laminated resin, so as to realize an electrical connection with the flexible circuit board 420A.

Those skilled in the art may select the material of the reinforcing element according to the actual situation. Any technical solution adopted that is the same or similar to that of the present disclosure and achieves the same or similar technical effect as that of the present disclosure all falls within the protection scope of the camera module of the present disclosure, and the specific embodiment of the present disclosure is not limited thereto.

It should be understood by those skilled in the art that the embodiments of the present disclosure shown in the above description and the accompanying drawings are only examples and do not limit the present disclosure. The objective of the present disclosure has been fully and effectively achieved. The functional and structural principles of the present disclosure have been shown and described in the embodiments. Without departing from the principles described above, the embodiments of the present disclosure may have any variations or modifications.

What is claimed is:

1. A camera module, comprising:
   a lens assembly;
   a motor;
   a photosensitive chip;
   an electrical bracket comprising a bracket body and a circuit, wherein the circuit is embedded inside the bracket body and comprises a plurality of electrical elements embedded inside the bracket body, wherein at least one photosensitive chip connecting device is disposed on the electrical bracket, and at least one motor connecting device is disposed on the electrical bracket,
   wherein the lens assembly is located on a photosensitive path of the photosensitive chip,
   wherein the electrical bracket provides a support to the motor via the motor connecting device and provides a support to the photosensitive chip via the photosensitive chip connecting device, the circuit embedded inside the electrical bracket is conductively connected to the photosensitive chip connecting device and the motor connecting device, and implements an electrical conduction to the photosensitive chip and the motor.

2. The camera module according to claim 1, wherein the photosensitive chip connecting device is specifically implemented as a metal body grown on the photosensitive chip.

3. The camera module according to claim 2, wherein a material of the photosensitive chip connecting device is selected from a group consisting of gold, copper, gold copper alloy and tin-nickel alloy.

4. The camera module according to claim 2, wherein the photosensitive chip connecting device is specifically implemented as a copper pillar.

5. The camera module according to claim 2, further comprising a circuit board, wherein the photosensitive chip is conductively connected to the circuit board through the photosensitive chip connecting device.

6. The camera module according to claim 5, wherein the photosensitive chip having the photosensitive chip connecting device is formed by cutting a photosensitive chip wafer after forming the photosensitive chip wafer having a series of the photosensitive chip connecting devices.

7. The camera module according to claim 1, wherein the photosensitive chip connecting device comprises a connecting element and a conducting element, the connecting element is preset on a surface of the photosensitive chip, and the conducting element is conductively and firmly disposed on the connecting element and protrudes from the connecting element.

8. The camera module according to claim 7, wherein the conducting element is specifically implemented as a metal body grown on the connecting element disposed on the photosensitive chip.

9. The camera module according to claim 8, wherein the conducting element is specifically implemented as a metal cylinder of the connecting element plated on the photosensitive chip.

10. An electrical bracket having at lease two connecting device and applied to a camera module comprising a motor and a photosensitive chip, wherein the electrical bracket provides a support to the motor and the photosensitive chip and comprises:
    a bracket body; and
    a circuit, wherein the circuit is embedded inside the bracket body and comprises a plurality of electrical elements embedded inside the bracket body,
    wherein the connecting device comprises photosensitive chip connecting device and motor connecting device disposed on the electrical bracket, wherein the motor connecting device conductively connects the circuit to the motor and the photosensitive chip connecting device conductively connects the circuit to the photosensitive chip, so as to implement an electric conduction to the photosensitive chip and the motor of the camera module.

11. The electrical bracket according to claim 10, wherein the photosensitive chip connecting device is specifically implemented as a metal body grown on the electrical bracket and protrudes from the electrical bracket.

12. The electrical bracket according to claim 11, wherein the photosensitive chip connecting device comprises a metal cylinder plated on the electrical bracket.

13. The electrical bracket according to claim 12, wherein a material of the metal cylinder is selected from a group consisting of gold, copper, gold copper alloy and tin-nickel alloy.

14. The electrical bracket according to claim 13, wherein the metal cylinder is specifically implemented as a copper pillar.

* * * * *